(12) United States Patent
Koezuka et al.

(10) Patent No.: US 9,117,920 B2
(45) Date of Patent: Aug. 25, 2015

(54) METHOD FOR MANUFACTURING SEMICONDUCTOR DEVICE USING OXIDE SEMICONDUCTOR

(75) Inventors: Junichi Koezuka, Tochigi (JP); Yuhei Sato, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/467,493

(22) Filed: May 9, 2012

(65) Prior Publication Data

US 2012/0295397 A1   Nov. 22, 2012

(30) Foreign Application Priority Data

May 19, 2011 (JP) .................... 2011-112837

(51) Int. Cl.
   *H01L 21/00* (2006.01)
   *H01L 29/786* (2006.01)
(52) U.S. Cl.
   CPC ................. *H01L 29/78693* (2013.01)
(58) Field of Classification Search
   CPC ............................... H01L 29/78693
   USPC ......................................... 438/104
   See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Thao X Le
*Assistant Examiner* — Laura Dykes
(74) *Attorney, Agent, or Firm* — Eric J. Robinson; Robinson Intellectual Property Law Office, P.C.

(57) ABSTRACT

Stable electrical characteristics and high reliability are provided to a semiconductor device including an oxide semiconductor. In a process of manufacturing a transistor including an oxide semiconductor film, an amorphous oxide semiconductor film is formed, and oxygen is added to the amorphous oxide semiconductor film, so that an amorphous oxide semiconductor film containing excess oxygen is formed. Then, an aluminum oxide film is formed over the amorphous oxide semiconductor film, and heat treatment is performed thereon to crystallize at least part of the amorphous oxide semiconductor film, so that a crystalline oxide semiconductor film is formed.

11 Claims, 20 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,828,794 B2 | 9/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1* | 6/2009 | Son et al. ............... 438/151 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051938 A1* | 3/2010 | Hayashi et al. ............ 257/43 |
| 2010/0051949 A1* | 3/2010 | Yamazaki et al. .......... 257/57 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0193772 A1* | 8/2010 | Morosawa et al. .......... 257/40 |
| 2010/0295041 A1 | 11/2010 | Kumomi et al. |
| 2010/0304529 A1 | 12/2010 | Sasaki et al. |
| 2010/0320459 A1* | 12/2010 | Umeda et al. ............ 257/43 |
| 2011/0049511 A1* | 3/2011 | Yano et al. .............. 257/43 |
| 2011/0068335 A1* | 3/2011 | Yamazaki et al. .......... 257/43 |
| 2011/0136301 A1 | 6/2011 | Yamazaki et al. |
| 2011/0136302 A1 | 6/2011 | Yamazaki et al. |
| 2011/0263091 A1* | 10/2011 | Yamazaki .............. 438/287 |
| 2012/0002090 A1* | 1/2012 | Aoki et al. ............. 348/297 |
| 2012/0231581 A1* | 9/2012 | Yamazaki et al. ......... 438/104 |
| 2012/0276694 A1 | 11/2012 | Koezuka et al. |
| 2014/0370657 A1 | 12/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG—Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '8 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compounds with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Nl, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

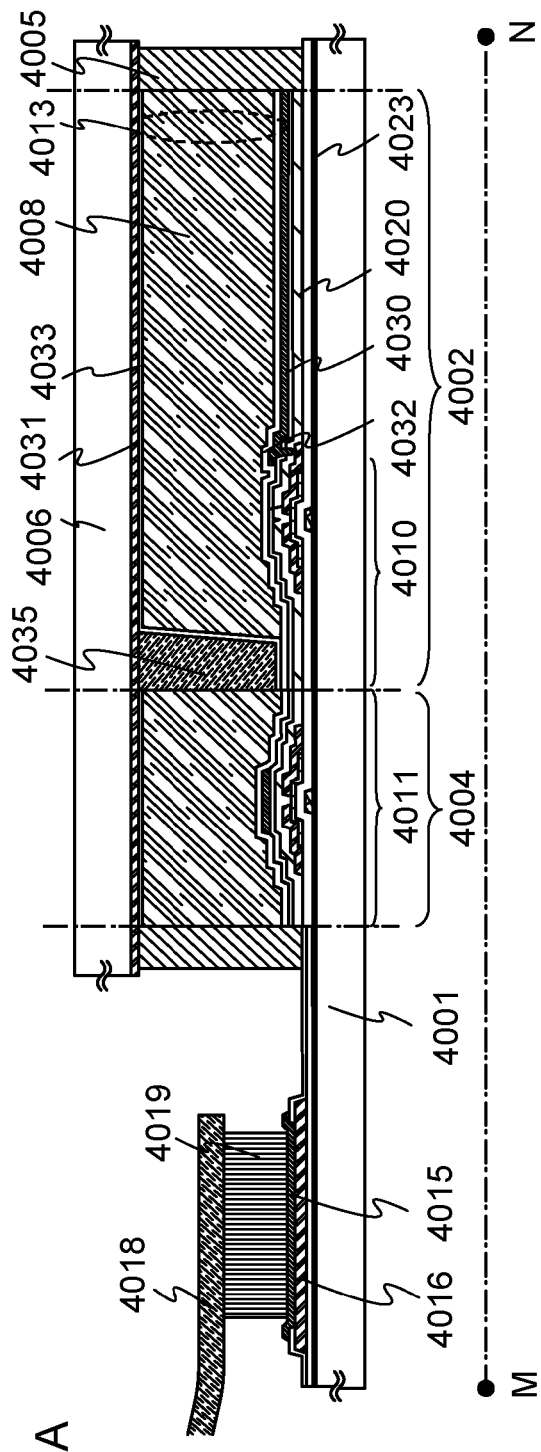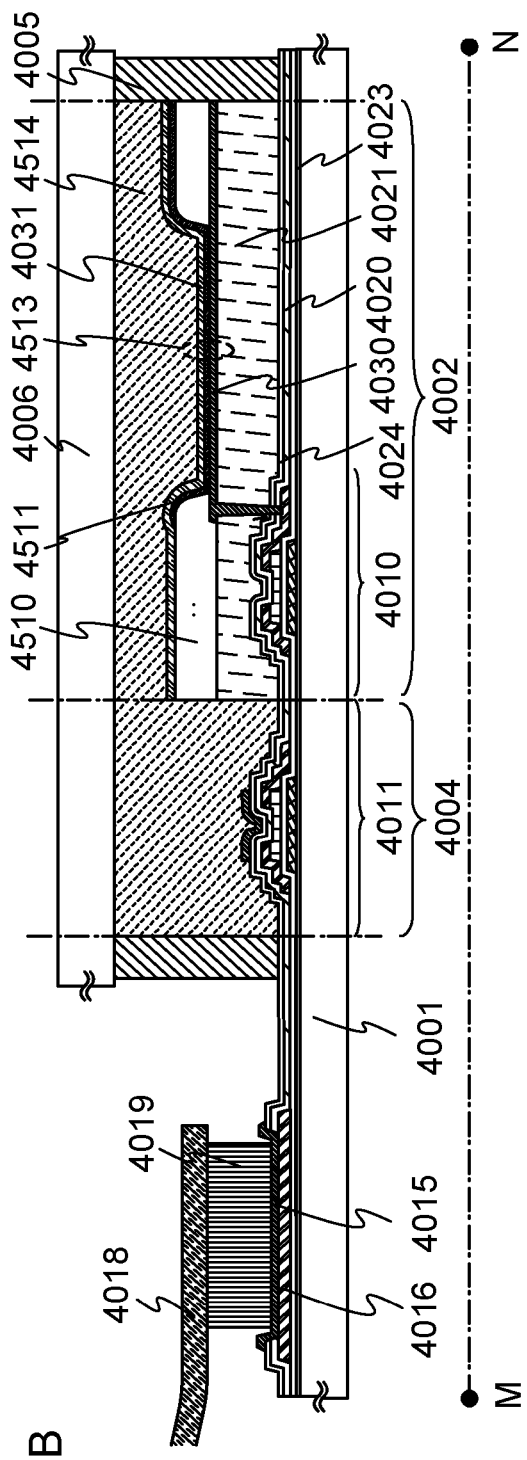
FIG. 14A
FIG. 14B

FIG. 17A1
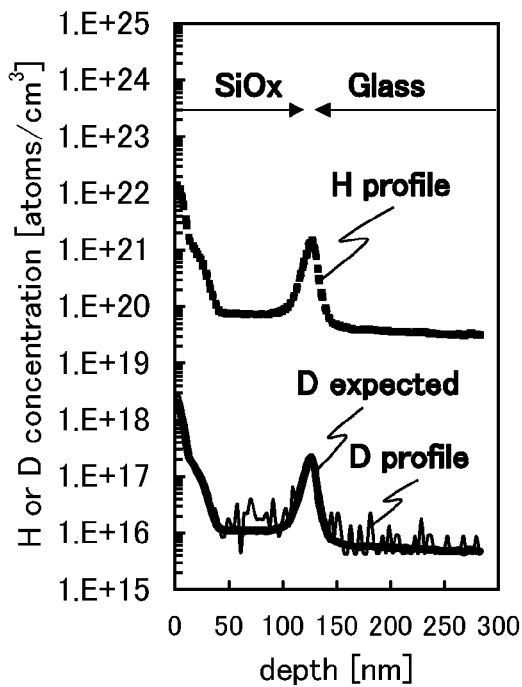
FIG. 17A2
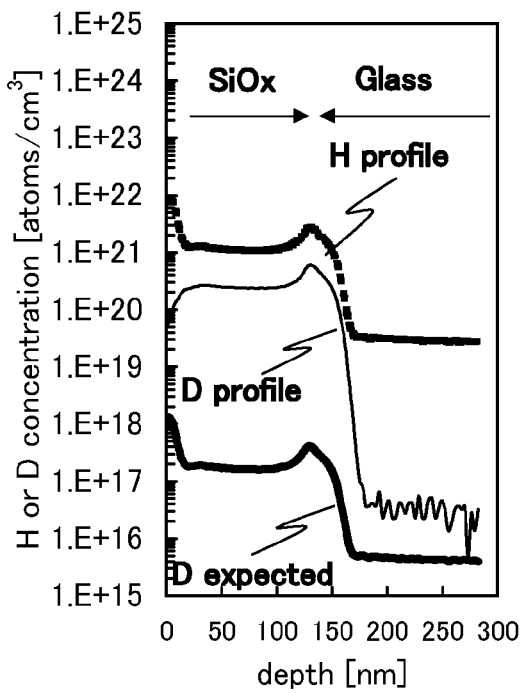
FIG. 17B1
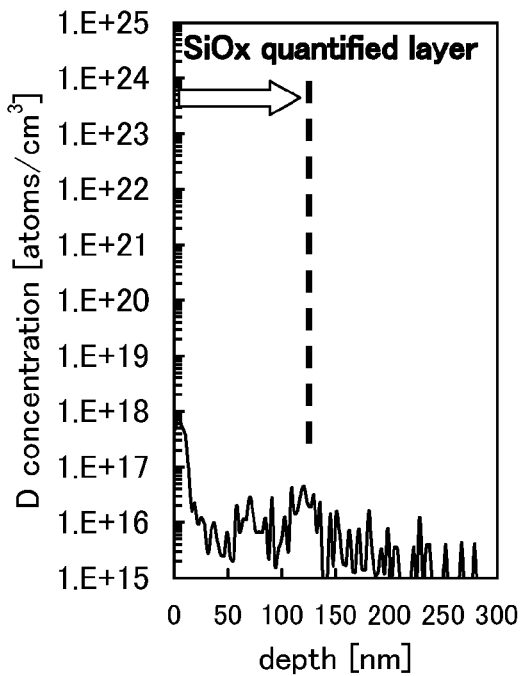
FIG. 17B2
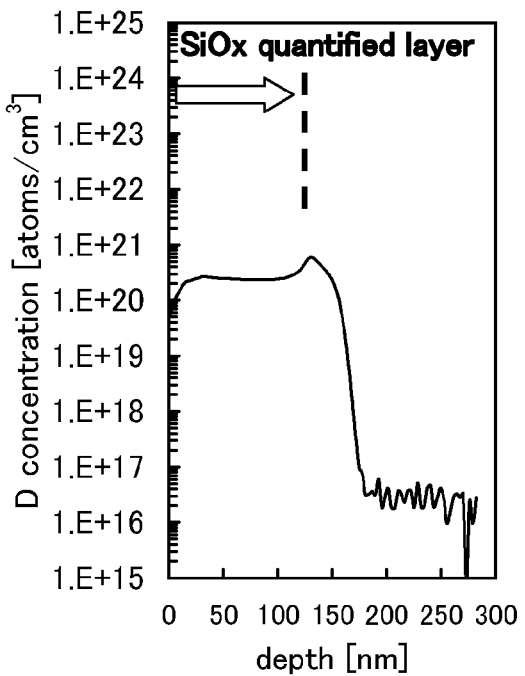

FIG. 18A1
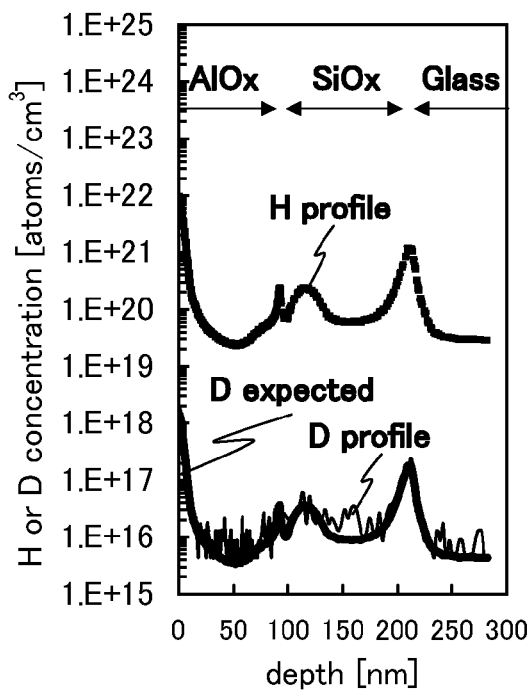
FIG. 18A2
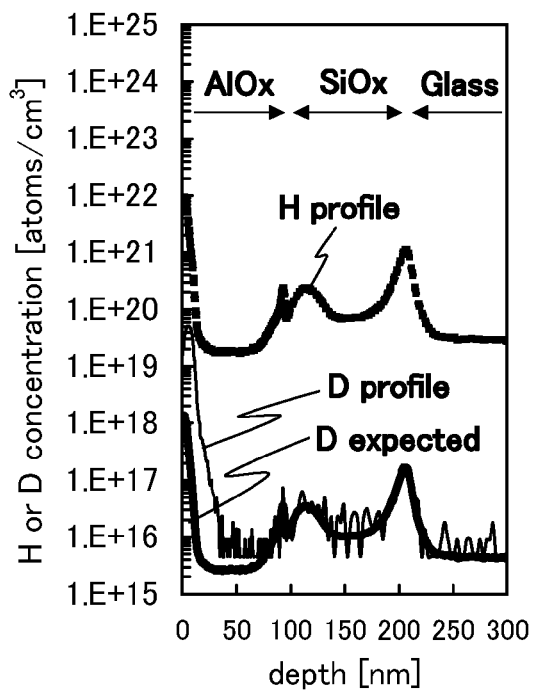
FIG. 18B1
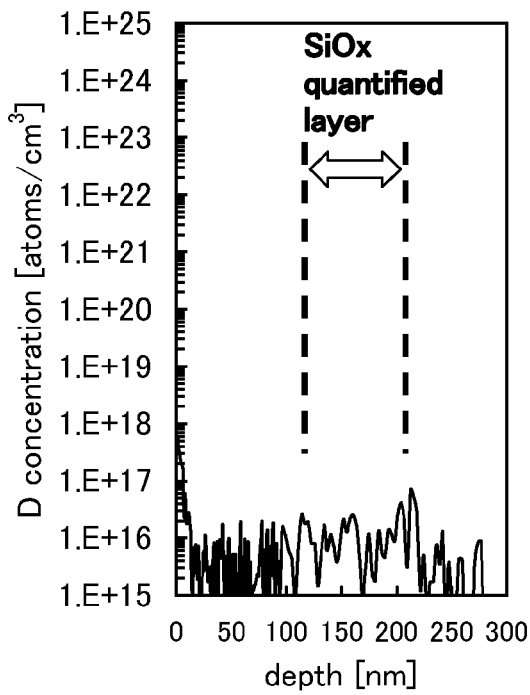
FIG. 18B2
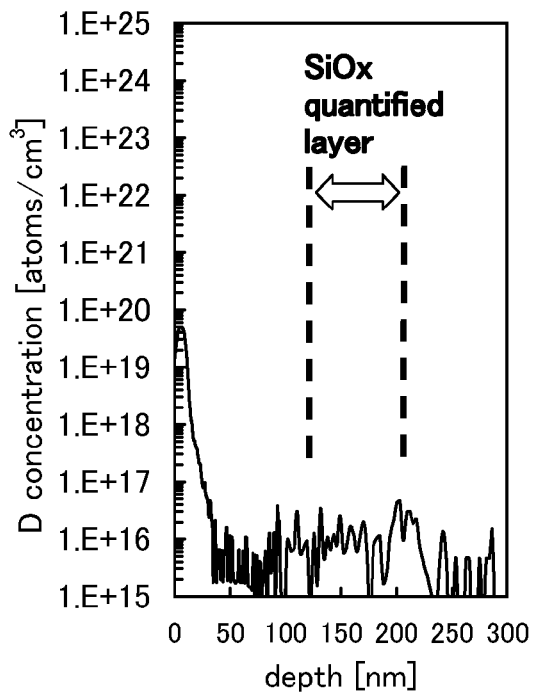

no heat treatment heat treatment at 300 °C heat treatment at 450 °C heat treatment at 600 °C no heat treatment heat treatment at 300 °C heat treatment at 450 °C heat treatment at 600 °C

METHOD FOR MANUFACTURING SEMICONDUCTOR DEVICE USING OXIDE SEMICONDUCTOR

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optical device, a semiconductor circuit, and an electronic device are all semiconductor devices.

2. Description of the Related Art

Attention has been focused on a technique for forming a transistor (also referred to as thin film transistor (TFT)) using a semiconductor thin film formed over a substrate having an insulating surface. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

[Patent Document 1] Japanese Published Patent Application No. 2006-165528

SUMMARY OF THE INVENTION

However, the electric conductivity of an oxide semiconductor changes when deviation from the stoichiometric composition occurs, or hydrogen or moisture forming an electron donor enters the oxide semiconductor in a process of forming a thin film of the oxide semiconductor. Such a phenomenon leads to a change in the electrical characteristics of a transistor including the oxide semiconductor.

In view of the above problems, an object is to provide stable electrical characteristics and high reliability to a semiconductor device including an oxide semiconductor.

In a process of manufacturing a transistor including an oxide semiconductor film, an amorphous oxide semiconductor film is formed, and oxygen is added to the amorphous oxide semiconductor film, so that an amorphous oxide semiconductor film containing excess oxygen is formed. Then, an aluminum oxide film is formed over the amorphous oxide semiconductor film, and heat treatment is performed thereon to crystallize at least part of the amorphous oxide semiconductor film, so that an oxide semiconductor film including a crystal (also referred to as a crystalline oxide semiconductor film) is formed.

As the method for adding oxygen (including at least one of an oxygen radical, an oxygen atom, and an oxygen ion) to the amorphous oxide semiconductor film, an ion implantation method, an ion doping method, a plasma immersion ion implantation method, plasma treatment, or the like can be used.

The crystalline oxide semiconductor film is an oxide semiconductor film which includes crystals and which has crystallinity. The crystals in the crystalline oxide semiconductor film may have crystal axes oriented in random directions or in a certain direction.

In one embodiment of the invention disclosed in this specification, an amorphous oxide semiconductor film containing added oxygen and covered with an aluminum oxide film is subjected to heat treatment to crystallize at least part of the amorphous oxide semiconductor film, whereby an oxide semiconductor film including a crystal having a c-axis substantially perpendicular to a surface (a crystalline oxide semiconductor film) can be formed.

The oxide semiconductor film including a crystal having a c-axis substantially perpendicular to a surface has neither a single crystal structure nor an amorphous structure and is a c-axis aligned crystalline oxide semiconductor (also referred to as CAAC-OS) film.

CAAC-OS means an oxide semiconductor including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

Note that CAAC-OS is not single crystal, but this does not mean that CAAC-OS is composed of only an amorphous component. Although CAAC-OS includes a crystallized portion (crystalline portion), a boundary between one crystalline portion and another crystalline portion is not clear in some cases.

Part of oxygen included in CAAC-OS may be substituted with nitrogen. The c-axes of individual crystalline portions included in CAAC-OS may be aligned in one direction (e.g., a direction perpendicular to a surface of a substrate over which the CAAC-OS film is formed, a surface of the CAAC-OS film, or an interface of the CAAC-OS film). Alternatively, normals of the a-b planes of individual crystalline portions included in CAAC-OS may be aligned in one direction (e.g., a direction perpendicular to the surface of the substrate over which the CAAC-OS film is formed, the surface of the CAAC-OS film, or the interface of the CAAC-OS film).

The crystalline oxide semiconductor film enables a change in the electrical characteristics of the transistor due to irradiation with visible light or ultraviolet light to be further suppressed, so that a highly reliable semiconductor device can be provided.

The oxide semiconductor film (the amorphous oxide semiconductor film and the crystalline oxide semiconductor film) has a region containing oxygen in excess of the stoichiometric ratio in the oxide semiconductor in a crystalline state, owing to the oxygen addition. In that case, the oxygen content is higher than that in the stoichiometric composition of the oxide semiconductor. Alternatively, the oxygen content is higher than that in the oxide semiconductor in a single crystal state. In some cases, oxygen exists between lattices of the oxide semiconductor. The composition of such an oxide semiconductor can be expressed by $InGaZn_mO_{m+3x}$ (x>1).

For example, supposing that m=1, the value of 1+3x in InGaZnO$_{1+3x}$ (x>1) exceeds 4 in the case where excess oxygen is contained.

If oxygen is eliminated from the oxide semiconductor film, an oxygen vacancy is formed therein. In an oxide semiconductor with no excess oxygen, such an oxygen vacancy cannot be filled with another oxygen. In contrast, since the crystalline oxide semiconductor film according to one embodiment of the disclosed invention is a crystalline oxide semiconductor film (e.g., a CAAC-OS film) containing excess oxygen, the excess oxygen (which is preferably in excess of the stoichiometric ratio) contained in the film can act to fill an oxygen vacancy in the crystalline oxide semiconductor film immediately.

The aluminum oxide film provided over the oxide semiconductor film has a high shielding effect (blocking effect) of preventing penetration of both oxygen and impurities such as hydrogen, moisture, a hydroxyl group, and hydride (also referred to as a hydrogen compound).

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

Further, since the heat treatment for crystallizing the amorphous oxide semiconductor film is performed in the state where the amorphous oxide semiconductor film is covered with the aluminum oxide film, oxygen can be prevented from being released from the amorphous oxide semiconductor film by the heat treatment. Thus, the resulting crystalline oxide semiconductor film can maintain the amount of oxygen contained in the amorphous oxide semiconductor film, and therefore has a region containing oxygen in excess of the stoichiometric ratio in the oxide semiconductor in a crystalline state.

Therefore, the crystalline oxide semiconductor film has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film and prevent excess oxygen from being released from the crystalline oxide semiconductor film.

Accordingly, with the use of the crystalline oxide semiconductor film for a transistor, it is possible to reduce a variation in the threshold voltage $V_{th}$ of the transistor and a shift of the threshold voltage ($\Delta V_{th}$) due to an oxygen vacancy.

Before the aluminum oxide film is formed, it is preferable to perform heat treatment for dehydration or dehydrogenation on the amorphous oxide semiconductor film so as to intentionally remove a hydrogen atom, an impurity containing a hydrogen atom such as water, and the like from the oxide semiconductor film.

By removing hydrogen from the oxide semiconductor to highly purify the oxide semiconductor so as not to contain impurities as much as possible, and filling oxygen vacancies therein, the oxide semiconductor can be turned into an i-type (intrinsic) oxide semiconductor or a substantially i-type (intrinsic) oxide semiconductor. In other words, a highly purified i-type (intrinsic) oxide semiconductor or an oxide semiconductor close thereto can be obtained by removing impurities such as hydrogen and water as much as possible and filling oxygen vacancies. This enables the Fermi level ($E_f$) of the oxide semiconductor to be at the same level as the intrinsic Fermi level ($E_i$).

One embodiment of the invention disclosed in this specification is a method for manufacturing a semiconductor device, which includes the steps of: forming an insulating film, an aluminum oxide film, and an amorphous oxide semiconductor film between the insulating film and the aluminum oxide film; and performing heat treatment on the amorphous oxide semiconductor film so that at least part of the amorphous oxide semiconductor film is crystallized and an oxide semiconductor film including a crystal is formed. The amorphous oxide semiconductor film has a region containing oxygen in excess of the stoichiometric ratio in the oxide semiconductor in a crystalline state as a result of adding oxygen thereto.

One embodiment of the invention disclosed in this specification is a method for manufacturing a semiconductor device, which includes the steps of: forming an insulating film; forming an amorphous oxide semiconductor film over the insulating film; adding oxygen to the amorphous oxide semiconductor film; forming an aluminum oxide film over the amorphous oxide semiconductor film containing added oxygen; and performing heat treatment on the amorphous oxide semiconductor film containing added oxygen to crystallize at least part of the amorphous oxide semiconductor film, thereby forming an oxide semiconductor film including a crystal. The amorphous oxide semiconductor film containing added oxygen has a region containing oxygen in excess of the stoichiometric ratio in the oxide semiconductor in a crystalline state.

One embodiment of the invention disclosed in this specification is a method for manufacturing a semiconductor device, which includes the steps of: forming an insulating film; forming an amorphous oxide semiconductor film over the insulating film; forming an aluminum oxide film over the amorphous oxide semiconductor film; adding oxygen to the amorphous oxide semiconductor film through the aluminum oxide film; and performing heat treatment on the amorphous oxide semiconductor film containing added oxygen to crystallize at least part of the amorphous oxide semiconductor film, thereby forming an oxide semiconductor film including a crystal. The amorphous oxide semiconductor film containing added oxygen has a region containing oxygen in excess of the stoichiometric ratio in the oxide semiconductor in a crystalline state.

According to one embodiment of the present invention, it is possible to manufacture semiconductor devices including transistors with a variety of structures such as a top gate structure, a bottom gate structure, and a staggered type and a planar type thereof. In the step of adding oxygen to the amorphous oxide semiconductor film, oxygen may be directly added to the amorphous oxide semiconductor film in an exposed state or may be added to the amorphous oxide semiconductor film through another film which is formed over the amorphous oxide semiconductor film. In the process of manufacturing a semiconductor device, depending on the transistor structure, oxygen may be added to the amorphous oxide semiconductor film either in an exposed state or through an insulating film (a gate insulating film, an insulating film (including the aluminum oxide film), a stack of the gate insulating film and the insulating film (including the aluminum oxide film)), or a stack of the gate insulating film and a gate electrode layer formed over the amorphous oxide semiconductor film.

In the above embodiments, the oxide semiconductor film including a crystal which is obtained by crystallization due to the heat treatment is preferably a crystalline oxide semiconductor (CAAC-OS) film which includes a crystal having a c-axis substantially perpendicular to a surface.

In addition, a region of the insulating film which is in contact with the amorphous oxide semiconductor film preferably has a surface with a reduced surface roughness. Specifically, the insulating film preferably has an average surface roughness of 1 nm or less, preferably 0.3 nm or less, further preferably 0.1 nm or less. The oxide semiconductor film can have stable and favorable crystallinity when formed on a surface of the insulating film with a reduced surface roughness.

In the above embodiments, an oxide insulating film may be formed between the gate electrode layer and the aluminum oxide film. Further, a sidewall insulating layer with a sidewall structure covering the side surface of the gate electrode layer may be formed before formation of the aluminum oxide film.

In the above embodiments, heat treatment for releasing hydrogen or moisture may be performed on the amorphous oxide semiconductor film before the step of adding oxygen and the step of forming the aluminum oxide film.

A transistor including such a highly purified crystalline oxide semiconductor film containing excess oxygen which fills an oxygen vacancy has less change in electrical characteristics and thus is electrically stable. Consequently, a semiconductor device formed using an oxide semiconductor, which has high reliability and stable electrical characteristics, can be provided.

The aluminum oxide film, which is provided over the crystalline oxide semiconductor film so that excess oxygen contained in the oxide semiconductor film is not released by the heat treatment, can prevent defects from being generated and increased in the crystalline oxide semiconductor and at any interface between the crystalline oxide semiconductor film and the overlying or underlying layer in contact with the crystalline oxide semiconductor film. That is, excess oxygen contained in the crystalline oxide semiconductor film acts to fill an oxygen-vacancy defect, so that a highly reliable semiconductor device having stable electrical characteristics can be provided.

Consequently, according to one embodiment of the disclosed invention, a transistor having stable electrical characteristics can be manufactured.

According to another embodiment of the disclosed invention, a highly reliable semiconductor device having favorable electrical characteristics can be manufactured.

BRIEF DESCRIPTION OF THE DRAWINGS

FIGS. 14A and 14B illustrate embodiments of semiconductor devices.

FIGS. 17A1, 17A2, 17B1, and 17B2 show SIMS measurement results of Comparison Example Sample A.

FIGS. 18A1, 18A2, 18B1, and 18B2 show SIMS measurement results of Comparison Example Sample A.

DETAILED DESCRIPTION OF THE INVENTION

Embodiments of the invention disclosed in this specification will be described in detail below with reference to drawings. Note that the invention disclosed in this specification is not limited to the description below, and it is easily understood by those skilled in the art that modes and details of the present invention can be modified in various ways. In addition, the invention disclosed in this specification should not be construed as being limited to the description in the embodiments given below. Note that ordinal numbers such as "first" and "second" are used for convenience and do not denote the order of steps or the stacking order of layers. In addition, the ordinal numbers in this specification do not denote any particular names to define the invention.

Embodiment 1

In this embodiment, one embodiment of a semiconductor device and a method for manufacturing the semiconductor device will be described with reference to FIGS. 1A to 1E. In this embodiment, a transistor including an oxide semiconductor film will be described as an example of the semiconductor device.

There is no particular limitation on the structure of the transistor; for example, a staggered type transistor or a planar type transistor having a top-gate structure or a bottom-gate structure can be employed. The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and under a channel formation region with a gate insulating film provided therebetween.

Figure 1A:
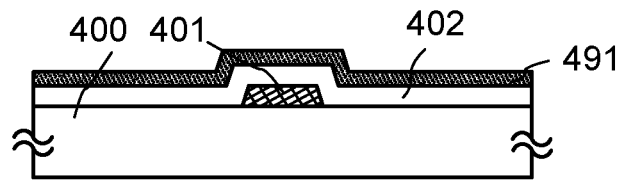
FIGS. 1A to 1E illustrate one embodiment of a semiconductor device and a method for manufacturing the semiconductor device.
Figure 1B:
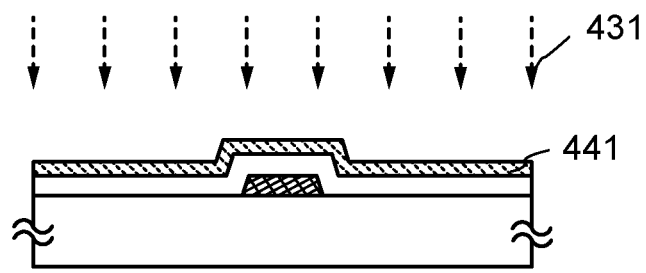
Figure 1C:
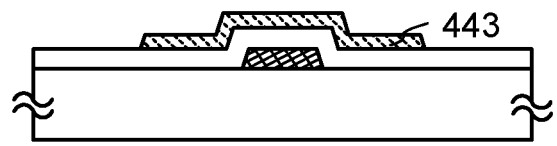
Figure 1D:
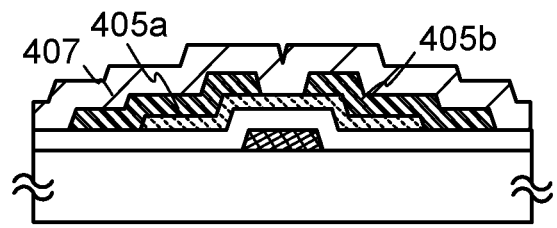
Figure 1E:
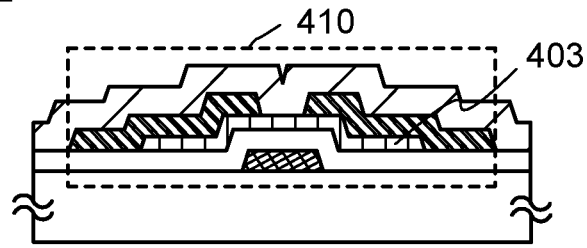

As shown in FIG. 1E, a transistor 410 includes, over a substrate 400 having an insulating surface, a gate electrode layer 401, a gate insulating film 402, a crystalline oxide semiconductor film 403, a source electrode layer 405a, and a drain electrode layer 405b. An insulating film 407 is formed over the transistor 410.

The insulating film 407 may have a single-layer structure or a stacked-layer structure, and includes an aluminum oxide film. In this embodiment, the gate insulating film 402 is formed using a silicon oxide film and the insulating film 407 is formed using an aluminum oxide film.

The crystalline oxide semiconductor film 403 is an oxide semiconductor film including a crystal. The crystalline oxide semiconductor film 403 is preferably an oxide semiconductor film which has an a-b plane substantially parallel to a surface of the crystalline oxide semiconductor film and includes a crystal having a c-axis which is substantially perpendicular to the surface. Furthermore, the crystalline oxide semiconductor film 403 preferably has neither a single crystal structure nor an amorphous structure and is an c-axis aligned crystalline oxide semiconductor (CAAC-OS) film. The crystalline oxide semiconductor film enables a change in the electrical characteristics of the transistor 410 due to irradiation with visible light or ultraviolet light to be further suppressed, so that a highly reliable semiconductor device can be provided.

FIGS. 1A to 1E illustrate an example of a method for manufacturing the transistor 410.

First, a conductive film is formed over the substrate 400 having an insulating surface, and then, the gate electrode layer 401 is formed by a first photolithography step. Note that a resist mask may be formed by an inkjet method. Formation of the resist mask by an inkjet method needs no photomask; thus, manufacturing cost can be reduced.

Although there is no particular limitation on a substrate which can be used, it is at least necessary that the substrate have heat resistance sufficient to withstand heat treatment performed later. For example, a glass substrate of barium borosilicate glass, aluminoborosilicate glass, or the like, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 400. Still alternatively, any of these substrates further provided with a semiconductor element may be used as the substrate 400.

The semiconductor device may be manufactured using a flexible substrate as the substrate 400. In order to manufacture a flexible semiconductor device, the transistor 410 including the crystalline oxide semiconductor film 403 may be directly formed over a flexible substrate. Alternatively, the transistor 410 including the crystalline oxide semiconductor film 403 may be formed over a formation substrate, and then, the transistor 410 may be separated and transferred to a flexible substrate. Note that in order to separate the transistor from the formation substrate and transfer it to the flexible substrate, a separation layer may be provided between the formation substrate and the transistor including the oxide semiconductor film.

An insulating film serving as a base film may be provided between the substrate 400 and the gate electrode layer 401. The base film has the function of preventing diffusion of an impurity element from the substrate 400, and can be formed with a single-layer structure or a stacked-layer structure using one or more of a silicon nitride film, a silicon oxide film, a silicon nitride oxide film, and a silicon oxynitride film.

The gate electrode layer 401 can be formed with a single-layer structure or a stacked-layer structure by a plasma CVD method, a sputtering method, or the like using a metal material such as molybdenum, titanium, tantalum, tungsten, aluminum, copper, neodymium, or scandium, or an alloy material which contains any of these materials as a main component.

The gate electrode layer 401 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a nitride of the light-transmitting conductive material. It is also possible that the gate electrode layer 401 has a stacked structure of the above light-transmitting conductive material and the above metal material.

The gate electrode layer 401 may have a stacked-layer structure. One layer in the stacked-layer structure may be formed using an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide. It is preferable that the gate electrode layer 401 have a stacked-layer structure and, as one layer in the stacked-layer structure, an oxynitride film containing indium, gallium, and zinc which are materials having a high work function (also referred to as an IGZON film) be used. The oxynitride film containing indium, gallium, and zinc is formed in a mixed gas atmosphere containing argon and nitrogen.

For example, the gate electrode layer 401 can have a stacked-layer structure in which a copper film, a tungsten film, and an oxynitride film containing indium, gallium, and zinc (IGZON film) are stacked in this order from the substrate 400 side or a stacked-layer structure in which a tungsten film, a tungsten nitride film, a copper film, and a titanium film are stacked in this order from the substrate 400 side.

Next, the gate insulating film 402 is formed over the gate electrode layer 401 by a plasma CVD method, a sputtering method, or the like. The gate insulating film 402 can be formed using a silicon oxide film, a gallium oxide film, an aluminum oxide film, a silicon nitride film, a silicon oxynitride film, an aluminum oxynitride film, or a silicon nitride oxide film.

When the gate insulating film 402 is formed using a high-k material such as hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)), or lanthanum oxide, gate leakage current can be reduced.

The gate insulating film 402 may have a single-layer structure or a stacked-layer structure; an oxide insulating film is preferably used as the film to be in contact with the crystalline oxide semiconductor film 403. In this embodiment, a silicon oxide film is used as the gate insulating film 402.

The gate insulating film 402 is in contact with the crystalline oxide semiconductor film 403 and therefore preferably contains a large amount of oxygen which exceeds at least the stoichiometric ratio in (a bulk of) the film. Such a region containing excess oxygen (an oxygen excess region) exists in at least part of the gate insulating film 402 (including its interface). For example, in the case where a silicon oxide film is used as the gate insulating film 402, the composition formula is SiO$_{2+\alpha}$ ($\alpha$>0).

The silicon oxide film to be in contact with the crystalline oxide semiconductor film 403 contains a large amount of oxygen so as to suitably serve as a source of oxygen to be supplied to the oxide semiconductor film.

By using such a film as the gate insulating film 402, oxygen can be supplied to the crystalline oxide semiconductor film 403, leading to favorable characteristics. By a supply of oxygen to the crystalline oxide semiconductor film 403, oxygen vacancies in the film can be filled.

When the gate insulating film 402 containing much (excess) oxygen, which serves as an oxygen supply source, is provided so as to be in contact with the crystalline oxide semiconductor film 403, oxygen can be supplied from the gate insulating film 402 to the crystalline oxide semiconductor film 403. For example, when the crystalline oxide semiconductor film 403 and the gate insulating film 402 are subjected to a heating step in a state where the crystalline oxide semiconductor film 403 and the gate insulating film 402 are at least partly in contact with each other, oxygen can be supplied to the crystalline oxide semiconductor film 403.

In order to prevent the gate insulating film 402 and the oxide semiconductor film formed over the gate insulating film 402 from containing hydrogen, a hydroxyl group, and water as much as possible, it is preferable to preheat the substrate 400 provided with the gate electrode layer 401 or the substrate 400 provided with components up to and including the gate insulating film 402 in a preheating chamber of a sputtering apparatus before formation of the oxide semiconductor film so that an impurity such as hydrogen or moisture adsorbed on the substrate 400 is eliminated and expelled from the chamber. As an exhaustion unit provided in the preheating chamber, a cryopump is preferable. Note that this preheating treatment can be skipped. This preheating step may be performed in a similar manner on the substrate 400 provided with components up to and including the source electrode layer 405a and the drain electrode layer 405b before the insulating film 407 is formed.

Note that before an amorphous oxide semiconductor film 491 is formed by a sputtering method, powder substances (also referred to as particles or dust) which are attached to the surface of the gate insulating film 402 are preferably removed by reverse sputtering in which an argon gas is introduced and plasma is generated. The reverse sputtering is a method in which voltage is applied to a substrate side, but not to a target side, in an argon atmosphere by using an RF power supply and plasma is generated in the vicinity of the substrate to modify a surface. Note that instead of the argon atmosphere, a nitrogen atmosphere, a helium atmosphere, an oxygen atmosphere, or the like may be used.

Next, the amorphous oxide semiconductor film 491 having a thickness of 2 nm to 200 nm, preferably 5 nm to 30 nm, is formed over the gate insulating film 402 (see FIG. 1A).

The amorphous oxide semiconductor film 491 can be formed by a sputtering method, a molecular beam epitaxy (MBE) method, a CVD method, a pulse laser deposition method, an atomic layer deposition (ALD) method, or the like as appropriate. The amorphous oxide semiconductor film 491 may be formed using a sputtering apparatus which performs film formation with surfaces of a plurality of substrates set substantially perpendicular to a surface of a sputtering target, which is so called a columnar plasma (CP) sputtering system.

An oxide semiconductor used for the amorphous oxide semiconductor film 491 preferably contains at least indium (In) or zinc (Zn). In particular, In and Zn are preferably contained. As a stabilizer for reducing changes in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

In the crystalline oxide semiconductor film 403 including a crystalline oxide semiconductor, defects in the bulk can be further reduced and when a surface flatness is improved, mobility higher than that of an amorphous oxide semiconductor can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm, more preferably less than or equal to 0.1 nm.

Note that $R_a$ is obtained by three-dimensionally expanding centerline average roughness that is defined by JIS B 0601 so as to be able to be applied to a surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \quad \text{[Formula 1]}$$

Note that, in the above formula, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents the average height of a measurement surface. $R_a$ can be measured using an atomic force microscope (AFM).

Thus, planarization treatment may be performed on a region of the gate insulating film 402 which is to be in contact with the crystalline oxide semiconductor film 403 (in FIG. 1A, the amorphous oxide semiconductor film 491). The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the gate insulating film 402.

In this embodiment, the amorphous oxide semiconductor film 491 is formed by a sputtering method using an In—Ga—Zn-based metal oxide target. Further, the amorphous oxide semiconductor film 491 can be formed in a rare gas (typically argon) atmosphere, an oxygen atmosphere, or a mixed atmosphere containing a rare gas and oxygen.

Note that it is preferable that the amorphous oxide semiconductor film 491 be formed under a condition that much oxygen is contained during film formation (e.g., formed by a sputtering method in a 100% oxygen atmosphere), so as to be a film containing much oxygen (preferably having a region containing oxygen in excess of the stoichiometric ratio in the oxide semiconductor in a crystalline state).

As the target for forming the oxide semiconductor film by a sputtering method, for example, an oxide target having a composition ratio of $In_2O_3:Ga_2O_3:ZnO=1:1:2$ [molar ratio] is used to form an In—Ga—Zn—O film. Without limitation to the material and the composition of the above target, for example, a metal oxide target having a composition ratio of $In_2O_3:Ga_2O_3:ZnO=1:1:1$ [molar ratio] may be used.

The filling factor of the metal oxide target is greater than or equal to 90% and less than or equal to 100%, preferably greater than or equal to 95% and less than or equal to 99.9%.

With the use of the metal oxide target having high filling factor, a dense oxide semiconductor film can be formed.

It is preferable that a high-purity gas in which an impurity such as hydrogen, water, a hydroxyl group, or hydride is reduced be used as the sputtering gas for the formation of the oxide semiconductor film.

The substrate is held in a deposition chamber kept under reduced pressure. Then, a sputtering gas in which hydrogen and water are reduced is introduced into the deposition chamber from which remaining moisture is removed, and the amorphous oxide semiconductor film 491 is formed over the substrate 400 using the above target. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. From the deposition chamber evacuated with a cryopump, a hydrogen atom, a compound including a hydrogen atom such as water ($H_2O$) (preferably, also a compound including a carbon atom), or the like, for example, is removed; thus, the concentration of an impurity in the amorphous oxide semiconductor film 491 formed in the deposition chamber can be reduced.

It is preferable that the gate insulating film 402 and the amorphous oxide semiconductor film 491 be successively formed in this order without exposure to the air. When the gate insulating film 402 and the amorphous oxide semiconductor film 491 are successively formed without exposure to the air, impurities such as hydrogen and moisture can be prevented from being adsorbed to the surface of the gate insulating film 402.

Further, heat treatment may be performed on the amorphous oxide semiconductor film 491 in order to remove excess hydrogen (including water and a hydroxyl group) (to perform dehydration or dehydrogenation). The heat treatment is performed at a temperature at which the amorphous oxide semiconductor film is not crystallized, typically, higher than or equal to 250° C. and lower than or equal to 400° C., preferably lower than or equal to 300° C.

Such heat treatment for dehydration or dehydrogenation may be performed at any timing in the process of manufacturing the transistor 410 as long as it is performed between the formation of the amorphous oxide semiconductor film 491 and the addition of oxygen to the amorphous oxide semiconductor film 491.

The heat treatment for dehydration or dehydrogenation is preferably performed before the amorphous oxide semiconductor film 491 is processed into an island shape because oxygen contained in the gate insulating film 402 can be prevented from being released by the heat treatment.

Note that in the heat treatment, it is preferable that water, hydrogen, and the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, further preferably 7N (99.99999%) or more (i.e., the impurity concentration is 1 ppm or less, preferably 0.1 ppm or less).

In addition, after the amorphous oxide semiconductor film 491 is heated by the heat treatment, it is possible to introduce, into the same furnace, a high-purity oxygen gas, a high-purity $N_2O$ gas, or ultra-dry air (with a moisture content of 20 ppm (equivalent to a dew point of −55° C.) or less, preferably 1 ppm or less, further preferably 10 ppb or less, when measured with a dew point meter using cavity ring down laser spectroscopy (CRDS)). It is preferable that water, hydrogen, and the like be not contained in the oxygen gas or the $N_2O$ gas. The purity of the oxygen gas or the $N_2O$ gas that is introduced into the heat treatment apparatus is preferably greater than or equal to 6N, more preferably greater than or equal to 7N (i.e., the concentration of impurities in the oxygen gas or the $N_2O$ gas is preferably less than or equal to 1 ppm, more preferably less than or equal to 0.1 ppm). The oxygen gas or the $N_2O$ gas acts to supply oxygen that is a main component material of the amorphous oxide semiconductor and that is reduced by the step for removing an impurity for the dehydration or dehydrogenation, so that the amorphous oxide semiconductor film can be a highly purified, electrically i-type (intrinsic) amorphous oxide semiconductor film.

Next, oxygen 431 (including at least one of an oxygen radical, an oxygen atom, and an oxygen ion) is added to the amorphous oxide semiconductor film 491; thus, oxygen is supplied to the amorphous oxide semiconductor film 491. Oxygen can be added by an ion implantation method, an ion doping method, a plasma immersion ion implantation method, plasma treatment, or the like.

The step of adding oxygen in the process of manufacturing the transistor 410 in this embodiment is performed after formation of the amorphous oxide semiconductor film 491 before formation of an aluminum oxide film as the insulating film 407. The above-described heat treatment for dehydration or dehydrogenation is performed before the step of adding oxygen. In the step of adding oxygen, oxygen may be directly added to the amorphous oxide semiconductor film or added to the amorphous oxide semiconductor film through another film such as the gate insulating film or an insulating film. An ion implantation method, an ion doping method, a plasma immersion ion implantation method, or the like may be employed in the case where oxygen is added to the amorphous oxide semiconductor film through another film, whereas plasma treatment or the like can also be employed in the case where oxygen is directly added to the amorphous oxide semiconductor film 491 in an exposed state as in this embodiment.

In this embodiment, the oxygen 431 is added to the amorphous oxide semiconductor film 491 by an ion implantation method. By the addition of the oxygen 431, the amorphous oxide semiconductor film 491 is changed into an amorphous oxide semiconductor film 441 having a region containing oxygen in excess of the stoichiometric ratio in the oxide semiconductor in a crystalline state (see FIG. 1B).

For example, it is preferable that the concentration of oxygen in the amorphous oxide semiconductor film 441, which is added in the step of adding the oxygen 431, be greater than or equal to $1 \times 10^{18}/cm^3$ and less than or equal to $3 \times 10^{21}/cm^3$. Such an oxygen excess region exists in at least part of the amorphous oxide semiconductor film 441 (including its interface). Thus, with the addition of the oxygen 431, in the stack of the gate insulating film 402, the amorphous oxide semiconductor film 441, and the insulating film 407, oxygen is contained in at least one of the interface between the gate insulating film 402 and the amorphous oxide semiconductor film 441, the inside of the amorphous oxide semiconductor film 441, and the interface between the amorphous oxide semiconductor film 441 and the insulating film 407.

The amorphous oxide semiconductor film 441 has a region containing oxygen in excess of the stoichiometric ratio in the oxide semiconductor in a crystalline state. In that case, the oxygen content is higher than that in the stoichiometric composition of the oxide semiconductor. Alternatively, the oxygen content is higher than that in the oxide semiconductor in a single crystal state. In some cases, oxygen exists between lattices of the oxide semiconductor. The composition of such an oxide semiconductor can be expressed by $InGaZn_mO_{m+3x}$ (x>1). For example, supposing that m=1, the value of 1+3x in $InGaZnO_{1+3x}$ (x>1) exceeds 4 in the case where excess oxygen is contained.

An oxygen vacancy in the amorphous oxide semiconductor film 441 can be filled with the oxygen 431 supplied to the amorphous oxide semiconductor film 441.

Note that the addition of the oxygen 431 can cause the amorphous oxide semiconductor film 441 to have a more uniform amorphous state.

In the oxide semiconductor, oxygen is one of main component materials. Thus, it is difficult to accurately estimate the oxygen concentration of the oxide semiconductor film by a method such as secondary ion mass spectrometry (SIMS). In other words, it can be said that it is hard to determine whether or not oxygen is intentionally added to the oxide semiconductor film.

It is known that there are isotopes of oxygen, such as $^{17}O$ and $^{18}O$, and that the proportions of $^{17}O$ and $^{18}O$ in all of the oxygen atoms in nature are approximately 0.037% and approximately 0.204%, respectively. That is to say, it is possible to measure the concentrations of these isotopes in the oxide semiconductor film by a method such as SIMS; therefore, the oxygen concentration of the oxide semiconductor film may be able to be estimated more accurately by measuring the concentration of such an isotope. Thus, the concentration of the isotope may be measured to determine whether or not oxygen is intentionally added to the oxide semiconductor film.

A film containing much oxygen may be used as the insulating film (such as the gate insulating film 402 or the insulating film 407) which is in contact with the amorphous oxide semiconductor film 441 and the oxygen 431 may be directly added to the amorphous oxide semiconductor film 441; in this manner, a plurality of oxygen supply methods can be performed. Such a film containing much oxygen is not necessarily used as the insulating film (such as the gate insulating film 402 or the insulating film 407) which is in contact with the amorphous oxide semiconductor film 441 in the case where the oxygen 431 is directly added to the amorphous oxide semiconductor film 441 as in this embodiment.

Next, the amorphous oxide semiconductor film 441 is processed into an amorphous oxide semiconductor film 443 having an island shape in a second photolithography step (see FIG. 1C). A resist mask for forming the amorphous oxide semiconductor film 443 having an island shape may be formed by an inkjet method. Formation of the resist mask by an inkjet method needs no photomask; thus, manufacturing cost can be reduced.

According to one embodiment of the disclosed invention, the oxide semiconductor film (amorphous oxide semiconductor film, crystalline oxide semiconductor film) may be processed into an island shape as described in this embodiment or may remain in the form of a film without being processed.

In the case where a contact hole is formed in the gate insulating film 402, the step of forming the contact hole can be performed at the same time as processing of the amorphous oxide semiconductor film 443.

Note that the etching of the amorphous oxide semiconductor film 441 may be dry etching, wet etching, or both dry etching and wet etching. As an etchant used for wet etching of the amorphous oxide semiconductor film 441, for example, a mixed solution of phosphoric acid, acetic acid, and nitric acid, or the like can be used. In addition, ITO-07N (produced by KANTO CHEMICAL CO., INC.) may be used.

Next, a conductive film to be the source and drain electrode layers (including a wiring formed using the same layer as the source and drain electrode layers) is formed over the gate insulating film 402 and the amorphous oxide semiconductor film 443. The conductive film is formed using a material which can withstand heat treatment in a later step. As the conductive film used for forming the source electrode layer and the drain electrode layer, it is possible to use, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over or/and under a metal film such as an Al film or a Cu film. Further alternatively, the conductive film used for forming the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

Through a third photolithography process, a resist mask is formed over the conductive film, the source electrode layer 405a and the drain electrode layer 405b are formed by selective etching, and then, the resist mask is removed.

In order to reduce the number of photomasks used in the photolithograph process and the number of steps, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by using one multi-tone mask. Thus, the number of light-exposure masks can be reduced and the number of corresponding photolithography steps can also be reduced, whereby simplification of the manufacturing process can be realized.

Note that it is preferable that etching conditions be optimized so as not to etch and divide the amorphous oxide semiconductor film 443 when the conductive film is etched. However, it is difficult to obtain conditions under which only the conductive film is etched and the amorphous oxide semiconductor film 443 is not etched at all. Therefore, in some cases, only part of the amorphous oxide semiconductor film 443 is etched to be an oxide semiconductor film having a groove (a depressed portion) at the time of etching of the conductive film.

In this embodiment, since a Ti film is used as the conductive film and an In—Ga—Zn-based oxide semiconductor is used for the amorphous oxide semiconductor film 443, an ammonia hydrogen peroxide mixture (a mixture of ammonia, water, and hydrogen peroxide) is used as an etchant.

Next, an insulating film 407 is formed in contact with part of the amorphous oxide semiconductor film 443 (see FIG. 1D). The insulating film 407 may have a single-layer structure or a stacked-layer structure, and includes an aluminum oxide film.

The thickness of the aluminum oxide film included in the insulating film 407 is greater than or equal to 30 nm and less than or equal to 500 nm, preferably greater than or equal to 50 nm and less than or equal to 200 nm. The insulating film 407 can be formed as appropriate using a sputtering method or the like by which impurities such as water or hydrogen can be prevented from entering the insulating film 407. When hydrogen is contained in the insulating film 407, entry of the hydrogen to the oxide semiconductor film, or extraction of oxygen from the oxide semiconductor film by hydrogen may occur, in which case the back channel in the oxide semiconductor film may have lower resistance (become n-type), so that a parasitic channel may be formed. Therefore, it is important that a formation method in which hydrogen is not used be employed so that the insulating film 407 contains hydrogen as little as possible.

The aluminum oxide film preferably has a region containing oxygen in excess of the stoichiometric ratio in the aluminum oxide in a crystalline state. In that case, the oxygen content is higher than that in the stoichiometric composition of the aluminum oxide. Alternatively, the oxygen content is higher than that in the aluminum oxide in a single crystal state. In some cases, oxygen exists between lattices of aluminum oxide. Supposing that the composition is expressed by $AlO_x$ (x>0), an aluminum oxide film having an oxygen excess region where x exceeds 3/2 is preferably used. Such an oxygen excess region exists in at least part of the aluminum oxide film (including its interface).

In this embodiment, an aluminum oxide film with a thickness of 100 nm is formed as the insulating film 407 by a sputtering method. The formation of the aluminum oxide film by a sputtering method can be performed in a rare gas (typically, argon) atmosphere, an oxygen atmosphere, or a mixed atmosphere of a rare gas and oxygen.

As in the case of forming the oxide semiconductor film, an entrapment vacuum pump (e.g., a cryopump) is preferably used in order to remove moisture remaining in a deposition chamber used for forming the insulating film 407. When the insulating film 407 is formed in the deposition chamber evacuated using a cryopump, the concentration of impurities in the insulating film 407 can be reduced. A turbo molecular pump provided with a cold trap may be used as an evacuation unit for removing moisture remaining in the deposition chamber used for forming the insulating film 407.

It is preferable that a high-purity gas in which an impurity such as hydrogen, water, a hydroxyl group, or hydride is reduced be used as the sputtering gas for the formation of the insulating film 407.

Figure 10A:
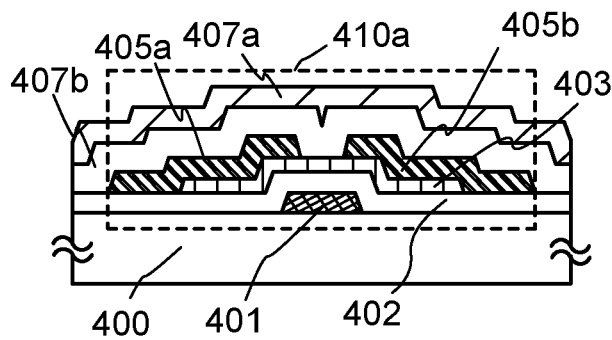
FIGS. 10A to 10D illustrate embodiments of semiconductor devices.

The insulating film 407 can have a stacked-layer structure including the aluminum oxide film and an inorganic insulating film such as, typically, a silicon oxide film, a silicon oxynitride film, an aluminum oxynitride film, or a gallium oxide film. FIG. 10A illustrates a transistor 410a as an example of the transistor 410 in which the insulating film 407 has a stacked-layer structure of insulating films 407a and 407b.

As illustrated in FIG. 10A, the insulating film 407a is formed over the crystalline oxide semiconductor film 403, the source electrode layer 405a, and the drain electrode layer 405b, and the insulating film 407b is formed over the insulating film 407a. The insulating film 407a is preferably an oxide insulating film which has a region containing excess oxygen so that oxygen can be supplied therefrom to the crystalline oxide semiconductor film 403. For example, in this embodiment, the insulating film 407a is a silicon oxide film which has a region containing oxygen in excess of the stoichiometric ratio in silicon oxide in a crystalline state, and the insulating film 407b is an aluminum oxide film.

Next, heat treatment is performed on the amorphous oxide semiconductor film 443 to crystallize at least part of the amorphous oxide semiconductor film 443, so that the crystalline oxide semiconductor film 403 which includes a crystal is formed. In this embodiment, the crystalline oxide semiconductor film 403 includes a crystal having a c-axis substantially perpendicular to a surface.

The aluminum oxide film provided as the insulating film 407 over the amorphous oxide semiconductor film 443 has a high shielding effect (blocking effect) of preventing penetration of both oxygen and an impurity such as hydrogen or moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

If oxygen is eliminated from the crystalline oxide semiconductor film 403, an oxygen vacancy is formed therein. In an oxide semiconductor with no excess oxygen, such an oxygen vacancy cannot be filled with another oxygen. In contrast, since the crystalline oxide semiconductor film 403 according to one embodiment of the disclosed invention is a crystalline oxide semiconductor film (in this embodiment, a semiconductor film including a crystal having a c-axis substantially perpendicular to a surface (a CAAC-OS film)) containing excess oxygen, the excess oxygen (which is preferably in excess of the stoichiometric ratio) contained in the film can act to fill an oxygen vacancy in the crystalline oxide semiconductor film 403 immediately.

Accordingly, with the use of the crystalline oxide semiconductor film 403 for the transistor 410, it is possible to reduce a variation in the threshold voltage $V_{th}$ of the transistor 410 and a shift of the threshold voltage ($\Delta V_{th}$) due to an oxygen vacancy.

The heat treatment for crystallizing at least part of the amorphous oxide semiconductor film 443 is performed at a temperature higher than or equal to 250° C. and lower than or equal to 700° C., preferably higher than or equal to 400° C., more preferably higher than or equal to 500° C., even more preferably higher than or equal to 550° C.

For example, the substrate is introduced into an electric furnace which is one of heat treatment apparatuses, and heat treatment is performed on the oxide semiconductor film at 450° C. for 1 hour in an oxygen atmosphere.

Note that a heat treatment apparatus is not limited to an electric furnace, and a device for heating an object to be processed by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high-temperature gas, an inert gas that does not react with an object to be processed by heat treatment, for example, nitrogen or a rare gas such as argon, is used.

For example, as the heat treatment, GRTA may be performed as follows. The substrate is put in an inert gas heated to a high temperature of 650° C. to 700° C., is heated for several minutes, and is taken out of the inert gas.

Note that as the heat treatment for the crystallization, heat treatment by light irradiation with laser light, lamp light, or the like may be performed. For example, the amorphous oxide semiconductor film can be crystallized by being irradiated with laser light having a wavelength which is absorbed by the amorphous oxide semiconductor film.

The heat treatment may be performed in an atmosphere of nitrogen, oxygen, ultra-dry air (air with a water content of 20 ppm or lower, preferably 1 ppm or lower, more preferably 10 ppb or lower), or a rare gas (argon, helium, or the like). Note that it is preferable that water, hydrogen, and the like be not contained in the atmosphere of nitrogen, oxygen, ultra-dry air, or a rare gas. The purity of nitrogen, oxygen, or a rare gas introduced into a heat treatment apparatus is preferably set to 6N (99.9999%) or more, further preferably 7N (99.99999%) or more (i.e., the impurity concentration is 1 ppm or less, preferably 0.1 ppm or less).

From the highly purified crystalline oxide semiconductor film 403 whose oxygen vacancies have been filled, impurities such as hydrogen and water have been removed sufficiently, and the concentration of hydrogen in the crystalline oxide semiconductor film 403 is $5 \times 10^{19}/cm^3$ or less, preferably $5 \times 10^{18}/cm^3$ or less. Note that the concentration of hydrogen in the crystalline oxide semiconductor film 403 is measured by secondary ion mass spectrometry (SIMS).

The number of carriers in the crystalline oxide semiconductor film 403 is very small (close to zero), and the carrier concentration is lower than $1 \times 10^{14}/cm^3$, preferably lower than $1 \times 10^{12}/cm^3$, more preferably lower than $1 \times 10^{11}/cm^3$.

Through the above process, the transistor 410 is formed (see FIG. 1E). The transistor 410 includes the highly purified crystalline oxide semiconductor film containing excess oxygen with which an oxygen vacancy is filled. Therefore, the transistor 410 has less change in electrical characteristics and thus is electrically stable.

In the transistor 410 formed according to this embodiment using the highly purified crystalline oxide semiconductor film 403 containing excess oxygen with which an oxygen vacancy is filled, the value of a current in the off state (the value of an off-state current) per unit channel width (1 μm) can be reduced so as to be less than or equal to 100 zA/μm (1 zA (zeptoampere) is $1 \times 10^{-21}$ A), preferably less than or equal to 10 zA/μm, more preferably less than or equal to 1 zA/μm, further preferably less than or equal to 100 yA/μm at room temperature.

As described above, a semiconductor device formed using an oxide semiconductor, which has stable electrical characteristics, can be provided. Accordingly, a semiconductor device with high reliability can be provided.

This embodiment can be implemented in appropriate combinations with any of the other embodiments.

Embodiment 2

In this embodiment, another embodiment of a semiconductor device and a method for manufacturing the semiconductor device will be described with reference to FIGS. 2A to 2E.

The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

Described in this embodiment is an example in which addition of oxygen to an amorphous oxide semiconductor film is performed through an insulating film provided over the transistor 410 in a method for manufacturing a semiconductor device according to one embodiment of the disclosed invention.

FIGS. 2A to 2E illustrate an example of a method for manufacturing the transistor 410 of this embodiment.

A conductive film is formed over the substrate 400 having an insulating surface, and then, the gate electrode layer 401 is formed.

Next, the gate insulating film 402 is formed over the gate electrode layer 401 by a plasma CVD method, a sputtering method, or the like.

Next, the amorphous oxide semiconductor film 491 having a thickness of 2 nm to 200 nm, preferably 5 nm to 30 nm, is formed over the gate insulating film 402 (see FIG. 102A).

Further, heat treatment may be performed on the amorphous oxide semiconductor film 491 in order to remove excess hydrogen (including water and a hydroxyl group) (to perform dehydration or dehydrogenation).

Figure 2A:
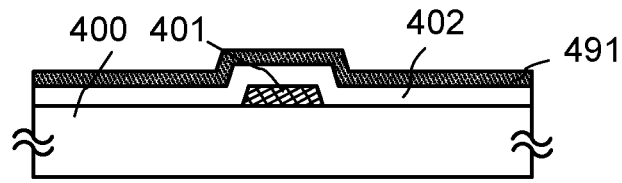
FIGS. 2A to 2E illustrate one embodiment of a semiconductor device and a method for manufacturing the semiconductor device.
Figure 2B:
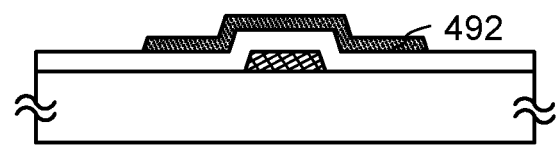

Next, the amorphous oxide semiconductor film 491 is processed into an amorphous oxide semiconductor film 492 having an island shape in a photolithography step (see FIG. 2B).

Next, the source electrode layer 405a and the drain electrode layer 405b are formed over the gate insulating film 402 and the amorphous oxide semiconductor film 492.

Figure 2C:
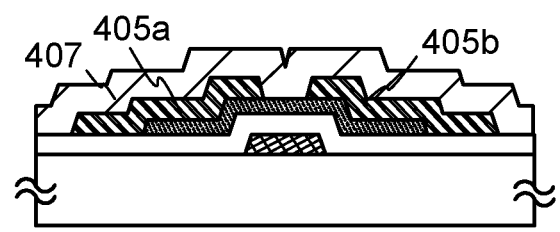
Figure 2D:
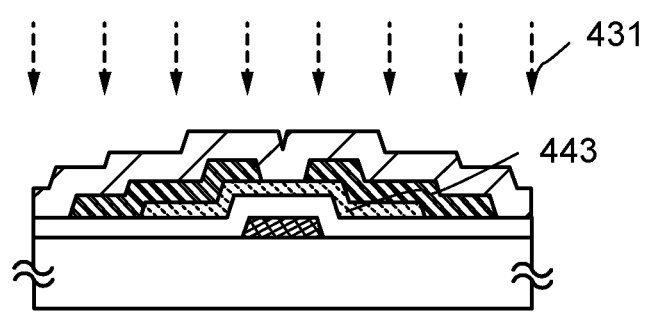

Next, the insulating film 407 is formed in contact with part of the amorphous oxide semiconductor film 492 (see FIG. 2C). The insulating film 407 may have a single-layer structure or a stacked-layer structure, and includes an aluminum oxide film.

In this embodiment, an aluminum oxide film with a thickness of 100 nm is formed as the insulating film 407 by a sputtering method.

Next, oxygen 431 (including at least one of an oxygen radical, an oxygen atom, and an oxygen ion) is added to the amorphous oxide semiconductor film 492; thus, oxygen is supplied to the amorphous oxide semiconductor film 492.

In this embodiment, the oxygen 431 is added to the amorphous oxide semiconductor film 492 through the insulating film 407 by an ion implantation method after the insulating film 407 is formed. By the addition of the oxygen 431, the amorphous oxide semiconductor film 492 is changed into an amorphous oxide semiconductor film 443 having a region containing oxygen in excess of the stoichiometric ratio in the oxide semiconductor in a crystalline state (see FIG. 2D).

An oxygen vacancy in the amorphous oxide semiconductor film 443 can be filled with the oxygen 431 supplied to the amorphous oxide semiconductor film 443.

Note that when oxygen is added to the amorphous oxide semiconductor film through the insulating film, oxygen can also be included in part of the insulating film (and at the interface between the insulating film and the amorphous oxide semiconductor film) depending on conditions for the oxygen addition. For example, in the case where the insulating film has a stacked-layer structure of an oxide insulating film (e.g., a silicon oxide film) and an aluminum oxide film, when oxygen is added to the amorphous oxide semiconductor film, oxygen can also be included in the oxide insulating film in contact with the amorphous oxide semiconductor film and at the interface between the amorphous oxide semiconductor film and the oxide insulating film; accordingly, an oxygen excess region can be formed in the stack of the amorphous oxide semiconductor film and the oxide insulating film.

Next, heat treatment is performed on the amorphous oxide semiconductor film 443 to crystallize at least part of the amorphous oxide semiconductor film 443, so that the crystalline oxide semiconductor film 403 is formed.

In this embodiment, the crystalline oxide semiconductor film 403 including a crystal having a c-axis substantially perpendicular to a surface is formed as the crystalline oxide semiconductor film 403.

The aluminum oxide film provided as the insulating film 407 over the amorphous oxide semiconductor film 443 has a high shielding effect (blocking effect) of preventing penetration of both oxygen and an impurity such as hydrogen or moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

Therefore, the crystalline oxide semiconductor film 403 has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film 403 and prevent excess oxygen from being released from the crystalline oxide semiconductor film 403.

If oxygen is eliminated from the crystalline oxide semiconductor film 403, an oxygen vacancy is formed therein. In an oxide semiconductor with no excess oxygen, such an oxygen vacancy can be filled with another oxygen. In contrast, since the crystalline oxide semiconductor film 403 according to one embodiment of the disclosed invention is a film containing excess oxygen (in this embodiment, a CAAC-OS film containing excess oxygen), the excess oxygen (which is preferably in excess of the stoichiometric ratio) contained in the film can act to fill an oxygen vacancy in the crystalline oxide semiconductor film 403 immediately.

Figure 2E:
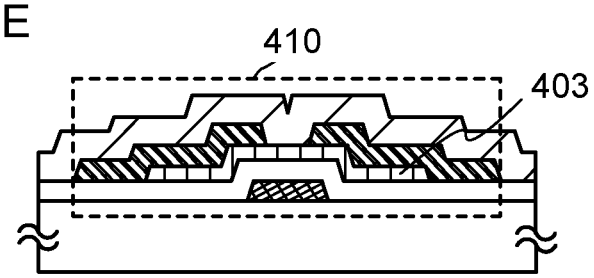

Through the above process, the transistor 410 is formed (see FIG. 2E). The transistor 410 includes the highly purified crystalline oxide semiconductor film containing excess oxygen with which an oxygen vacancy is filled. Therefore, the transistor 410 has less change in electrical characteristics and thus is electrically stable.

As described above, a semiconductor device formed using an oxide semiconductor, which has stable electrical characteristics, can be provided. Accordingly, a semiconductor device with high reliability can be provided.

This embodiment can be implemented in appropriate combinations with any of the other embodiments.

Embodiment 3

In this embodiment, another embodiment of a semiconductor device and a method for manufacturing the semiconductor device will be described with reference to FIGS. 3A to 3E. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

A transistor 430 illustrated in FIGS. 3A to 3E is an example of a bottom-gate transistor.

The transistor 430 includes, over the substrate 400 having an insulating surface, the gate electrode layer 401, the gate insulating film 402, the source electrode layer 405a, the drain electrode layer 405b, and the crystalline oxide semiconductor film 403. The insulating film 407 is formed so as to cover the transistor 430.

FIGS. 3A to 3E illustrate an example of a method for manufacturing the transistor 430.

Figure 3A:
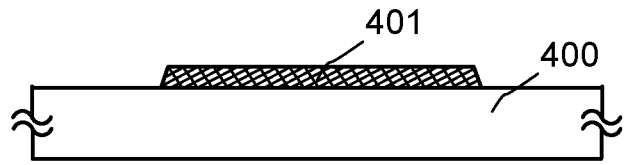
FIGS. 3A to 3E illustrate one embodiment of a semiconductor device and a method for manufacturing the semiconductor device.

First, the gate electrode layer 401 is formed over the substrate 400 having an insulating surface (see FIG. 3A).

The gate insulating film 402 is formed over the gate electrode layer 401. In this embodiment, a silicon oxide film is used as the gate insulating film 402.

The silicon oxide film to be in contact with the crystalline oxide semiconductor film 403 preferably has a region containing oxygen in excess of the stoichiometric ratio in the silicon oxide in a crystalline state.

The silicon oxide film to be in contact with the crystalline oxide semiconductor film 403 contains a large amount of oxygen so as to suitably serve as a source of oxygen to be supplied to the oxide semiconductor film.

Next, the source electrode layer 405a and the drain electrode layer 405b are formed over the gate insulating film 402.

Figure 3B:
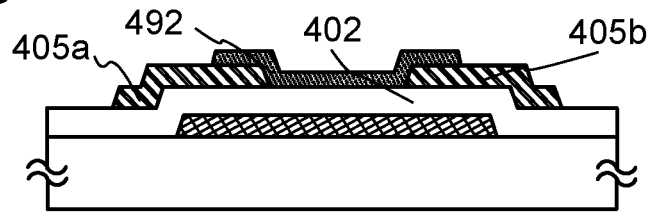
Figure 3C:
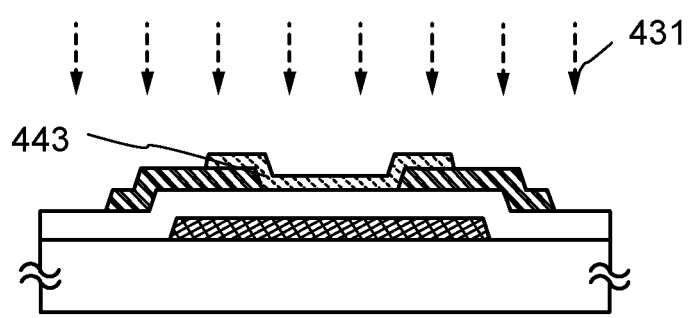

Then, an amorphous oxide semiconductor film is formed over the gate insulating film 402, the source electrode layer 405a, and the drain electrode layer 405b, and the amorphous oxide semiconductor film is processed into an island shape to form the amorphous oxide semiconductor film 492 (see FIG. 3B).

As the amorphous oxide semiconductor film 492, an In—Ga—Zn-based oxide film is formed by a sputtering method using an In—Ga—Zn-based oxide target in this embodiment.

Further, heat treatment may be performed on the amorphous oxide semiconductor film 492 in order to remove excess hydrogen (including water and a hydroxyl group) (to perform dehydration or dehydrogenation). The heat treatment is performed at a temperature at which the amorphous oxide semiconductor film 492 is not crystallized, typically, higher than or equal to 250° C. and lower than or equal to 400° C., preferably lower than or equal to 300° C.

The heat treatment for dehydration or dehydrogenation may be performed before processing into the island-shaped amorphous oxide semiconductor film 492.

Next, oxygen 431 (including at least one of an oxygen radical, an oxygen atom, and an oxygen ion) is added to the amorphous oxide semiconductor film 492; thus, oxygen is supplied to the amorphous oxide semiconductor film 492.

In this embodiment, the oxygen 431 is added to the amorphous oxide semiconductor film 492 in an exposed state by an ion implantation method. By the addition of the oxygen 431, the amorphous oxide semiconductor film 492 is changed into the amorphous oxide semiconductor film 443 having a region containing oxygen in excess of the stoichiometric ratio in the oxide semiconductor in a crystalline state (see FIG. 253C).

An oxygen vacancy in the amorphous oxide semiconductor film 443 can be filled with the oxygen 431 supplied to the amorphous oxide semiconductor film 443.

Figure 3D:
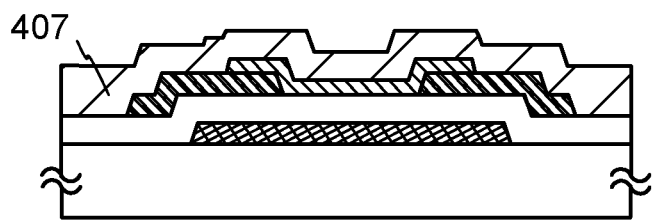

Next, the insulating film 407 is formed over the amorphous oxide semiconductor film 443 (see FIG. 3D). The insulating film 407 may have a single-layer structure or a stacked-layer structure, and includes an aluminum oxide film.

The thickness of the aluminum oxide film included in the insulating film 407 is greater than or equal to 30 nm and less than or equal to 500 nm, preferably greater than or equal to 50 nm and less than or equal to 200 nm.

The aluminum oxide film preferably has a region containing oxygen in excess of the stoichiometric ratio in the aluminum oxide in a crystalline state.

In this embodiment, an aluminum oxide film with a thickness of 100 nm is formed as the insulating film 407 by a sputtering method.

Next, heat treatment is performed on the amorphous oxide semiconductor film 443 to crystallize at least part of the amorphous oxide semiconductor film 443, so that the crystalline oxide semiconductor film 403 is formed.

The heat treatment for crystallizing at least part of the amorphous oxide semiconductor film 443 is performed at a temperature higher than or equal to 250° C. and lower than or equal to 700° C., preferably higher than or equal to 400° C., more preferably higher than or equal to 500° C., even more preferably higher than or equal to 550° C.

In this embodiment, the crystalline oxide semiconductor film 403 including a crystal having a c-axis substantially perpendicular to a surface is formed as the crystalline oxide semiconductor film 403.

The aluminum oxide film provided as the insulating film 407 over the amorphous oxide semiconductor film 443 has a high shielding effect (blocking effect) of preventing penetration of both oxygen and an impurity such as hydrogen or moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

Therefore, the crystalline oxide semiconductor film 403 has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film 403 and prevent excess oxygen from being released from the crystalline oxide semiconductor film 403.

If oxygen is eliminated from the crystalline oxide semiconductor film 403, an oxygen vacancy is formed therein. In an oxide semiconductor with no excess oxygen, such an oxygen vacancy cannot be filled with another oxygen. In contrast, since the crystalline oxide semiconductor film 403 according to one embodiment of the disclosed invention is a film containing excess oxygen (in this embodiment, a CAAC-OS film containing excess oxygen), the excess oxygen (which is preferably in excess of the stoichiometric ratio) contained in the film can act to fill an oxygen vacancy in the crystalline oxide semiconductor film 403 immediately.

Accordingly, with the use of the crystalline oxide semiconductor film 403 for the transistor 430, it is possible to reduce a variation in the threshold voltage $V_{th}$ of the transistor 430 and a shift of the threshold voltage ($\Delta V_{th}$) due to an oxygen vacancy.

Figure 3E:
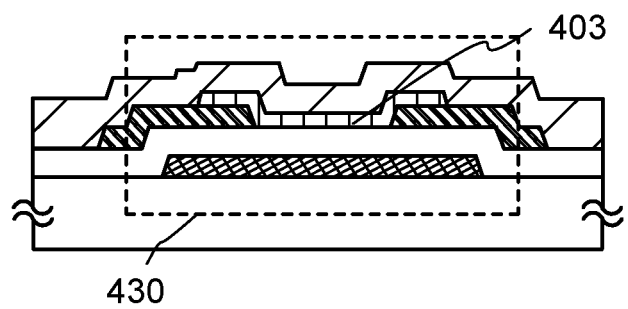

Through the above process, the transistor 430 is formed (see FIG. 3E). The transistor 430 includes the highly purified crystalline oxide semiconductor film containing excess oxygen with which an oxygen vacancy is filled. Therefore, the transistor 430 has less change in electrical characteristics and thus is electrically stable.

In the transistor 430 formed according to this embodiment using the highly purified crystalline oxide semiconductor film 403 containing excess oxygen with which an oxygen vacancy is filled, the value of a current in the off state (the value of an off-state current) per unit channel width (1 μm) can be reduced so as to be less than or equal to 100 zA/μm (1 zA (zeptoampere) is $1\times10^{-21}$ A), preferably less than or equal to 10 zA/μm, more preferably less than or equal to 1 zA/μm, further preferably less than or equal to 100 yA/μm at room temperature.

As described above, a semiconductor device formed using an oxide semiconductor, which has stable electrical characteristics, can be provided. Accordingly, a semiconductor device with high reliability can be provided.

This embodiment can be implemented in appropriate combinations with any of the other embodiments.

Embodiment 4

In this embodiment, another embodiment of a semiconductor device and a method for manufacturing the semiconductor device will be described with reference to FIGS. 4A to 4E. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

Described in this embodiment is an example in which addition of oxygen to an amorphous oxide semiconductor film is performed through an insulating film provided over the transistor 430 in a method for manufacturing a semiconductor device according to one embodiment of the disclosed invention.

The transistor 430 illustrated in FIGS. 4A to 4E is an example of a bottom-gate transistor. FIGS. 4A to 4E illustrate an example of a method for manufacturing the transistor 430.

Figure 4A:
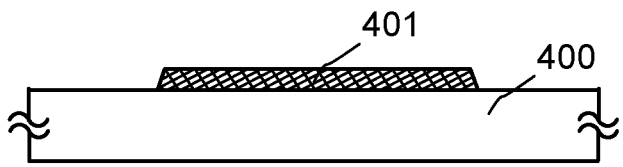
FIGS. 4A to 4E illustrate one embodiment of a semiconductor device and a method for manufacturing the semiconductor device.

First, the gate electrode layer 401 is formed over the substrate 400 having an insulating surface (see FIG. 4A).

The gate insulating film 402 is formed over the gate electrode layer 401. In this embodiment, a silicon oxide film is used as the gate insulating film 402.

The silicon oxide film to be in contact with the crystalline oxide semiconductor film 403 preferably has a region containing oxygen in excess of the stoichiometric ratio in the silicon oxide in a crystalline state.

The silicon oxide film to be in contact with the crystalline oxide semiconductor film 403 contains a large amount of oxygen so as to suitably serve as a source of oxygen to be supplied to the oxide semiconductor film.

Next, the source electrode layer 405a and the drain electrode layer 405b are formed over the gate insulating film 402.

Figure 4B:
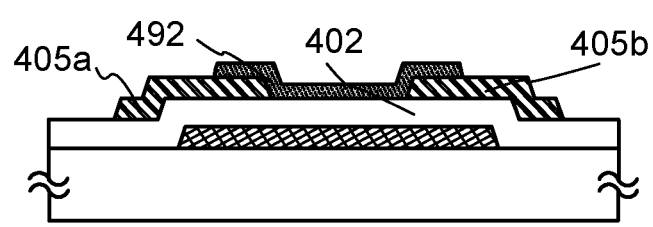

Then, an amorphous oxide semiconductor film is formed over the gate insulating film 402, the source electrode layer 405a, and the drain electrode layer 405b, and the amorphous oxide semiconductor film is processed into an island shape to form the amorphous oxide semiconductor film 492 (see FIG. 4B).

As the amorphous oxide semiconductor film 492 in this embodiment, an In—Ga—Zn-based oxide film is formed by a sputtering method using an In—Ga—Zn-based oxide target.

Further, heat treatment may be performed on the amorphous oxide semiconductor film 492 in order to remove excess hydrogen (including water and a hydroxyl group) (to perform dehydration or dehydrogenation). The heat treatment is performed at a temperature at which the amorphous oxide semiconductor film 492 is not crystallized, typically, higher than or equal to 250° C. and lower than or equal to 400° C., preferably lower than or equal to 300° C.

The heat treatment for dehydration or dehydrogenation may be performed before processing into the island-shaped amorphous oxide semiconductor film 492.

Figure 4C:
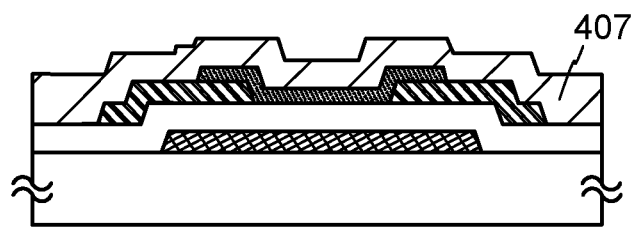
Figure 4D:
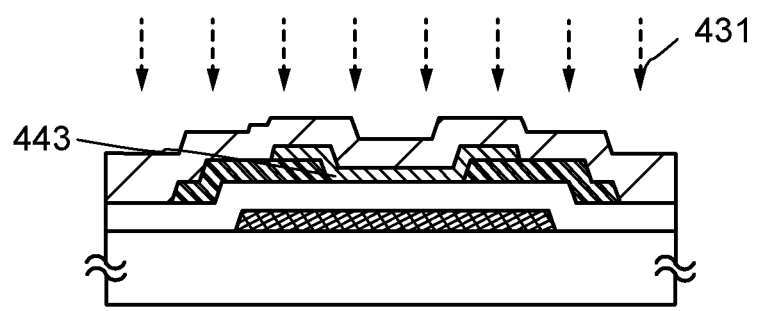

Next, the insulating film 407 is formed over the amorphous oxide semiconductor film 492 (see FIG. 4C). The insulating film 407 may have a single-layer structure or a stacked-layer structure, and includes an aluminum oxide film.

The thickness of the aluminum oxide film included in the insulating film 407 is greater than or equal to 30 nm and less than or equal to 500 nm, preferably greater than or equal to 50 nm and less than or equal to 200 nm.

The aluminum oxide film preferably has a region containing oxygen in excess of the stoichiometric ratio in the aluminum oxide in a crystalline state.

In this embodiment, an aluminum oxide film with a thickness of 100 nm is formed as the insulating film 407 by a sputtering method.

Next, oxygen 431 (including at least one of an oxygen radical, an oxygen atom, and an oxygen ion) is added to the amorphous oxide semiconductor film 492; thus, oxygen is supplied to the amorphous oxide semiconductor film 492.

In this embodiment, the oxygen 431 is added to the amorphous oxide semiconductor film 492 through the insulating film 407 by an ion implantation method after the insulating film 407 is formed. By the addition of the oxygen 431, the amorphous oxide semiconductor film 492 is changed into an amorphous oxide semiconductor film 443 having a region containing oxygen in excess of the stoichiometric ratio in the oxide semiconductor in a crystalline state (see FIG. 4D).

An oxygen vacancy in the amorphous oxide semiconductor film 443 can be filled with the oxygen 431 supplied to the amorphous oxide semiconductor film 443.

Next, heat treatment is performed on the amorphous oxide semiconductor film 443 to crystallize at least part of the amorphous oxide semiconductor film 443, so that the crystalline oxide semiconductor film 403 is formed.

The heat treatment for crystallizing at least part of the amorphous oxide semiconductor film 443 is performed at a temperature higher than or equal to 250° C. and lower than or equal to 700° C., preferably higher than or equal to 400° C., more preferably higher than or equal to 500° C., even more preferably higher than or equal to 550° C.

In this embodiment, the crystalline oxide semiconductor film 403 including a crystal having a c-axis substantially perpendicular to a surface is formed as the crystalline oxide semiconductor film 403.

The aluminum oxide film provided as the insulating film 407 over the amorphous oxide semiconductor film 443 has a high shielding effect (blocking effect) of preventing penetration of both oxygen and an impurity such as hydrogen or moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

Therefore, the crystalline oxide semiconductor film 403 has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film 403 and prevent excess oxygen from being released from the crystalline oxide semiconductor film 403.

If oxygen is eliminated from the crystalline oxide semiconductor film 403, an oxygen vacancy is formed therein. In an oxide semiconductor with no excess oxygen, such an oxygen vacancy cannot be filled with another oxygen. In contrast, since the crystalline oxide semiconductor film 403 according to one embodiment of the disclosed invention is a film containing excess oxygen (in this embodiment, a CAAC-OS film containing excess oxygen), the excess oxygen (which is preferably in excess of the stoichiometric ratio) contained in the film can act to fill an oxygen vacancy in the crystalline oxide semiconductor film 403 immediately.

Figure 4E:
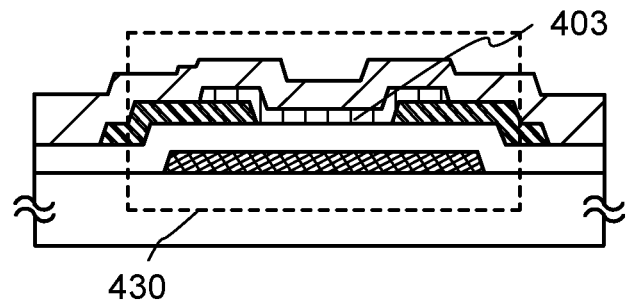

Through the above process, the transistor 430 is formed (see FIG. 4E). The transistor 430 includes the highly purified crystalline oxide semiconductor film containing excess oxygen with which an oxygen vacancy is filled. Therefore, the transistor 430 has less change in electrical characteristics and thus is electrically stable.

As described above, a semiconductor device formed using an oxide semiconductor, which has stable electrical characteristics, can be provided. Accordingly, a semiconductor device with high reliability can be provided.

This embodiment can be implemented in appropriate combinations with any of the other embodiments.

Embodiment 5

In this embodiment, another embodiment of a semiconductor device and a method for manufacturing the semiconductor device will be described with reference to FIGS. 5A to 5F. In this embodiment, a transistor including an oxide semiconductor film will be described as an example of the semiconductor device. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

A transistor 440 illustrated in FIGS. 5A to 5F is an example of a top-gate transistor.

Figure 5A:
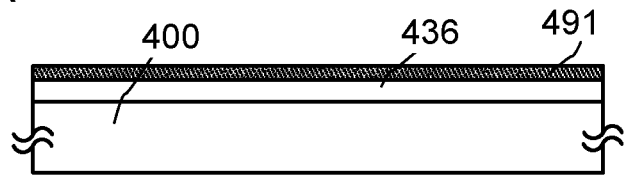
FIGS. 5A to 5F illustrate one embodiment of a semiconductor device and a method for manufacturing the semiconductor device.
Figure 5B:
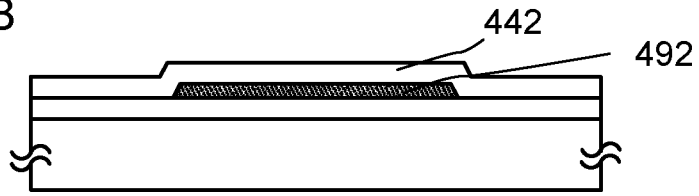
Figure 5C:
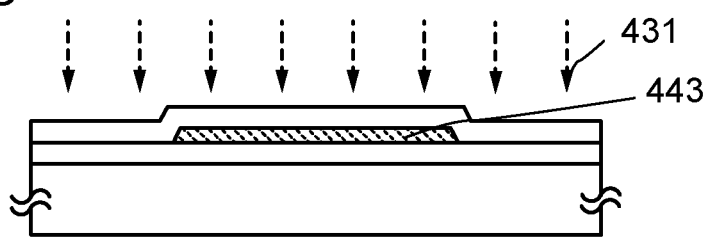
Figure 5D:
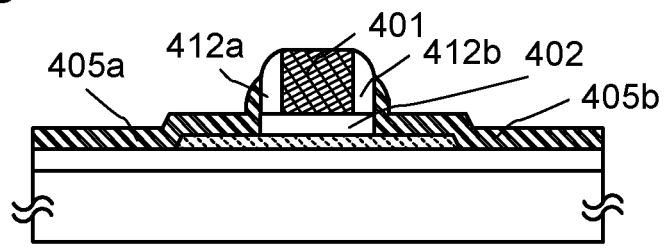
Figure 5E:
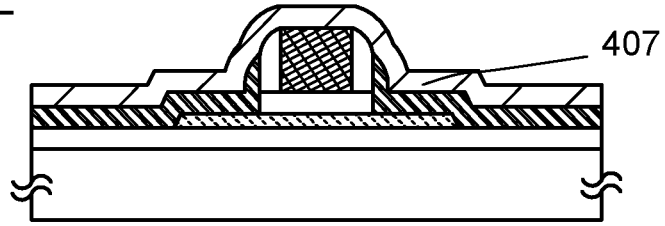
Figure 5F:
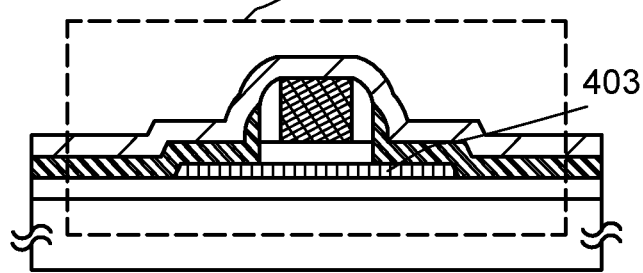

As illustrated in FIG. 5F, the transistor 440 includes, over the substrate 400 having an insulating surface and provided with an insulating film 436, the source electrode layer 405a, the drain electrode layer 405b, the crystalline oxide semiconductor film 403, the gate insulating film 402, and the gate electrode layer 401. The insulating film 407 is formed over the transistor 440.

The insulating film 407 may have a single-layer structure or a stacked-layer structure, and includes an aluminum oxide film. In this embodiment, an aluminum oxide film is used as the insulating film 407.

The crystalline oxide semiconductor film 403 is an oxide semiconductor film which has crystallinity, and in this embodiment, a c-axis aligned crystalline oxide semiconductor (CAAC-OS) film which has an a-b plane substantially parallel to a surface of the crystalline oxide semiconductor film, which includes a crystal having a c-axis substantially perpendicular to the surface, and which has neither a single crystal structure nor an amorphous structure. The crystalline oxide semiconductor film enables a change in the electrical characteristics of the transistor due to irradiation with visible light or ultraviolet light to be further suppressed, so that a highly reliable semiconductor device can be provided.

FIGS. 5A to 5F illustrate an example of a method for manufacturing the transistor 440.

First, the insulating film 436 is formed over the substrate 400 having an insulating surface.

The insulating film 436 can be formed by a plasma CVD method, a sputtering method, or the like using silicon oxide, silicon oxynitride, aluminum oxide, aluminum oxynitride, hafnium oxide, gallium oxide, silicon nitride, silicon nitride oxide, aluminum nitride, aluminum nitride oxide, or a mixed material thereof.

The insulating film 436 may have a single-layer structure or a stacked-layer structure; an oxide insulating film is preferably used as the film to be in contact with the crystalline oxide semiconductor film 403. A silicon oxide film formed by a sputtering method is used as the insulating film 436 in this embodiment.

Next, the amorphous oxide semiconductor film 491 is formed over the insulating film 436 (see FIG. 5A).

The insulating film 436 is in contact with the amorphous oxide semiconductor film 491 and therefore preferably contains a large amount of oxygen which exceeds at least the stoichiometric ratio in (a bulk of) the film. For example, in the case where a silicon oxide film is used as the insulating film 436, the composition formula is $SiO_{2+\alpha}$ ($\alpha$>0). By using such a film as the insulating film 436, oxygen can be supplied to the amorphous oxide semiconductor film 491, leading to favorable characteristics. By a supply of oxygen to the amorphous oxide semiconductor film 491, oxygen vacancies in the film can be filled.

For example, when the insulating film 436 containing much (excess) oxygen, which serves as an oxygen supply source, is provided so as to be in contact with the amorphous oxide semiconductor film 491, oxygen can be supplied from the insulating film 436 to the amorphous oxide semiconductor film 491. When the amorphous oxide semiconductor film 491 and the insulating film 436 are subjected to a heating step in a state where the amorphous oxide semiconductor film 491 and the insulating film 436 are at least partly in contact with each other, oxygen may be supplied to the crystalline oxide semiconductor film 403.

In addition, a region of the insulating film 436 which is in contact with the crystalline oxide semiconductor film 403 (in the step of FIG. 5A, the amorphous oxide semiconductor film 491) preferably has a surface with a reduced surface roughness. Specifically, the insulating film 436 preferably has an average surface roughness of 1 nm or less, preferably 0.3 nm or less, further preferably 0.1 nm or less. The crystalline oxide semiconductor film 403 can have stable and favorable crystallinity when the crystalline oxide semiconductor film 403 (in the step of FIG. 5A, the amorphous oxide semiconductor film 491) is formed on a surface with a reduced surface roughness.

Thus, planarization treatment may be performed on a region of the insulating film 436 which is to be in contact with the crystalline oxide semiconductor film 403 (in the step of FIG. 5A, the amorphous oxide semiconductor film 491). The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side in an argon atmosphere by using an RF power supply and plasma is generated in the vicinity of the substrate to modify a surface. Note that instead of the argon atmosphere, a nitrogen atmosphere, a helium atmosphere, an oxygen atmosphere, or the like may be used. Powder substances (also referred to as particles or dust) which are attached to the surface of the insulating film 436 can be removed by reverse sputtering.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the insulating film 436.

In order to prevent the amorphous oxide semiconductor film 491 from containing hydrogen or water as much as possible in the step of forming the amorphous oxide semiconductor film 491, it is preferable to preheat the substrate provided with the insulating film 436 in a preheating chamber of a sputtering apparatus before the formation of the amorphous oxide semiconductor film 491 so that an impurity such as hydrogen or moisture adsorbed on the substrate and the insulating film 436 is eliminated and expelled from the chamber. As an exhaustion unit provided in the preheating chamber, a cryopump is preferable.

The amorphous oxide semiconductor film 491 can have a thickness of 1 nm to 200 nm (preferably 5 nm to 30 nm) and can be formed by a sputtering method, a molecular beam epitaxy (MBE) method, a CVD method, a pulse laser deposition method, an atomic layer deposition (ALD) method, or the like as appropriate.

Further, heat treatment may be performed on the amorphous oxide semiconductor film 491 in order to remove excess hydrogen (including water and a hydroxyl group) (to perform dehydration or dehydrogenation). The heat treatment is performed at a temperature at which the amorphous oxide semiconductor film is not crystallized, typically, higher than or equal to 250° C. and lower than or equal to 400° C., preferably lower than or equal to 300° C.

The heat treatment can be performed under reduced pressure, a nitrogen atmosphere, or the like. For example, the substrate is introduced into an electric furnace which is one of heat treatment apparatuses, and a heating step is performed on the oxide semiconductor film at 450° C. for 1 hour in a nitrogen atmosphere. After the amorphous oxide semiconductor film 491 is heated by the heat treatment, a high-purity oxygen gas, a high-purity $N_2O$ gas, or ultra-dry air may be introduced into the same furnace. The oxygen gas or the $N_2O$ gas acts to supply oxygen that is a main component material of the amorphous oxide semiconductor and that is reduced by the step for removing an impurity for the dehydration or dehydrogenation.

The heat treatment for dehydration or dehydrogenation is preferably performed before the amorphous oxide semiconductor film 491 is processed into the amorphous oxide semiconductor film 492 having an island shape because oxygen contained in the insulating film 436 can be prevented from being released by the heat treatment.

Note that the amorphous oxide semiconductor film 491 may be processed into an island shape or may remain in the form of a film without being processed. In addition, an element isolation region formed using an insulating film may be provided to isolate the amorphous oxide semiconductor film 491 for each element.

In this embodiment, the amorphous oxide semiconductor film 491 is processed into the amorphous oxide semiconductor film 492 having an island shape in a photolithography process.

Note that the etching of the amorphous oxide semiconductor film 491 may be dry etching, wet etching, or both dry etching and wet etching. As an etchant used for wet etching of the amorphous oxide semiconductor film 491, for example, a mixed solution of phosphoric acid, acetic acid, and nitric acid, or the like can be used. In addition, ITO-07N (produced by KANTO CHEMICAL CO., INC.) may be used.

Next, a gate insulating film 442 covering the amorphous oxide semiconductor film 492 is formed (see FIG. 5B).

To improve the coverage with the gate insulating film 442 over the amorphous oxide semiconductor film 492, the above-described planarization treatment may be performed also on a surface of the amorphous oxide semiconductor film 492. It is preferable that the planarity of the surface of the amorphous oxide semiconductor film 492 be high particularly in the case where a thin insulating film is used as the gate insulating film 442.

The gate insulating film 442 can have a thickness of 1 nm to 100 nm and can be formed by a sputtering method, an MBE method, a CVD method, a pulse laser deposition method, an ALD method, or the like as appropriate. The gate insulating film 442 may be formed using a sputtering apparatus which performs film formation with surfaces of a plurality of substrates set substantially perpendicular to a surface of a sputtering target, which is so called a columnar plasma (CP) sputtering system.

The gate insulating film 442 can be formed using a silicon oxide film, a gallium oxide film, an aluminum oxide film, a silicon nitride film, a silicon oxynitride film, an aluminum oxynitride film, or a silicon nitride oxide film. A portion of the gate insulating film 442 which is in contact with the amorphous oxide semiconductor film 492 preferably contains oxygen. In particular, the gate insulating film 442 preferably contains a large amount of oxygen which exceeds at least the stoichiometric ratio in (a bulk of) the film. For example, in the case where a silicon oxide film is used as the gate insulating film 442, the composition formula is $SiO_{2+\alpha}$ ($\alpha$>0). In this embodiment, a silicon oxide film of $SiO_{2+\alpha}$ ($\alpha$>0) is used as the gate insulating film 442. By using such a silicon oxide film as the gate insulating film 442, oxygen can be supplied to the amorphous oxide semiconductor film 492, leading to favorable characteristics. Further, the gate insulating film 442 is preferably formed in consideration of the size of a transistor to be formed and the step coverage with the gate insulating film 442.

When the gate insulating film 442 is formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide, gate leakage current can be reduced. Further, the gate insulating film 442 may have either a single-layer structure or a stacked-layer structure.

Next, oxygen 431 (including at least one of an oxygen radical, an oxygen atom, and an oxygen ion) is added to the amorphous oxide semiconductor film 492; thus, oxygen is supplied to the amorphous oxide semiconductor film 492. Oxygen can be added by an ion implantation method, an ion doping method, a plasma immersion ion implantation method, plasma treatment, or the like.

The step of adding oxygen in the process of manufacturing the transistor 440 in this embodiment is performed after formation of the amorphous oxide semiconductor film 491 before formation of an aluminum oxide film as the insulating film 407. The above-described heat treatment for dehydration or dehydrogenation is performed before the step of adding oxygen. In the step of adding oxygen, oxygen may be directly added to the amorphous oxide semiconductor film or added to the amorphous oxide semiconductor film through another film such as the gate insulating film or an insulating film. An ion implantation method, an ion doping method, a plasma immersion ion implantation method, or the like may be employed in the case where oxygen is added to the amorphous oxide semiconductor film through another film, whereas plasma treatment or the like can also be employed in the case where oxygen is directly added to the amorphous oxide semiconductor film in an exposed state (e.g., after formation of the amorphous oxide semiconductor film 491, or after formation of the amorphous oxide semiconductor film 492).

In this embodiment, the oxygen 431 is added to the amorphous oxide semiconductor film 492 through the gate insulating film 442 by an ion implantation method. By the addition of the oxygen 431, the amorphous oxide semiconductor film 492 is changed into an amorphous oxide semiconductor film 443 having a region containing oxygen in excess of the stoichiometric ratio in the oxide semiconductor in a crystalline state (see FIG. 5C).

Note that the addition of the oxygen 431 can cause the amorphous oxide semiconductor film 443 to have a more uniform amorphous state.

For example, it is preferable that the concentration of oxygen in the amorphous oxide semiconductor film 443, which is added in the step of adding the oxygen 431, is greater than or equal to $1\times10^{18}/cm^3$ and less than or equal to $3\times10^{21}/cm^3$. Such an oxygen excess region exists in at least part of the amorphous oxide semiconductor film 443 (including its interface). Thus, with the addition of the oxygen 431, oxygen is contained in at least one of the interface between the insulating film 436 and the amorphous oxide semiconductor film 443, the inside of the amorphous oxide semiconductor film 443, and the interface between the amorphous oxide semiconductor film 443 and the gate insulating film 442.

The amorphous oxide semiconductor film 443 has a region containing oxygen in excess of the stoichiometric ratio in the oxide semiconductor in a crystalline state. In that case, the oxygen content is higher than that in the stoichiometric composition of the oxide semiconductor. Alternatively, the oxygen content is higher than that in the oxide semiconductor in a single crystal state. In some cases, oxygen exists between lattices of the oxide semiconductor. The composition of such an oxide semiconductor can be expressed by $InGaZn_mO_{m+3x}$ (x>1). For example, supposing that m=1, the value of 1+3x in $InGaZnO_{1+3x}$ (x>1) exceeds 4 in the case where excess oxygen is contained.

An oxygen vacancy in the amorphous oxide semiconductor film 443 can be filled with the oxygen 431 supplied to the amorphous oxide semiconductor film 443.

A film containing much oxygen may be used as the insulating film which is in contact with the amorphous oxide semiconductor film and oxygen may be directly added to the amorphous oxide semiconductor film; in this manner, a plurality of oxygen supply methods can be performed. Such a film containing much oxygen is not necessarily used as the insulating film which is in contact with the amorphous oxide semiconductor film in the case where the oxygen is directly added to the amorphous oxide semiconductor film as in this embodiment.

Next, the gate electrode layer 401 is formed over the gate insulating film 442. The gate electrode layer 401 can be formed using a metal material such as molybdenum, titanium, tantalum, tungsten, aluminum, copper, chromium, neodymium, or scandium, or an alloy material which contains any of these materials as a main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have either a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 442, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to be positive when used as the gate electrode layer. Accordingly, a so-called normally off switching element can be provided.

Sidewall insulating layers 412a and 412b are formed on the side surface of the gate electrode layer 401, and the gate insulating film 402 is formed. The sidewall insulating layers 412a and 412b may be formed on the side surface of the gate electrode layer 401 in a self-aligned manner by forming an insulating film to cover the gate electrode layer 401 and then processing the insulating film by anisotropic etching by a reactive ion etching (RIE) method. There is no particular limitation on the insulating film; for example, a silicon oxide film with favorable step coverage, which is formed by reacting tetraethyl orthosilicate (TEOS), silane, or the like with oxygen, nitrous oxide, or the like, can be used. The insulating film can be formed by a thermal CVD method, a plasma CVD method, an atmospheric pressure CVD method, a bias ECRCVD method, a sputtering method, or the like. A silicon oxide film formed by a low temperature oxidation (LTO) method may also be used.

The gate insulating film 402 can be formed by etching the gate insulating film 442 with use of the gate electrode layer 401 and the sidewall insulating layers 412a and 412b as a mask.

In this embodiment, in etching the insulating film, the insulating film over the gate electrode layer 401 is removed to expose the gate electrode layer 401; alternatively, the sidewall insulating layers 412a and 412b may be formed to have such a shape to leave the insulating film over the gate electrode layer 401. Further, a protective film may be formed over the gate electrode layer 401 in a later step. By protecting the gate electrode layer 401 in such a manner, film reduction of the gate electrode layer in the etching process can be prevented. Various etching methods such as a dry etching method and a wet etching method may be used for the etching.

Next, a conductive film to be the source and drain electrode layers (including a wiring formed using the same layer as the source and drain electrode layers) is formed over part of the sidewall insulating layers 412a and 412b and the amorphous oxide semiconductor film 443. The conductive film is formed using a material which can withstand heat treatment in a later step. As the conductive film used for forming the source electrode layer and the drain electrode layer, it is possible to use, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over or/and under a metal film such as an Al film or a Cu film. Further alternatively, the conductive film used for forming the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

Through a photolithography process, a resist mask is formed over the conductive film, the source electrode layer 405a and the drain electrode layer 405b are formed by selective etching, and then, the resist mask is removed (see FIG. 5D).

Next, the insulating film 407 is formed over the gate electrode layer 401, the sidewall insulating layers 412a and 412b, the source electrode layer 405a, and the drain electrode layer 405b (see FIG. 5E). The insulating film 407 may have a single-layer structure or a stacked-layer structure, and includes an aluminum oxide film.

The thickness of the aluminum oxide film included in the insulating film 407 is greater than or equal to 30 nm and less than or equal to 500 nm, preferably greater than or equal to 50 nm and less than or equal to 200 nm. The insulating film 407 can be formed as appropriate using a sputtering method or the like by which impurities such as water or hydrogen can be prevented from entering the insulating film 407. When hydrogen is contained in the insulating film 407, entry of the hydrogen to the oxide semiconductor film, or extraction of oxygen from the oxide semiconductor film by hydrogen may occur, in which case the oxide semiconductor film may have lower resistance (become n-type), so that a parasitic channel may be formed. Therefore, it is important that a formation method in which hydrogen is not used be employed so that the insulating film 407 contains hydrogen as little as possible.

The aluminum oxide film preferably has a region containing oxygen in excess of the stoichiometric ratio in the aluminum oxide in a crystalline state. In that case, the oxygen content is higher than that in the stoichiometric composition of the aluminum oxide. Alternatively, the oxygen content is higher than that in the aluminum oxide in a single crystal state. In some cases, oxygen exists between lattices of aluminum oxide. Supposing that the composition is expressed by $AlO_x$ (x>0), an aluminum oxide film having an oxygen excess region where x exceeds 3/2 is preferably used. Such an oxygen excess region exists at least in part of the aluminum oxide film (including its interface).

In this embodiment, an aluminum oxide film with a thickness of 100 nm is formed as the insulating film 407 by a sputtering method. The formation of the aluminum oxide film by a sputtering method can be performed in a rare gas (typically argon) atmosphere, an oxygen atmosphere, or a mixed atmosphere of a rare gas and oxygen.

As in the case of forming the oxide semiconductor film, an entrapment vacuum pump (e.g., a cryopump) is preferably used in order to remove moisture remaining in a deposition chamber used for forming the insulating film 407. When the insulating film 407 is formed in the deposition chamber evacuated using a cryopump, the concentration of impurities in the insulating film 407 can be reduced. A turbo molecular pump provided with a cold trap may be used as an evacuation unit for removing moisture remaining in the deposition chamber used for forming the insulating film 407.

It is preferable that a high-purity gas in which an impurity such as hydrogen, water, a hydroxyl group, or hydride is reduced be used as the sputtering gas for the formation of the insulating film 407.

Figure 10B:
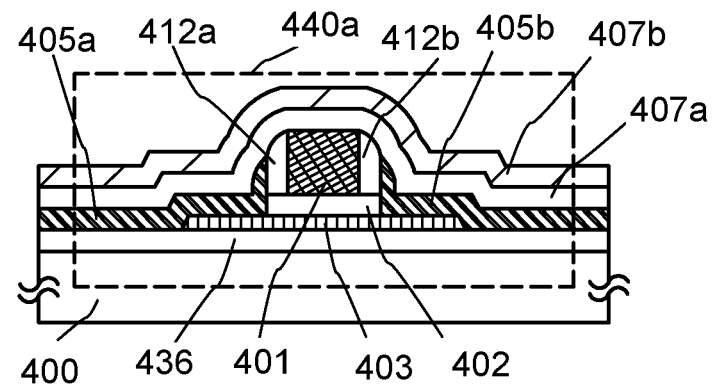

The insulating film 407 can have a stacked-layer structure including the aluminum oxide film and an inorganic insulating film such as, typically, a silicon oxide film, a silicon oxynitride film, an aluminum oxynitride film, or a gallium oxide film. FIG. 10B illustrates a transistor 440a as an example of the transistor 440 in which the insulating film 407 has a stacked-layer structure of insulating films 407a and 407b.

As illustrated in FIG. 10B, the insulating film 407a is formed over the gate electrode layer 401, the sidewall insulating layers 412a and 412b, the source electrode layer 405a, and the drain electrode layer 405b, and the insulating film 407b is formed over the insulating film 407a. For example, in this embodiment, a silicon oxide film which has a region containing oxygen in excess of the stoichiometric ratio in the silicon oxide in a crystalline state is used as the insulating film 407a, and an aluminum oxide film is used as the insulating film 407b.

Next, heat treatment is performed on the amorphous oxide semiconductor film 443 to crystallize at least part of the amorphous oxide semiconductor film 443, so that the crystalline oxide semiconductor film 403 which includes a crystal having a c-axis substantially perpendicular to a surface is formed.

The aluminum oxide film provided as the insulating film 407 over the amorphous oxide semiconductor film 443 has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

Therefore, the crystalline oxide semiconductor film 403 has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film 403 and prevent excess oxygen from being released from the crystalline oxide semiconductor film 403.

If oxygen is eliminated from the crystalline oxide semiconductor film 403, an oxygen vacancy is formed therein. In an oxide semiconductor with no excess oxygen, such an oxygen vacancy cannot be filled with another oxygen. In contrast, since the crystalline oxide semiconductor film 403 according to one embodiment of the disclosed invention is a film containing excess oxygen (in this embodiment, a CAAC-OS film containing excess oxygen), the excess oxygen (which is preferably in excess of the stoichiometric ratio) contained in the film can act to fill an oxygen vacancy in the crystalline oxide semiconductor film 403 immediately.

Accordingly, with the use of the crystalline oxide semiconductor film 403 for the transistor 440, it is possible to reduce a variation in the threshold voltage $V_{th}$ of the transistor 440 and a shift of the threshold voltage ($\Delta V_{th}$) due to an oxygen vacancy.

The heat treatment for crystallizing at least part of the amorphous oxide semiconductor film 443 is performed at a temperature higher than or equal to 300° C. and lower than or equal to 700° C., preferably higher than or equal to 450° C. and lower than or equal to 650° C., more preferably higher than or equal to 500° C., even more preferably higher than or equal to 550° C.

For example, the substrate is introduced into an electric furnace which is one of heat treatment apparatuses, and heat treatment is performed on the oxide semiconductor film at 450° C. for 1 hour in an oxygen atmosphere.

From the highly purified crystalline oxide semiconductor film 403 whose oxygen vacancies have been filled, impurities such as hydrogen and water have been removed sufficiently, and the concentration of hydrogen in the crystalline oxide semiconductor film 403 is $5 \times 10^{19}/cm^3$ or less, preferably $5 \times 10^{18}/cm^3$ or less.

The number of carriers in the crystalline oxide semiconductor film 403 is very small (close to zero), and the carrier concentration is lower than $1 \times 10^{14}/cm^3$, preferably lower than $1 \times 10^{12}/cm^3$, more preferably lower than $1 \times 10^{11}/cm^3$.

Through the above process, the transistor 440 is formed (see FIG. 5F). The transistor 440 includes the highly purified crystalline oxide semiconductor film containing excess oxygen with which an oxygen vacancy is filled. Therefore, the transistor 440 has less change in electrical characteristics and thus is electrically stable.

In the transistor 440 formed according to this embodiment using the highly purified crystalline oxide semiconductor film 403 containing excess oxygen with which an oxygen vacancy is filled, the value of a current in the off state (the value of an off-state current) per unit channel width (1 μm) can be reduced so as to be less than or equal to 100 zA/μm (1 zA (zeptoampere) is $1 \times 10^{-21}$ A), preferably less than or equal to 10 zA/μm, more preferably less than or equal to 1 zA/μm, further preferably less than or equal to 100 yA/μm at room temperature.

As described above, a semiconductor device formed using an oxide semiconductor, which has stable electrical characteristics, can be provided. Accordingly, a semiconductor device with high reliability can be provided.

Embodiment 6

In this embodiment, another embodiment of a semiconductor device and a method for manufacturing the semiconductor device will be described with reference to FIGS. 6A to 6E. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

Described in this embodiment is an example in which addition of oxygen to an amorphous oxide semiconductor film is performed through a gate insulating film after formation of a gate electrode layer in a method for manufacturing a semiconductor device according to one embodiment of the disclosed invention.

FIGS. 6A to 6E illustrate an example of a method for manufacturing the transistor 440 of this embodiment.

First, the insulating film 436 is formed over the substrate 400. Then, the amorphous oxide semiconductor film 492 is formed over the insulating film 436. The gate insulating film 442 is formed to cover the amorphous oxide semiconductor film 492.

Figure 6A:
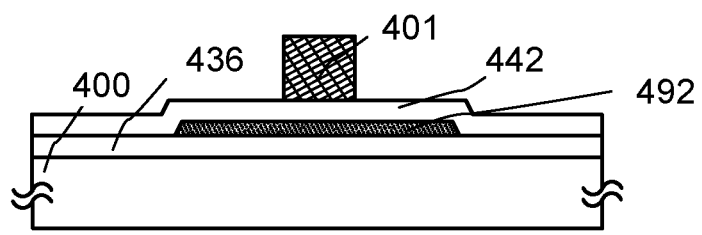
FIGS. 6A to 6E illustrate one embodiment of a semiconductor device and a method for manufacturing the semiconductor device.
Figure 6B:
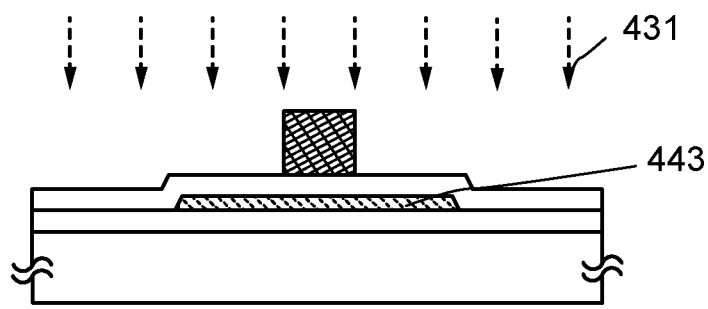

Next, the gate electrode layer 401 is formed over the gate insulating film 442 (see FIG. 6A).

Further, heat treatment may be performed on the amorphous oxide semiconductor film 492 in order to remove excess hydrogen (including water and a hydroxyl group) (to perform dehydration or dehydrogenation).

Next, oxygen 431 (including at least one of an oxygen radical, an oxygen atom, and an oxygen ion) is added to the amorphous oxide semiconductor film 492; thus, oxygen is supplied to the amorphous oxide semiconductor film 492.

In this embodiment, the oxygen 431 is added to the amorphous oxide semiconductor film 492 through the gate insulating film 442 by an ion implantation method after the gate electrode layer 401 is formed. By the addition of the oxygen 431, the amorphous oxide semiconductor film 492 is changed into the amorphous oxide semiconductor film 443 having a region containing oxygen in excess of the stoichiometric ratio in the oxide semiconductor in a crystalline state (see FIG. 6B).

Although there is a case where the oxygen 431 is not directly added to a region of the amorphous oxide semiconductor film 492 which overlaps with the gate electrode layer 401 because the gate electrode layer 401 serves as a mask, oxygen added to the amorphous oxide semiconductor film 443 can be diffused also to the region of the amorphous oxide semiconductor film 443 which overlaps with the gate electrode layer 401 by heat treatment for crystallizing the amorphous oxide semiconductor film 443 because the width of the gate electrode layer 401 is small (for example, in the submicron order).

An oxygen vacancy in the amorphous oxide semiconductor film 443 can be filled with the oxygen 431 supplied to the amorphous oxide semiconductor film 443.

The sidewall insulating layers 412a and 412b are formed on the side surface of the gate electrode layer 401, and the gate insulating film 402 is formed.

The gate insulating film 402 can be formed by etching the gate insulating film 442 with use of the gate electrode layer 401 and the sidewall insulating layers 412a and 412b as a mask.

Next, a conductive film to be the source and drain electrode layers (including a wiring formed using the same layer as the source and drain electrode layers) is formed over part of the sidewall insulating layers 412a and 412b and the amorphous oxide semiconductor film 443.

Figure 6C:
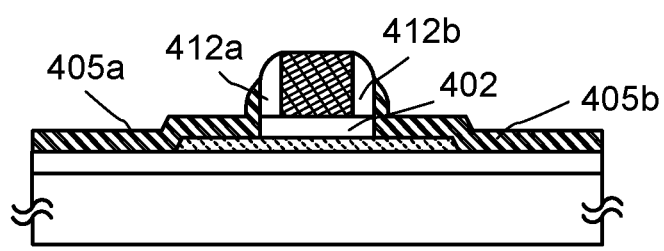

Through a photolithography process, a resist mask is formed over the conductive film, the source electrode layer 405a and the drain electrode layer 405b are formed by selective etching, and then, the resist mask is removed (see FIG. 6C).

Figure 6D:
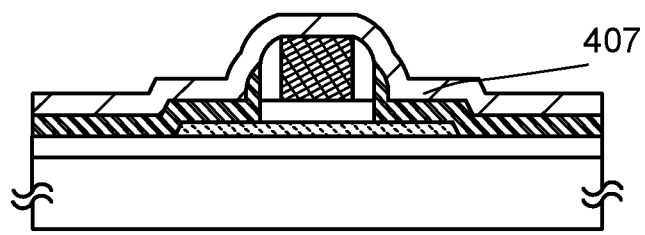

Next, the insulating film 407 is formed over the gate electrode layer 401, the sidewall insulating layers 412a and 412b, the source electrode layer 405a, and the drain electrode layer 405b (see FIG. 6D). The insulating film 407 may have a single-layer structure or a stacked-layer structure, and includes an aluminum oxide film.

In this embodiment, an aluminum oxide film with a thickness of 100 nm is formed as the insulating film 407 by a sputtering method.

Next, heat treatment is performed on the amorphous oxide semiconductor film 443 to crystallize at least part of the amorphous oxide semiconductor film 443, so that the crystalline oxide semiconductor film 403 is formed. Also with this heat treatment, oxygen is diffused throughout the amorphous oxide semiconductor film 443, so that oxygen is supplied throughout the film.

In this embodiment, the crystalline oxide semiconductor film 403 including a crystal having a c-axis substantially perpendicular to a surface is formed as the crystalline oxide semiconductor film 403.

The aluminum oxide film provided as the insulating film 407 over the amorphous oxide semiconductor film 443 has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

Therefore, the crystalline oxide semiconductor film 403 has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film 403 and prevent excess oxygen from being released from the crystalline oxide semiconductor film 403.

If oxygen is eliminated from the crystalline oxide semiconductor film 403, an oxygen vacancy is formed therein. In an oxide semiconductor with no excess oxygen, such an oxygen vacancy cannot be filled with another oxygen. In contrast, since the crystalline oxide semiconductor film 403 according to one embodiment of the disclosed invention is a film containing excess oxygen (in this embodiment, a CAAC-OS film containing excess oxygen), the excess oxygen (which is preferably in excess of the stoichiometric ratio) contained in the film can act to fill an oxygen vacancy in the crystalline oxide semiconductor film 403 immediately.

Accordingly, with the use of the crystalline oxide semiconductor film 403 for the transistor 440, it is possible to reduce a variation in the threshold voltage $V_{th}$ of the transistor and a shift of the threshold voltage ($\Delta V_{th}$) due to an oxygen vacancy.

Figure 6E:
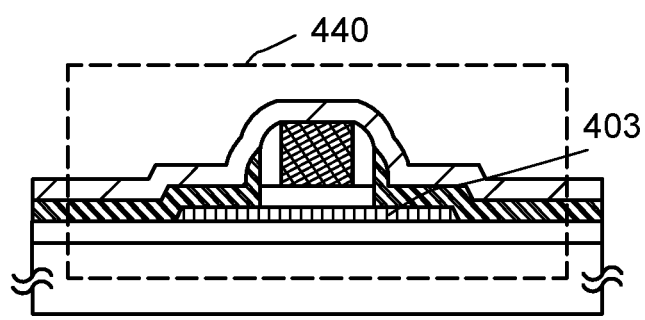

Through the above process, the transistor 440 is formed (see FIG. 6E). The transistor 440 includes the highly purified crystalline oxide semiconductor film containing excess oxygen with which an oxygen vacancy is filled. Therefore, the transistor 440 has less change in electrical characteristics and thus is electrically stable.

In the transistor 440 formed according to this embodiment using the highly purified crystalline oxide semiconductor film 403 containing excess oxygen with which an oxygen vacancy is filled, the value of a current in the off state (the value of an off-state current) per unit channel width (1 μm) can be reduced so as to be less than or equal to 100 zA/μm (1 zA (zeptoampere) is $1\times10^{-21}$ A), preferably less than or equal to 10 zA/μm, more preferably less than or equal to 1 zA/μm, further preferably less than or equal to 100 yA/μm at room temperature.

As described above, a semiconductor device formed using an oxide semiconductor, which has stable electrical characteristics, can be provided. Accordingly, a semiconductor device with high reliability can be provided.

Embodiment 7

In this embodiment, another embodiment of a semiconductor device and a method for manufacturing the semiconductor device will be described with reference to FIGS. 7A to 7E. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

Described in this embodiment is an example in which addition of oxygen to an amorphous oxide semiconductor film is performed through an insulating film provided over a transistor in a method for manufacturing a semiconductor device according to one embodiment of the disclosed invention.

FIGS. 7A to 7E illustrate an example of a method for manufacturing a transistor 420 of this embodiment.

First, the insulating film 436 is formed over the substrate 400. Then, the amorphous oxide semiconductor film 492 is formed over the insulating film 436. The gate insulating film 442 is formed to cover the amorphous oxide semiconductor film 492.

Figure 7A:
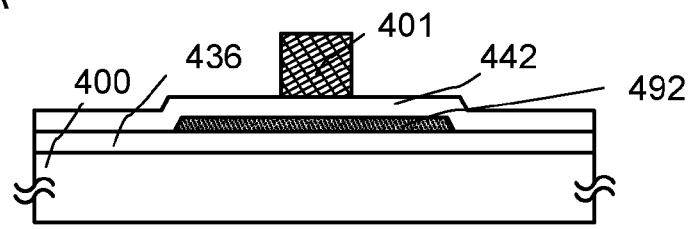
FIGS. 7A to 7E illustrate one embodiment of a semiconductor device and a method for manufacturing the semiconductor device.

Next, the gate electrode layer 401 is formed over the gate insulating film 442 (see FIG. 7A).

In this embodiment, an example in which a sidewall insulating layer is not formed and the gate insulating film 442 is not processed into an island shape and is used as a continuous film is described.

Further, heat treatment may be performed on the amorphous oxide semiconductor film 492 in order to remove excess hydrogen (including water and a hydroxyl group) (to perform dehydration or dehydrogenation).

Figure 7B:
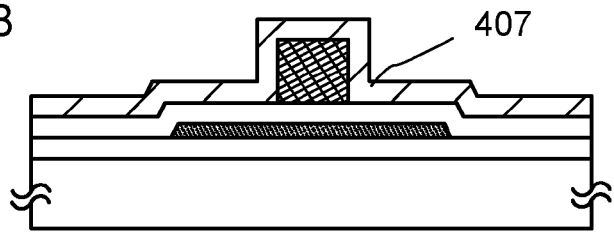
Figure 7C:
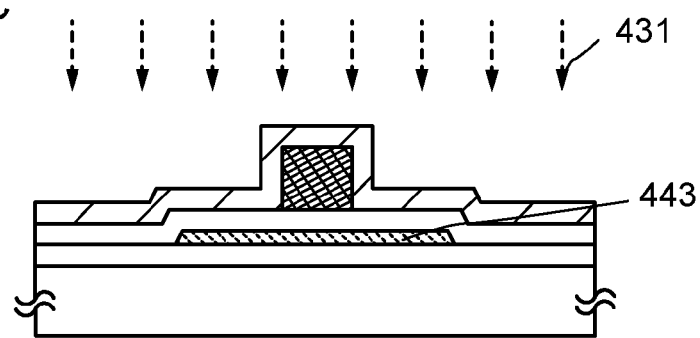

Next, the insulating film 407 is formed over the gate insulating film 442 and the gate electrode layer 401 (see FIG. 7B). The insulating film 407 may have a single-layer structure or a stacked-layer structure, and includes an aluminum oxide film.

In this embodiment, an aluminum oxide film with a thickness of 100 nm is formed as the insulating film 407 by a sputtering method.

Next, oxygen 431 (including at least one of an oxygen radical, an oxygen atom, and an oxygen ion) is added to the amorphous oxide semiconductor film 492; thus, oxygen is supplied to the amorphous oxide semiconductor film 492.

In this embodiment, the oxygen 431 is added to the amorphous oxide semiconductor film 492 through the gate insulating film 442 and the insulating film 407 by an ion implantation method after the insulating film 407 is formed. By the addition of the oxygen 431, the amorphous oxide semiconductor film 492 is changed into an amorphous oxide semiconductor film 443 having a region containing oxygen in excess of the stoichiometric ratio in the oxide semiconductor in a crystalline state (see FIG. 7C).

Although there is a case where the oxygen 431 is not directly added to a region of the amorphous oxide semiconductor film 492 which overlaps with the gate electrode layer 401 because the gate electrode layer 401 serves as a mask, oxygen added to the amorphous oxide semiconductor film 443 can be diffused also to the region of the amorphous oxide semiconductor film 443 which overlaps with the gate electrode layer 401 by heat treatment for crystallizing the amorphous oxide semiconductor film 443 because the width of the gate electrode layer 401 is small (for example, 0.35 μm).

An oxygen vacancy in the amorphous oxide semiconductor film 443 can be filled with the oxygen 431 supplied to the amorphous oxide semiconductor film 443.

Figure 7D:
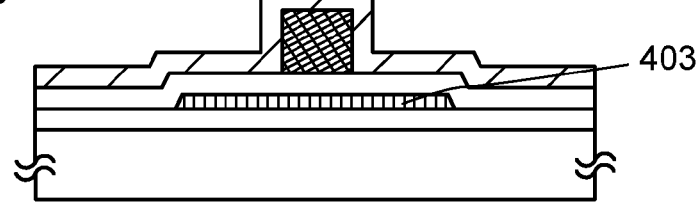

Next, heat treatment is performed on the amorphous oxide semiconductor film 443 to crystallize at least part of the amorphous oxide semiconductor film 443, so that the crystalline oxide semiconductor film 403 is formed (see FIG. 7D). Also with this heat treatment, oxygen is diffused throughout the amorphous oxide semiconductor film 443, so that oxygen is supplied throughout the film.

In this embodiment, the crystalline oxide semiconductor film 403 including a crystal having a c-axis substantially perpendicular to a surface is formed as the crystalline oxide semiconductor film 403.

The aluminum oxide film provided as the insulating film 407 over the amorphous oxide semiconductor film 443 has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

Therefore, the crystalline oxide semiconductor film 403 has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film 403 and prevent excess oxygen from being released from the crystalline oxide semiconductor film 403.

If oxygen is eliminated from the crystalline oxide semiconductor film 403, an oxygen vacancy is formed therein. In an oxide semiconductor with no excess oxygen, such an oxygen vacancy cannot be filled with another oxygen. In contrast, since the crystalline oxide semiconductor film 403 according to one embodiment of the disclosed invention is a film containing excess oxygen (in this embodiment, a CAAC-OS film containing excess oxygen), the excess oxygen (which is preferably in excess of the stoichiometric ratio) contained in the film can act to fill an oxygen vacancy in the crystalline oxide semiconductor film 403 immediately.

Accordingly, with the use of the crystalline oxide semiconductor film 403 for the transistor 420, it is possible to reduce a variation in the threshold voltage $V_{th}$ of the transistor and a shift of the threshold voltage ($\Delta V_{th}$) due to an oxygen vacancy.

In addition, a planarization insulating film may be formed in order to reduce surface unevenness due to the transistor. As the planarization insulating film, an organic material such as a polyimide-, acrylic-, or benzocyclobutene-based resin can be used. Other than such organic materials, it is also possible to use a low dielectric constant material (low-k material) or the like. Note that the planarization insulating film may be formed by stacking a plurality of insulating films formed using any of these materials.

In this embodiment, a planarization insulating film 415 is formed over the insulating film 407. Further, openings reaching the crystalline oxide semiconductor film 403 are formed in the gate insulating film 442, the insulating film 407, and the planarization insulating film 415, and the source electrode layer 405a and the drain electrode layer 405b are formed so as to be electrically connected to the crystalline oxide semiconductor film 403 through the openings.

Figure 7E:
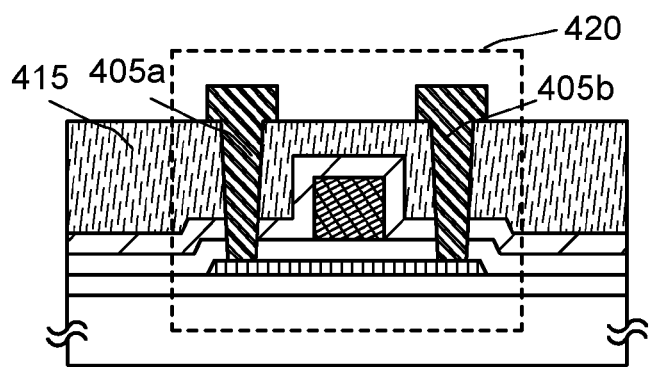

Through the above process, the transistor 420 is formed (see FIG. 7E). The transistor 420 includes the highly purified crystalline oxide semiconductor film containing excess oxygen with which an oxygen vacancy is filled. Therefore, the transistor 420 has less change in electrical characteristics and thus is electrically stable.

Figure 10C:
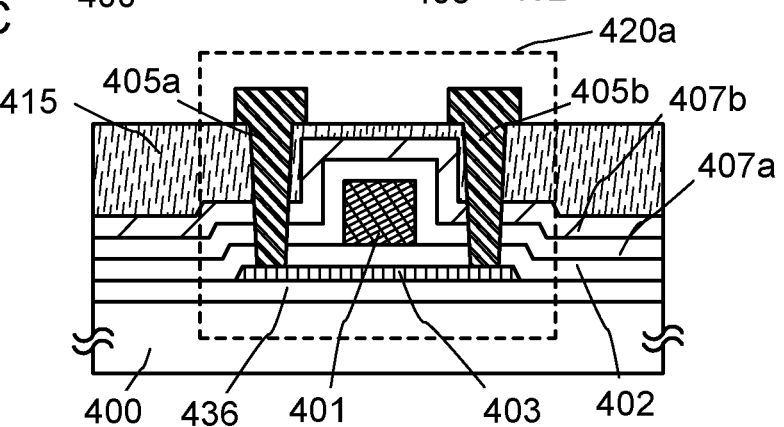

The insulating film 407 can have a stacked-layer structure including the aluminum oxide film and an inorganic insulating film such as, typically, a silicon oxide film, a silicon oxynitride film, an aluminum oxynitride film, or a gallium oxide film. FIG. 10C illustrates a transistor 420a as an example of the transistor 420 in which the insulating film 407 has a stacked-layer structure of insulating films 407a and 407b.

As illustrated in FIG. 10C, the insulating film 407a is formed over the gate insulating film 402 and the gate electrode layer 401, and the insulating film 407b is formed over the insulating film 407a. For example, in this embodiment, a silicon oxide film which has a region containing oxygen in excess of the stoichiometric ratio in the silicon oxide in a crystalline state is used as the insulating film 407a, and an aluminum oxide film is used as the insulating film 407b.

In the case the insulating film 407 has the stacked-layer structure of the insulating films 407a and 407b, the addition of oxygen to the amorphous oxide semiconductor film 492 can be performed through the stacked insulating films 407a and 407b.

In the transistor 420 formed according to this embodiment using the purified crystalline oxide semiconductor film 403 containing excess oxygen with which an oxygen vacancy is filled, the value of a current in the off state (the value of an off-state current) per unit channel width (1 μm) can be reduced so as to be less than or equal to 100 zA/μm (1 zA (zeptoampere) is $1 \times 10^{-21}$ A), preferably less than or equal to 10 zA/μm, more preferably less than or equal to 1 zA/μm, further preferably less than or equal to 100 yA/μm at room temperature.

As described above, a semiconductor device formed using an oxide semiconductor, which has stable electrical characteristics, can be provided. Accordingly, a semiconductor device with high reliability can be provided.

Embodiment 8

In this embodiment, another embodiment of a semiconductor device and a method for manufacturing the semiconductor device will be described with reference to FIGS. 8A to 8F.

The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

Described in this embodiment is an example of a method for manufacturing a transistor in which the structure of connection between a source and drain electrode layers and a crystalline oxide semiconductor film is different from that in Embodiment 5.

FIGS. 8A to 8F illustrate an example of a method for manufacturing a transistor 450 of this embodiment.

First, the insulating film 436 is formed over the substrate 400.

Next, a conductive film to be the source and drain electrode layers (including a wiring formed using the same layer as the source and drain electrode layers) is formed over the insulating film 436.

Figure 8A:
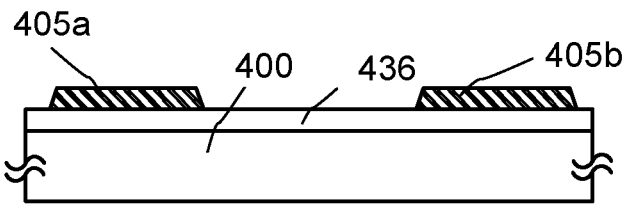
FIGS. 8A to 8F illustrate one embodiment of a semiconductor device and a method for manufacturing the semiconductor device.

Through a photolithography process, a resist mask is formed over the conductive film, the source electrode layer 405a and the drain electrode layer 405b are formed by selective etching, and then, the resist mask is removed (see FIG. 8A).

Figure 8B:
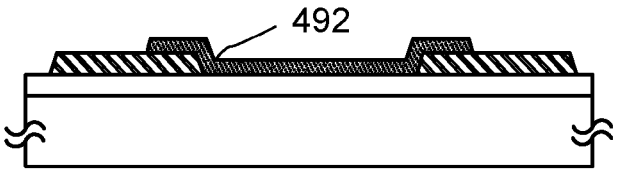
Figure 8C:
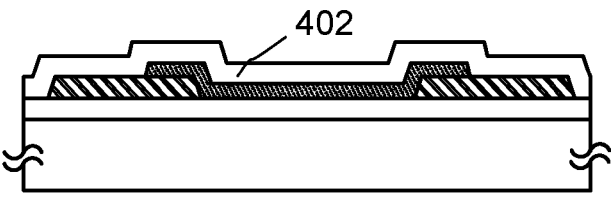
Figure 8D:
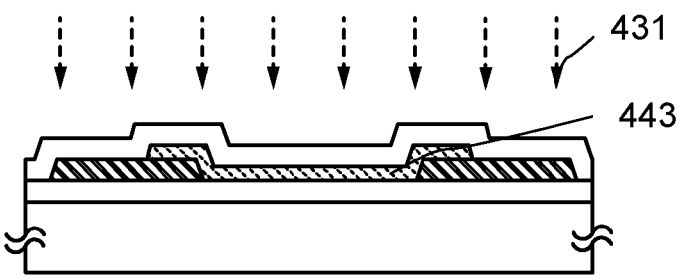

Then, the amorphous oxide semiconductor film 492 is formed over the insulating film 436, the source electrode layer 405a, and the drain electrode layer 405b (see FIG. 8B). The gate insulating film 402 is formed to cover the amorphous oxide semiconductor film 492 (see FIG. 8C).

Further, heat treatment may be performed on the amorphous oxide semiconductor film 492 in order to remove excess hydrogen (including water and a hydroxyl group) (to perform dehydration or dehydrogenation).

Next, oxygen 431 (including at least one of an oxygen radical, an oxygen atom, and an oxygen ion) is added to the amorphous oxide semiconductor film 492; thus, oxygen is supplied to the amorphous oxide semiconductor film 492.

In this embodiment, the oxygen 431 is added to the amorphous oxide semiconductor film 492 through the gate insulating film 402 by an ion implantation method. By the addition of the oxygen 431, the amorphous oxide semiconductor film 492 is changed into an amorphous oxide semiconductor film 443 having a region containing oxygen in excess of the stoichiometric ratio in the oxide semiconductor in a crystalline state (see FIG. 8D).

An oxygen vacancy in the amorphous oxide semiconductor film 443 can be filled with the oxygen 431 supplied to the amorphous oxide semiconductor film 443.

Next, the gate electrode layer 401 is formed over the gate insulating film 402.

In the example described in this embodiment, a sidewall insulating layer is not provided on the side surface of the gate electrode layer 401; however, a sidewall insulating layer may be provided and the gate insulating film 402 may be processed into an island shape as described in Embodiment 5.

Figure 8E:
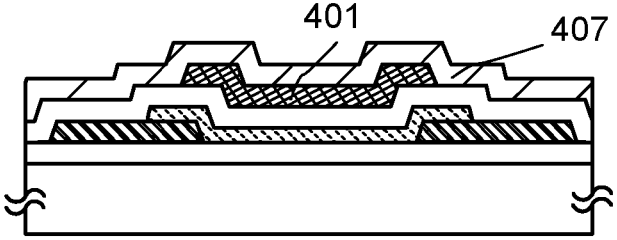

Next, the insulating film 407 is formed over the gate insulating film 402 and the gate electrode layer 401 (see FIG. 8E). The insulating film 407 may have a single-layer structure or a stacked-layer structure, and includes an aluminum oxide film.

In this embodiment, an aluminum oxide film with a thickness of 100 nm is formed as the insulating film 407 by a sputtering method.

Next, heat treatment is performed on the amorphous oxide semiconductor film 443 to crystallize at least part of the amorphous oxide semiconductor film 443, so that the crystalline oxide semiconductor film 403 is formed.

In this embodiment, the crystalline oxide semiconductor film 403 including a crystal having a c-axis substantially perpendicular to a surface is formed as the crystalline oxide semiconductor film 403.

The aluminum oxide film provided as the insulating film 407 over the amorphous oxide semiconductor film 443 has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film (the amorphous oxide semiconductor film 443, the crystalline oxide semiconductor film 403) and release of oxygen, which is a main component material of the oxide semiconductor, from the oxide semiconductor film (the amorphous oxide semiconductor film 443, the crystalline oxide semiconductor film 403).

Since the heat treatment for crystallizing the amorphous oxide semiconductor film 443 is performed in the state where the amorphous oxide semiconductor film 443 is covered with the aluminum oxide film provided as the insulating film 407, oxygen can be prevented from being released from the amorphous oxide semiconductor film 443 by the heat treatment. Thus, the resulting crystalline oxide semiconductor film 403 can maintain the amount of oxygen contained in the amorphous oxide semiconductor film 443, and therefore has a region containing oxygen in excess of the stoichiometric ratio in the oxide semiconductor in a crystalline state.

Therefore, the crystalline oxide semiconductor film 403 has high purity and has the region containing oxygen in excess of the stoichiometric ratio in the oxide semiconductor in a crystalline state because the aluminum oxide film can prevent impurities such as hydrogen and moisture from entering the crystalline oxide semiconductor film 403 and prevent excess oxygen from being released from the crystalline oxide semiconductor film 403.

If oxygen is eliminated from the crystalline oxide semiconductor film 403, an oxygen vacancy is formed therein. In an oxide semiconductor with no excess oxygen, such an oxygen vacancy cannot be filled with another oxygen. In contrast, since the crystalline oxide semiconductor film 403 according to one embodiment of the disclosed invention is a film containing excess oxygen (in this embodiment, a CAAC-OS film containing excess oxygen), the excess oxygen (which is preferably in excess of the stoichiometric ratio) contained in the film can act to fill an oxygen vacancy in the crystalline oxide semiconductor film 403 immediately.

Accordingly, with the use of the crystalline oxide semiconductor film 403 for the transistor 450, it is possible to reduce a variation in the threshold voltage $V_{th}$ of the transistor 450 and a shift of the threshold voltage ($\Delta V_{th}$) due to an oxygen vacancy.

Figure 10D:
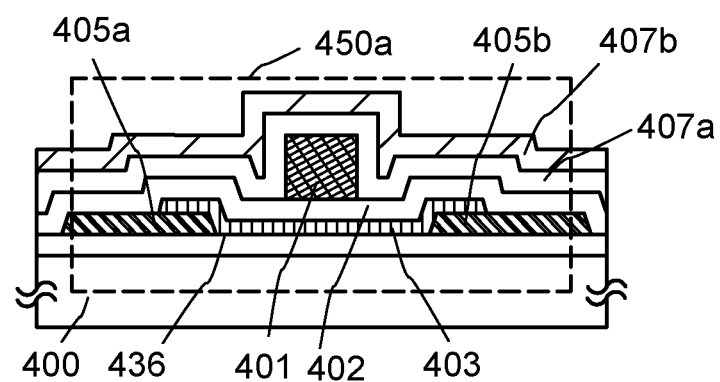

The insulating film 407 can have a stacked-layer structure including the aluminum oxide film and an inorganic insulating film such as, typically, a silicon oxide film, a silicon oxynitride film, an aluminum oxynitride film, or a gallium oxide film. FIG. 10D illustrates a transistor 450a as an example of the transistor 450 in which the insulating film 407 has a stacked-layer structure of insulating films 407a and 407b.

As illustrated in FIG. 10D, the insulating film 407a is formed over the gate insulating film 402 and the gate electrode layer 401, and the insulating film 407b is formed over the insulating film 407a. For example, in this embodiment, a silicon oxide film which has a region containing oxygen in excess of the stoichiometric ratio in the silicon oxide in a crystalline state is used as the insulating film 407a, and an aluminum oxide film is used as the insulating film 407b.

Figure 8F:
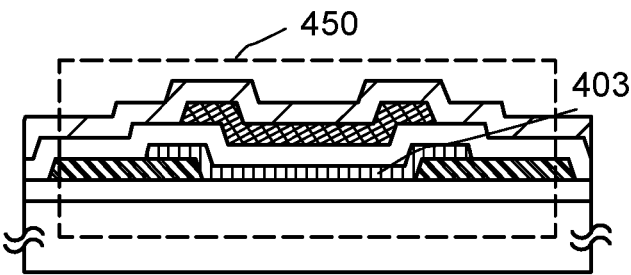

Through the above process, the transistor 450 is formed (see FIG. 8F). The transistor 450 includes the highly purified crystalline oxide semiconductor film containing excess oxygen with which an oxygen vacancy is filled. Therefore, the transistor 450 has less change in electrical characteristics and thus is electrically stable.

In the transistor 450 formed according to this embodiment using the purified crystalline oxide semiconductor film 403 containing excess oxygen with which an oxygen vacancy is filled, the value of a current in the off state (the value of an off-state current) per unit channel width (1 μm) can be reduced so as to be less than or equal to 100 zA/μm (1 zA (zeptoampere) is $1\times10^{-21}$ A), preferably less than or equal to 10 zA/μm, more preferably less than or equal to 1 zA/μm, further preferably less than or equal to 100 yA/μm at room temperature.

As described above, a semiconductor device formed using an oxide semiconductor, which has stable electrical characteristics, can be provided. Accordingly, a semiconductor device with high reliability can be provided.

Embodiment 9

In this embodiment, another embodiment of a method for manufacturing the semiconductor device will be described. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

Described in this embodiment using a transistor 450c are examples of the step of adding oxygen, which can be applied to the manufacturing process for the transistor 450 described in Embodiment 8.

Figure 9A:
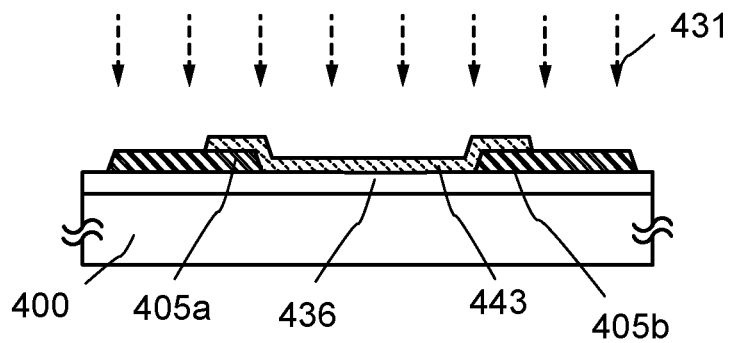
FIGS. 9A to 9C illustrate one embodiment of a semiconductor device and a method for manufacturing the semiconductor device.

FIG. 9A illustrates an example of adding the oxygen 431 directly to the amorphous oxide semiconductor film 492 after the step shown in FIG. 8B. By the addition of the oxygen 431, the amorphous oxide semiconductor film 492 is changed into an amorphous oxide semiconductor film 443 having a region containing oxygen in excess of the stoichiometric ratio in the oxide semiconductor in a crystalline state. An oxygen vacancy in the amorphous oxide semiconductor film 443 can be filled with the oxygen 431 supplied to the amorphous oxide semiconductor film 443. In the case where oxygen is added directly to the amorphous oxide semiconductor film 492 in an exposed state as shown in FIG. 9A, plasma treatment can be used.

In a transistor which can be manufactured according to one embodiment of the present invention, the gate electrode layer 401 and the source and drain electrode layers 405a and 405b may be positioned so as not to overlap with each other or so as to partially overlap with each other, with the gate insulating film 402 provided therebetween.

For example, the transistor 450 described in Embodiment 8 with reference to FIGS. 8A to 8F is an example of a structure in which the source and drain electrode layers 405a and 405b and the gate electrode layer 401 partially overlap with each other with the gate insulating film 402 and the crystalline oxide semiconductor film 403 provided therebetween.

Figure 9B:
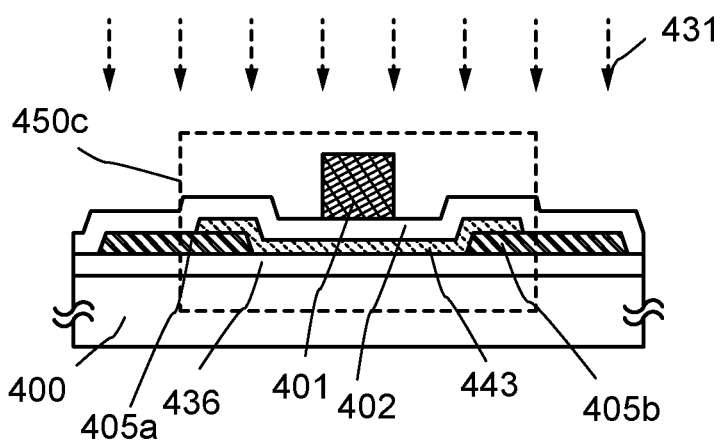
Figure 9C:
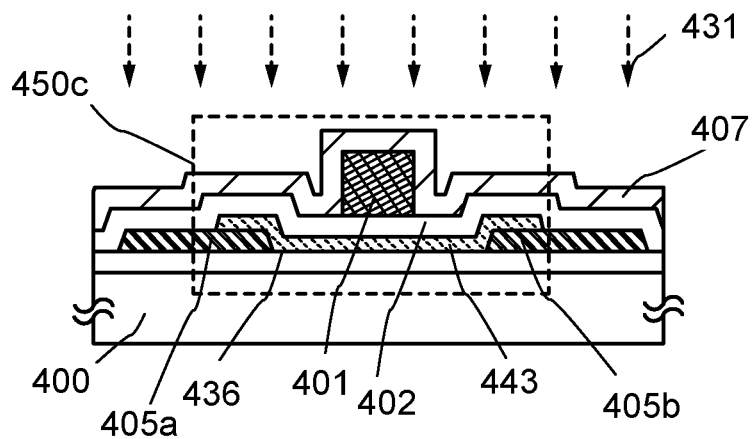

The transistor 450c described in this embodiment with reference to FIGS. 9B and 9C is an example of a structure in which the source and drain electrode layers 405a and 405b and the gate electrode layer 401 do not overlap with each other, with the gate insulating film 402 and the crystalline oxide semiconductor film 403 provided therebetween.

FIG. 9B illustrates an example of adding the oxygen 431 to the amorphous oxide semiconductor film 492 through the gate insulating film 402 after the gate electrode layer 401 is formed over the gate insulating film 402. By the addition of the oxygen 431, the amorphous oxide semiconductor film 492 is changed into the amorphous oxide semiconductor film 443 having a region containing oxygen in excess of the stoichiometric ratio in the oxide semiconductor in a crystalline state. An oxygen vacancy in the amorphous oxide semiconductor film 443 can be filled with the oxygen 431 supplied to the amorphous oxide semiconductor film 443.

FIG. 9C illustrates an example of adding the oxygen 431 to the amorphous oxide semiconductor film 492 through the gate insulating film 402 and the insulating film 407 after the insulating film 407 is formed over the gate insulating film 402 and the gate electrode layer 401. By the addition of the oxygen 431, the amorphous oxide semiconductor film 492 is changed into an amorphous oxide semiconductor film 443 having a region containing oxygen in excess of the stoichiometric ratio in the oxide semiconductor in a crystalline state. An oxygen vacancy in the amorphous oxide semiconductor film 443 can be filled with the oxygen 431 supplied to the amorphous oxide semiconductor film 443.

In the case where the step of adding the oxygen 431 to the amorphous oxide semiconductor film 492 is performed after the gate insulating film 402 and the gate electrode layer 401 are formed as illustrated in FIGS. 9B and 9C, the structure in which the gate electrode layer 401 and the source and drain electrode layers 405a and 405b do not overlap with each other facilitates the addition of the oxygen 431 to the amorphous oxide semiconductor film 492 that is positioned between the gate electrode layer 401 and the source and drain electrode layers 405a and 405b.

As described above, the addition of oxygen to the crystalline oxide semiconductor film can be performed anytime after dehydration or dehydrogenation is performed thereon. Further, oxygen may be added plural times to the oxide semiconductor film after the dehydration or dehydrogenation treatment is performed.

The transistor manufactured through the above process includes the highly purified crystalline oxide semiconductor film containing excess oxygen with which an oxygen vacancy is filled. Therefore, the transistor has less change in electrical characteristics and thus is electrically stable.

A semiconductor device formed using an oxide semiconductor, which has stable electrical characteristics, can be provided. Accordingly, a semiconductor device with high reliability can be provided.

This embodiment can be implemented in appropriate combinations with any of the other embodiments.

Embodiment 10

In this embodiment, another embodiment of a semiconductor device and a method for manufacturing the semiconductor device will be described with reference to FIGS. 11A to 11C. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment.

Described in this embodiment are examples in which impurity regions functioning as a source region and a drain region are formed in a crystalline oxide semiconductor film in a method for manufacturing a semiconductor device according to one embodiment of the disclosed invention. The impurity regions functioning as a source region and a drain region can be formed by adding an impurity (also called a dopant) for changing the electrical conductivity to the crystalline oxide semiconductor film.

The dopant concentration in each of the impurity regions functioning as the source region and the drain region is preferably greater than or equal to $5\times10^{18}/cm^3$ and less than or equal to $1\times10^{22}/cm^3$.

The dopant is a Group 15 element and boron, specifically, one or more selected from phosphorus, arsenic, antimony, and boron. As the method for adding the dopant to the crystalline oxide semiconductor film, an ion doping method or an ion implantation method can be used.

The substrate may be heated while the dopant is added by an ion doping method or an ion implantation method.

The addition of dopant to the crystalline oxide semiconductor film may be performed plural times, and plural kinds of dopant may be used.

The addition of dopant may cause part of the impurity regions to become amorphous. In that case, the crystallinity can be recovered by performing heat treatment thereon after the addition of dopant.

Figure 11A:
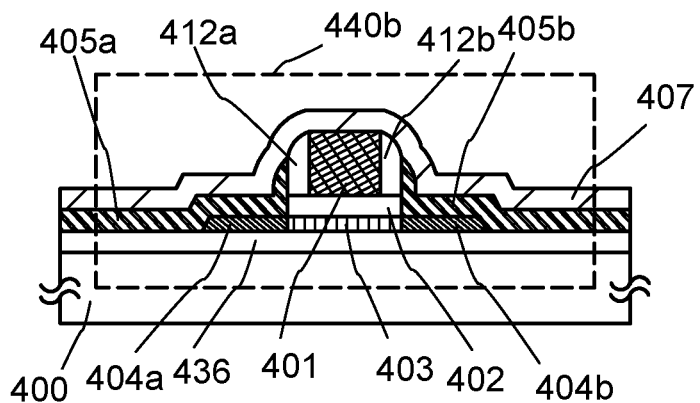
FIGS. 11A to 11C illustrate embodiments of semiconductor devices.

FIG. 11A illustrates a transistor 440b in which impurity regions 404a and 404b functioning as a source region and a drain region are provided in the crystalline oxide semiconductor film 403 in the transistor 440 described in Embodiment 5 or 6. The impurity regions 404a and 404b can be formed by adding a dopant to the crystalline oxide semiconductor film 403 with the gate electrode layer 401 and the sidewall insulating layers 412a and 412b used as a mask before formation of the source electrode layer 405a and the drain electrode layer 405b.

Figure 11B:
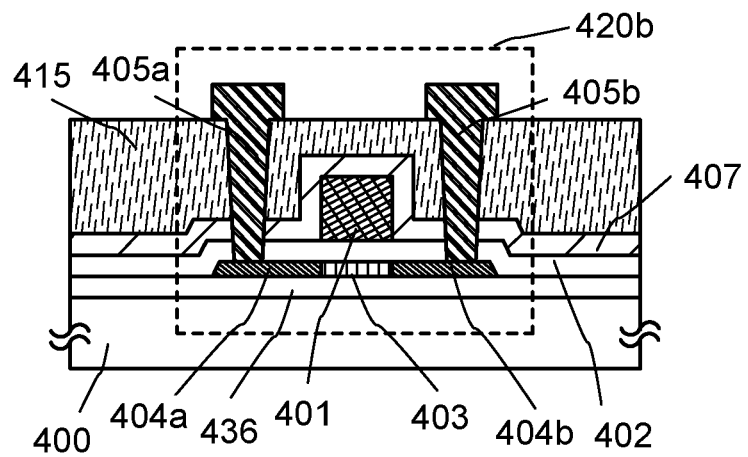

FIG. 11B illustrates a transistor 420b in which impurity regions 404a and 404b functioning as a source region and a drain region are provided in the crystalline oxide semiconductor film 403 in the transistor 420 described in Embodiment 7. The impurity regions 404a and 404b can be formed by adding a dopant to the crystalline oxide semiconductor film 403 with the gate electrode layer 401 used as a mask.

Figure 11C:
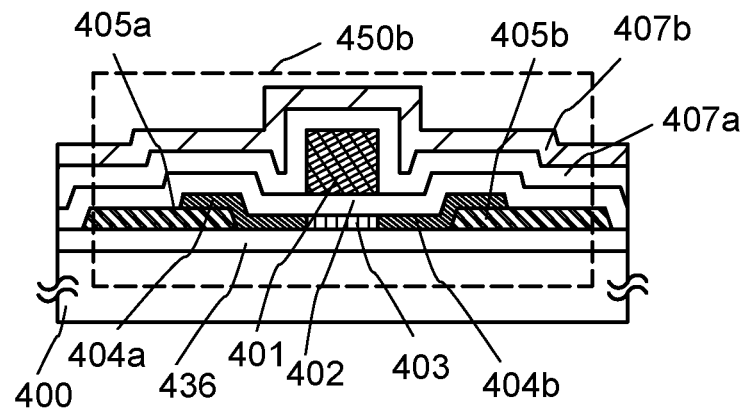

FIG. 11C illustrates a transistor 450b in which impurity regions 404a and 404b functioning as a source region and a drain region are provided in the crystalline oxide semiconductor film 403 in the transistor 450 described in Embodiment 8. The impurity regions 404a and 404b can be formed by adding a dopant to the crystalline oxide semiconductor film 403 with the gate electrode layer 401 used as a mask.

With the impurity regions functioning as a source region and a drain region, the electric field applied to a channel formation region between the impurity regions can be attenuated. Further, by electrically connecting the electrode layer to the crystalline oxide semiconductor film in the impurity region, contact resistance between the electrode layer and the crystalline oxide semiconductor film can be reduced. Consequently, the electrical characteristics of the transistor can be enhanced.

This embodiment can be implemented in appropriate combinations with any of the other embodiments.

Embodiment 11

A semiconductor device with a display function (also referred to as a display device) can be manufactured using any of the transistors the examples of which are described in Embodiments 1 to 10. Moreover, some or all of the driver circuits which include the transistor can be formed over a substrate where the pixel portion is formed, whereby a system-on-panel can be obtained.

Figure 13A:
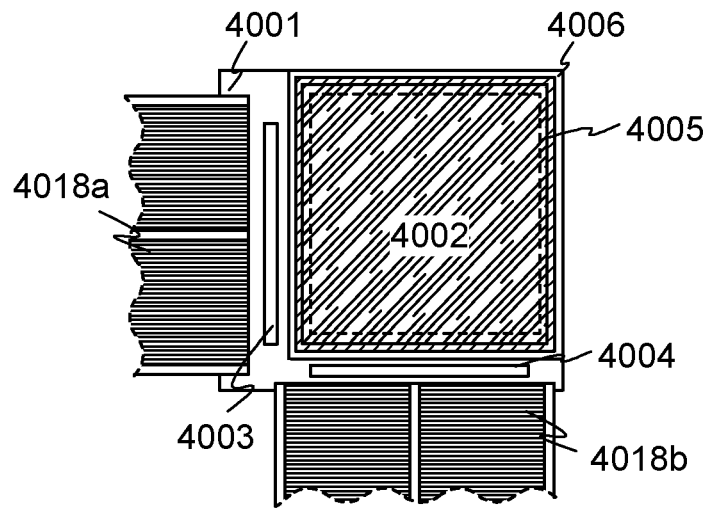
FIGS. 13A to 13C illustrate embodiments of semiconductor devices.

In FIG. 13A, a sealant 4005 is provided so as to surround a pixel portion 4002 provided over a first substrate 4001, and the pixel portion 4002 is sealed by using a second substrate 4006. In FIG. 13A, a signal line driver circuit 4003 and a scan line driver circuit 4004 which are each formed using a single crystal semiconductor film or a polycrystalline semiconductor film over a substrate separately prepared are mounted in a region that is different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018a and 4018b.

Figure 13B:
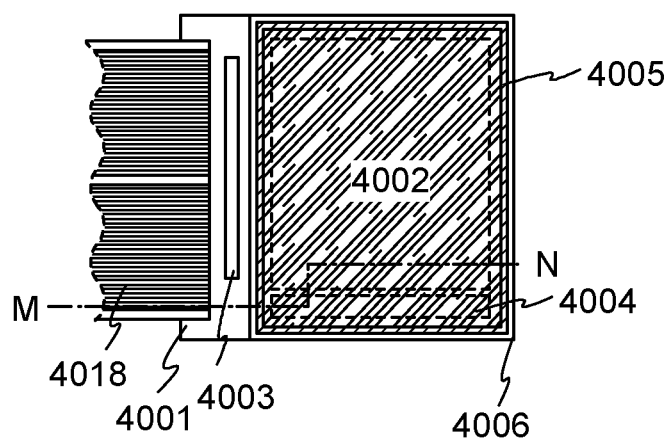
Figure 13C:
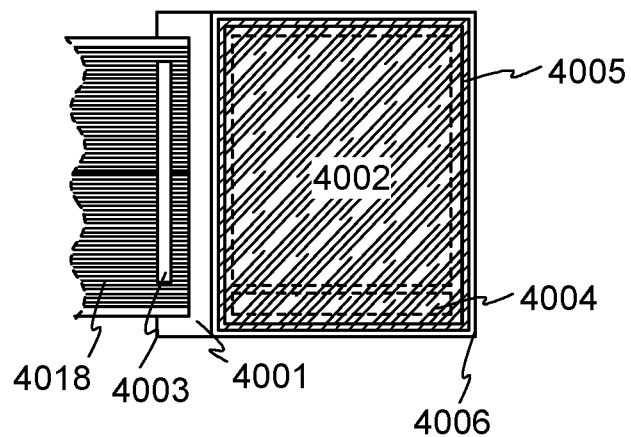

In FIGS. 13B and 13C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 13B and 13C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 13B and 13C, various signals and potentials are supplied to the signal line driver circuit 4003, the scan line driver circuit 4004, and the pixel portion 4002 through an FPC 4018.

Although FIGS. 13B and 13C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

Note that there is no particular limitation on the method of connecting a separately formed driver circuit, and a chip on glass (COG) method, a wire bonding method, a tape automated bonding (TAB) method, or the like can be used. FIG. 13A illustrates an example in which the signal line driver circuit 4003 and the scan line driver circuit 4004 are mounted by a COG method. FIG. 13B illustrates an example in which the signal line driver circuit 4003 is mounted by a COG method. FIG. 13C illustrates an example in which the signal line driver circuit 4003 is mounted by a TAB method.

The display device includes a panel in which the display element is sealed, and a module in which an IC including a controller or the like is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the end of which a printed wiring board is provided; and a module in which an integrated circuit (IC) is directly mounted on a display element by a COG method.

The pixel portion and the scan line driver circuit which are provided over the first substrate include a plurality of transistors; any of the transistors described in Embodiments 1 to 10 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as electronic ink, can be used.

Embodiments of the semiconductor device will be described with reference to FIGS. 13A to 13C and FIGS. 14A and 14B. FIGS. 14A and 14B correspond to cross-sectional views along line M-N in FIG. 13B.

As illustrated in FIGS. 13A to 13C and FIGS. 14A and 14B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source electrode layers and drain electrode layers of transistors 4010 and 4011.

The pixel portion 4002 and the scan line driver circuit 4004 which are provided over the first substrate 4001 include a plurality of transistors. FIGS. 14A and 14B illustrate the transistor 4010 included in the pixel portion 4002 and the transistor 4011 included in the scan line driver circuit 4004 as an example. In FIG. 14A, an insulating film 4020 and an insulating film 4032 are provided over the transistors 4010 and 4011. In FIG. 14B, an insulating film 4021 is further provided. Note that an insulating film 4023 is an insulating layer serving as a base film.

Any of the transistors described in Embodiments 1 to 10 can be applied to the transistor 4010 and the transistor 4011. Described in this embodiment is an example in which a transistor having a structure similar to that of the transistor 410 described in Embodiment 1 is used.

Each of the transistors 4010 and 4011 includes a highly purified crystalline oxide semiconductor film containing excess oxygen with which an oxygen vacancy is filled. Therefore, the transistors 4010 and 4011 have less change in electrical characteristics and thus are electrically stable.

Accordingly, highly reliable semiconductor devices can be provided as the semiconductor devices of this embodiment in FIGS. 13A to 13C and FIGS. 14A and 14B.

In addition, an example is described in this embodiment, in which a conductive layer is provided over the insulating film so as to overlap with a channel formation region in the crystalline oxide semiconductor film of the transistor 4011 for the driver circuit. By providing the conductive layer so as to overlap with the channel formation region in the crystalline oxide semiconductor film, the amount of change in the threshold voltage of the transistor 4011 by a bias-temperature stress test (BT test) can be further reduced. The conductive layer may have the same potential as or a potential different from that of a gate electrode layer of the transistor 4011, and can function as a second gate electrode layer. The potential of the conductive layer may be GND or 0 V, or the conductive layer may be in a floating state.

In addition, the conductive layer functions to block an external electric field, that is, to prevent an external electric field (particularly, to prevent static electricity) from affecting the inside (a circuit portion including a transistor). A blocking function of the conductive layer can prevent fluctuation in the electrical characteristics of the transistor due to an influence of an external electric field such as static electricity.

The transistor 4010 provided in the pixel portion 4002 is electrically connected to a display element to form a display panel. A variety of display elements can be used as the display element as long as display can be performed.

An example of a liquid crystal display device including a liquid crystal element as a display element is illustrated in FIG. 14A. In FIG. 14A, a liquid crystal element 4013 which is a display element includes the first electrode layer 4030, a second electrode layer 4031, and a liquid crystal layer 4008. Insulating films 4032 and 4033 functioning as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer denoted by reference numeral 4035 is obtained by selective etching of an insulating film and is provided in order to control the thickness (cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor formed using an oxide semiconductor film has a possibility that the electrical characteristics of the transistor may fluctuate significantly by the influence of static electricity and deviate from the designed range. Therefore, it is more effective to use a liquid crystal composition exhibiting a blue phase for the liquid crystal display device including the transistor formed using an oxide semiconductor film.

The specific resistivity of the liquid crystal material is higher than or equal to $1\times10^{9}$ $\Omega\cdot$cm, preferably higher than or equal to $1\times10^{11}$ $\Omega\cdot$cm, further preferably higher than or equal to $1\times10^{12}$ $\Omega\cdot$cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including a highly purified oxide semiconductor film, it is enough to provide a storage capacitor having a capacitance that is ⅓ or less, preferably ⅕ or less of liquid crystal capacitance of each pixel.

In the transistor used in this embodiment, which includes a highly purified crystalline oxide semiconductor film, the current in an off state (off-state current) can be made small. Accordingly, an electric signal such as an image signal can be held for a longer period, and a writing interval can be set longer in an on state. Accordingly, the frequency of refresh operation can be reduced, which leads to an effect of suppressing power consumption.

The transistor used in this embodiment, which includes a highly purified oxide semiconductor film, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element is described here as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

An example of a light-emitting device including a light-emitting element as a display element is illustrated in FIG. 14B. A light-emitting element 4513 which is a display element is electrically connected to the transistor 4010 provided in the pixel portion 4002. A structure of the light-emitting element 4513 is not limited to the illustrated stacked-layer structure including the first electrode layer 4030, an electroluminescent layer 4511, and the second electrode layer 4031. The structure of the light-emitting element 4513 can be changed as appropriate depending on the direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. In this manner, the light-emitting element 4513 and the like are preferably packaged (sealed) with a protective film (such as a laminate film or an ultraviolet curable resin film) or a cover material with high air-tightness and little degasification so that the light-emitting element 4513 and the like are not exposed to the outside air.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as electrophoretic display device (electrophoretic display) and is advantageous in that it has the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move without an electric field. Moreover, the first particles and the second particles have different colors (which may be colorless).

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

Note that in FIGS. 13A to 13C and FIGS. 14A and 14B, a flexible substrate as well as a glass substrate can be used as the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020. The insulating film 4020 can be formed by a sputtering method or a plasma CVD method.

The aluminum oxide film provided as the insulating film 4020 over the oxide semiconductor film has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

The transistors 4010 and 4011 each include the crystalline oxide semiconductor film obtained by crystallization of an amorphous oxide semiconductor film which contains excess oxygen as a result of adding oxygen thereto. Since the heat treatment for crystallizing the amorphous oxide semiconductor film is performed in the state where the amorphous oxide semiconductor film is covered with the aluminum oxide film, oxygen can be prevented from being released from the amorphous oxide semiconductor film by the heat treatment. Thus, the resulting crystalline oxide semiconductor film can maintain the amount of oxygen contained in the amorphous oxide semiconductor film, and therefore has a region containing oxygen in excess of the stoichiometric ratio in the oxide semiconductor in a crystalline state.

Therefore, the crystalline oxide semiconductor film can have high purity because impurities such as hydrogen and moisture do not enter the crystalline oxide semiconductor film, and can have the region containing oxygen in excess of the stoichiometric ratio in the oxide semiconductor in a crystalline state because oxygen is prevented from being released therefrom. Accordingly, with the use of the crystalline oxide semiconductor film for the transistors 4010 and 4011, it is possible to reduce a variation in the threshold voltage $V_{th}$ of the transistors 4010 and 4011 and a shift of the threshold voltage ($\Delta V_{th}$) due to an oxygen vacancy.

Further, the insulating film 4021 functioning as a planarization insulating film can be formed using an organic material having heat resistance, such as an acrylic-, polyimide-, or benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. Note that the insulating film may be formed by stacking a plurality of insulating films formed using any of these materials.

There is no particular limitation on the method of forming the insulating film 4021, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible light wavelength range.

The first electrode layer and the second electrode layer (which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

By using any of the transistors described in Embodiments 1 to 10 as described above, the semiconductor device can have a variety of functions.

Embodiment 12

A semiconductor device having an image sensor function of reading information on an object can be manufactured using any of the transistors described in Embodiments 1 to 10.

Figure 15A:
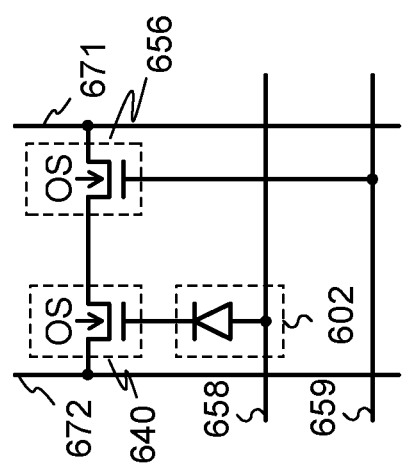
FIGS. 15A and 15B illustrate one embodiment of a semiconductor device.

FIG. 15A illustrates an example of a semiconductor device having an image sensor function. FIG. 15A is an equivalent circuit diagram of a photosensor, and FIG. 15B is a cross-sectional view illustrating part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in circuit diagrams in this specification, a transistor formed using an oxide semiconductor film is denoted by a symbol "OS" so that it can be identified as a transistor formed using an oxide semiconductor film. In FIG. 15A, the transistor 640 and the transistor 656 are each a transistor including a crystalline oxide semiconductor layer, to which any of the transistors described in Embodiments 1 to 10 can be applied. Described in this embodiment is an example in which a transistor having a structure similar to that of the transistor 410 described in Embodiment 1 is used.

Figure 15B:
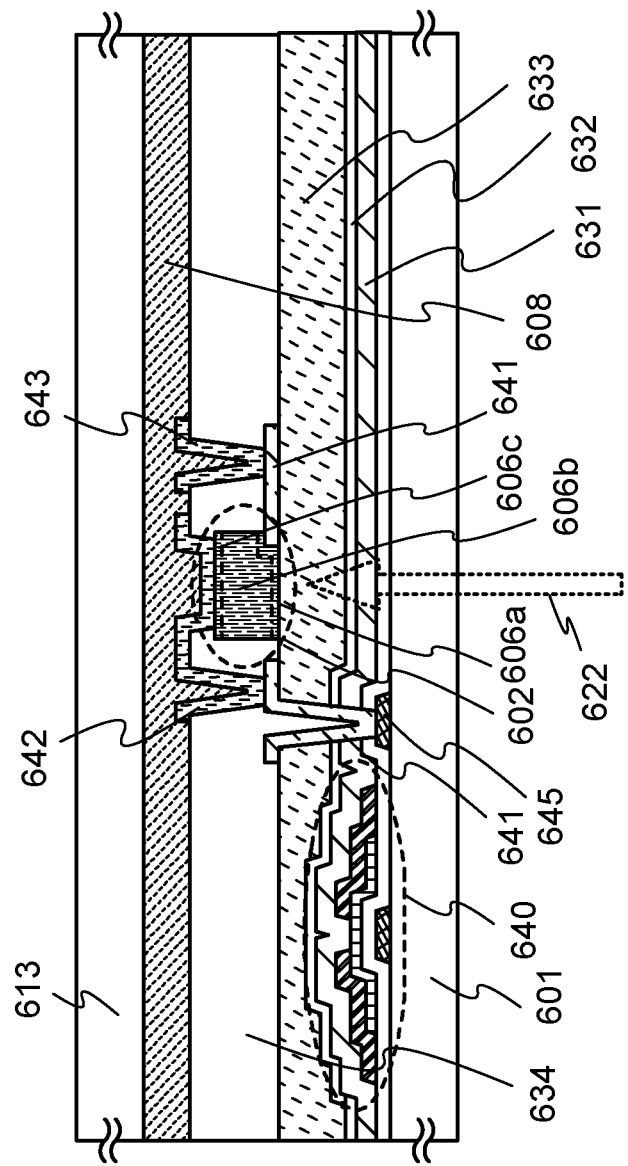

FIG. 15B is a cross-sectional view of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to a gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

Considering Gibbs free energy, the microcrystalline semiconductor is in a metastable state that is intermediate between an amorphous state and a single crystal state. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 at. % in order to terminate a dangling bond. Moreover, microcrystalline silicon contains a rare gas element such as helium, argon, krypton, or neon to further promote lattice distortion, so that stability is increased and a favorable microcrystalline semiconductor film can be obtained.

This microcrystalline semiconductor film can be formed by a radio-frequency plasma CVD method with a frequency of greater than or equal to several tens of megahertz and less than or equal to several hundreds of megahertz, or a microwave plasma CVD apparatus with a frequency of greater than or equal to 1 GHz. Typically, the microcrystalline semiconductor can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the insulating film 632, the interlayer insulating film 633, and the interlayer insulating film 634 can be formed, depending on the material, using a method or a tool (equipment) such as a sputtering method, a plasma CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

In this embodiment, the transistor 640 includes the crystalline oxide semiconductor film obtained by crystallization of an amorphous oxide semiconductor film containing excess oxygen. Since the heat treatment for crystallizing the amorphous oxide semiconductor film is performed in the state where the amorphous oxide semiconductor film is covered with the aluminum oxide film, oxygen can be prevented from being released from the amorphous oxide semiconductor film by the heat treatment. Thus, the resulting crystalline oxide semiconductor film can maintain the amount of oxygen contained in the amorphous oxide semiconductor film, and therefore has a region containing oxygen in excess of the stoichiometric ratio in the oxide semiconductor in a crystalline state.

Therefore, the crystalline oxide semiconductor film has high purity and has the region containing oxygen in excess of the stoichiometric ratio in the oxide semiconductor in a crystalline state because the entry of impurities such as hydrogen and moisture and the release of excess oxygen can be prevented. Accordingly, with the use of the crystalline oxide semiconductor film for the transistor 640, it is possible to reduce a variation in the threshold voltage $V_{th}$ of the transistor 640 and a shift of the threshold voltage ($\Delta V_{th}$) due to an oxygen vacancy.

The insulating film 632 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

For a reduction in surface roughness, an insulating film functioning as a planarization insulating film is preferably used as each of the interlayer insulating films 633 and 634. For the interlayer insulating films 633 and 634, for example, an organic insulating material having heat resistance, such as a polyimide, an acrylic resin, a benzocyclobutene-based resin, a polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light that enters the photodiode 602, information on an object to be detected can be read. Note that a light source such as a backlight can be used at the time of reading information on an object to be detected.

As described above, a transistor including such a highly purified crystalline oxide semiconductor film containing excess oxygen with which an oxygen vacancy is filled has less change in electrical characteristics and thus is electrically stable. Thus, by using the transistor, a highly reliable semiconductor device can be provided.

This embodiment can be implemented in appropriate combinations with any of the other embodiments.

Embodiment 13

The transistor an example of which is described in any of Embodiments 1 to 10 can be favorably used for a semiconductor device including an integrated circuit in which a plurality of transistors is stacked. In this embodiment, as an example of the semiconductor device, a memory medium (memory element) will be described.

In this embodiment, a semiconductor device is manufactured which includes a transistor 140 which is a first transistor formed using a single crystal semiconductor substrate and a transistor 162 which is a second transistor formed using a semiconductor film and provided above the transistor 140 with an insulating film positioned between the transistor 140 and the transistor 162. The transistor an example of which is described in any of Embodiments 1 to 10 can be favorably used as the transistor 162. Described in this embodiment is an example in which a transistor having a structure similar to that of the transistor 440 described in Embodiment 5 is used as the transistor 162.

Semiconductor materials and structures of the transistor 140 and the transistor 162, which are stacked, may be the same or different. In this embodiment, an example is described in which materials and structures which are appropriate for the circuit of the memory medium (memory element) are employed for the transistors.

Figure 12A:
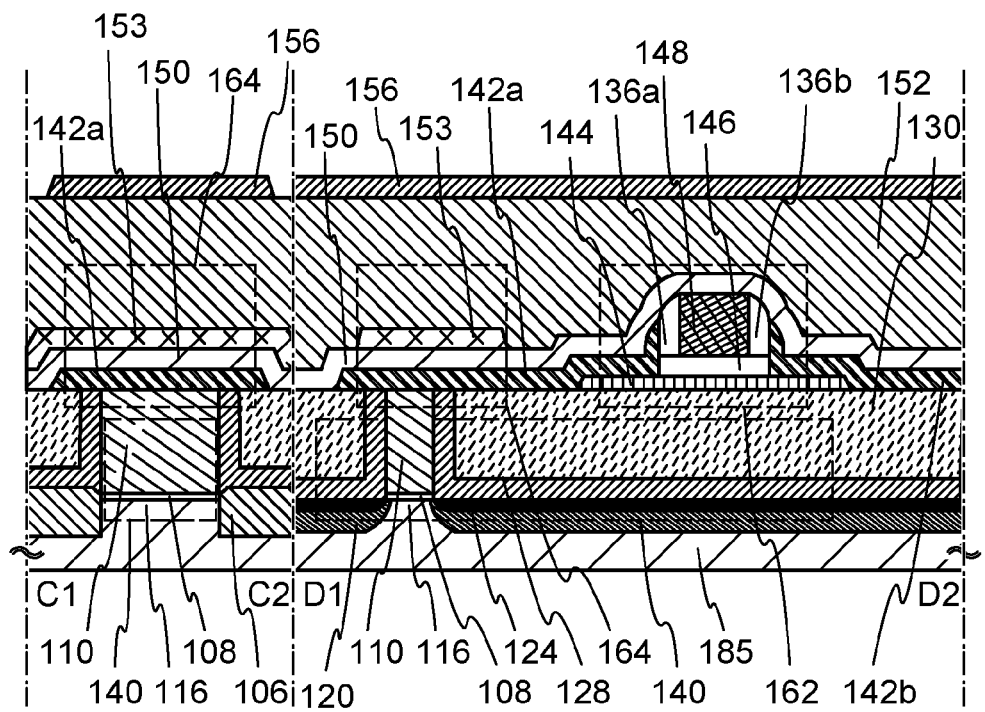
FIGS. 12A to 12C illustrate one embodiment of a semiconductor device.
Figure 12B:
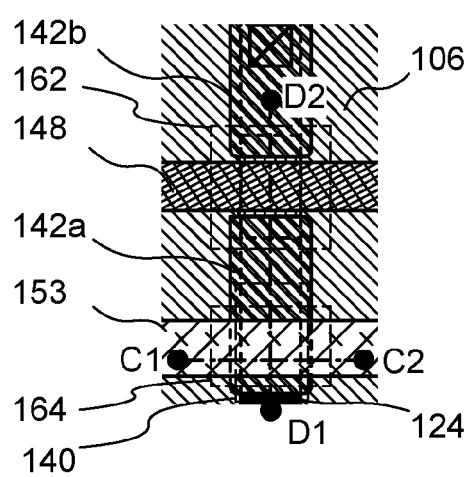
Figure 12C:
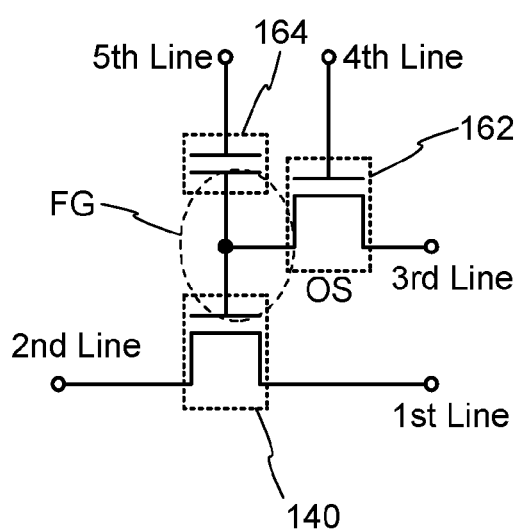

FIGS. 12A to 12C illustrate an example of a configuration of the semiconductor device. FIG. 12A illustrates a cross section of the semiconductor device, and FIG. 12B illustrates a plan view of the semiconductor device. Here, FIG. 12A corresponds to a cross section along line C1-C2 and line D1-D2 in FIG. 12B. FIG. 12C is an example of a diagram of a circuit including the semiconductor device as a memory element. The semiconductor device illustrated in FIGS. 12A and 12B includes the transistor 140 formed using a first semiconductor material in a lower portion, and the transistor 162 formed using a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, or gallium arsenide can be used, and a single crystal semiconductor is preferably used. Alternatively, an organic semiconductor material or the like may be used. A transistor formed using such a semiconductor material can operate at high speed easily. On the other hand, a transistor formed using an oxide semiconductor enables charge to be held for a long time owing to its characteristics.

A method for manufacturing the semiconductor device in FIGS. 12A to 12C will be described with reference to FIGS. 12A to 12C.

The transistor 140 includes a channel formation region 116 provided in a substrate 185 containing a semiconductor material (e.g., silicon), impurity regions 120 provided so that the channel formation region 116 is provided therebetween, metal compound regions 124 in contact with the impurity regions 120, a gate insulating film 108 provided over the channel formation region 116, and a gate electrode 110 provided over the gate insulating film 108.

As the substrate 185 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film formed using a material other than silicon is provided over an insulating surface. That is, a semiconductor film included in the "SOI substrate" is not limited to a silicon semiconductor film. Moreover, the SOI substrate can be a substrate having a structure where a semiconductor film is provided over an insulating substrate such as a glass substrate with an insulating film positioned therebetween.

As a method of forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing a phenomenon in which microvoids formed by hydrogen ion irradiation grow because of heat treatment; a method in which a single crystal semiconductor film is formed over an insulating surface by crystal growth; and the like.

For example, ions are added through one surface of a single crystal semiconductor substrate, an embrittlement layer is formed at a certain depth from the surface of the single crystal semiconductor substrate, and an insulating film is formed over either the surface of the single crystal semiconductor substrate or an element substrate. Heat treatment is performed in a state where the single crystal semiconductor substrate and the element substrate are bonded to each other with the insulating film interposed therebetween, so that a crack is generated in the embrittlement layer and the single crystal semiconductor substrate is separated along the embrittlement layer. Accordingly, a single crystal semiconductor film, which is separated from the single crystal semiconductor substrate, is formed as a semiconductor film over the element substrate. An SOI substrate formed by the above method can also be favorably used.

An element isolation insulating layer 106 is provided on the substrate 185 so as to surround the transistor 140. Note that for high integration, it is preferable that, as in FIGS. 12A to 12C, the transistor 140 do not include a sidewall insulating layer. On the other hand, in the case where the characteristics of the transistor 140 have priority, a sidewall insulating layer may be provided on a side surface of the gate electrode 110, and the impurity region 120 including a region having a different impurity concentration may be provided.

The transistor 140 formed using a single crystal semiconductor substrate can operate at high speed. Thus, when the transistor is used as a reading transistor, data can be read at high speed. Two insulating films are formed so as to cover the transistor 140. As treatment prior to formation of the transistor 162 and a capacitor 164, CMP treatment is performed on the two insulating films, whereby an insulating film 128 and an insulating film 130 which are planarized are formed and, at the same time, an upper surface of the gate electrode 110 is exposed.

As each of the insulating film 128 and the insulating film 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 128 and the insulating film 130 can be formed by a plasma CVD method, a sputtering method, or the like.

Alternatively, an organic material such as a polyimide-, acrylic-, or benzocyclobutene-based resin can be used. Other than such organic materials, it is also possible to use a low dielectric constant material (low-k material) or the like. In the case of using an organic material, the insulating film 128 and the insulating film 130 may be formed by a wet method such as a spin coating method or a printing method.

Note that in the insulating film 130, a silicon oxide film is used as a film to be in contact with the semiconductor film.

In this embodiment, a 50-nm-thick silicon oxynitride film is formed as the insulating film 128 by a sputtering method, and a 550-nm-thick silicon oxide film is formed as the insulating film 130 by a sputtering method.

A semiconductor film is formed over the insulating film 130 which has been sufficiently planarized by CMP treatment. In this embodiment, an amorphous oxide semiconductor film is formed as the semiconductor film by a sputtering method using an In—Ga—Zn-based oxide target so as to have a region containing oxygen in excess of the stoichiometric ratio in the oxide semiconductor in a crystalline state.

Next, the amorphous oxide semiconductor film is selectively etched to form an island-shaped amorphous oxide semiconductor film, and oxygen is added to the amorphous oxide semiconductor film. Over the amorphous oxide semiconductor film, a gate insulating film 146, a gate electrode layer 148, and sidewall insulating layers 136a and 136b are formed.

As the gate insulating film 146, a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, or a gallium oxide film can be formed by a plasma CVD method, a sputtering method, or the like.

The gate electrode layer 148 can be formed by forming a conductive layer over the gate insulating film 146 and selectively etching the conductive layer.

Next, a conductive layer is formed over the gate electrode 110, the insulating film 128, the insulating film 130, and the like, and etched selectively, so that the source or drain electrode 142a and the source or drain electrode 142b are formed.

The conductive layer can be formed by a PVD method such as a sputtering method or a CVD method such as a plasma CVD method. Further, as a material of the conductive layer, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used.

The conductive layer may have a single-layer structure or a stacked-layer structure of two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source or drain electrode 142a and the source or drain electrode 142b having a tapered shape.

Next, an insulating film 150 including an aluminum oxide film is formed over the amorphous oxide semiconductor film, the gate insulating film 146, the gate electrode layer 148, and the sidewall insulating layers 136a and 136b. In the case where the insulating film 150 has a stacked-layer structure, a stack of the aluminum oxide film and a silicon oxide film, a silicon nitride film, a silicon oxynitride film, a silicon nitride oxide film, an aluminum nitride film, an aluminum oxynitride film, an aluminum nitride oxide film, a hafnium oxide film, or a gallium oxide film may be formed by a plasma CVD method, a sputtering method, or the like.

Next, the amorphous oxide semiconductor film is at least partially crystallized through heat treatment so that a crystalline oxide semiconductor film 144 is formed which includes a crystal having a c-axis substantially perpendicular to a surface of the crystalline oxide semiconductor film 144.

The aluminum oxide film provided as the insulating film 150 over the oxide semiconductor film has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

Since the heat treatment for crystallizing the amorphous oxide semiconductor film is performed in the state where the amorphous oxide semiconductor film is covered with the aluminum oxide film provided as the insulating film 150, oxygen can be prevented from being released from the amorphous oxide semiconductor film by the heat treatment. Thus, the resulting crystalline oxide semiconductor film 144 can maintain the amount of oxygen contained in the amorphous oxide semiconductor film, and therefore has a region containing oxygen in excess of the stoichiometric ratio in the oxide semiconductor in a crystalline state.

Therefore, the crystalline oxide semiconductor film 144 can have high purity because impurities such as hydrogen and moisture do not enter the crystalline oxide semiconductor film, and can have the region containing oxygen in excess of the stoichiometric ratio in the oxide semiconductor in a crystalline state because oxygen is prevented from being released therefrom. Accordingly, with the use of the crystalline oxide semiconductor film 144 for the transistor 162, it is possible to reduce a variation in the threshold voltage $V_{th}$ of the transistor 162 and a shift of the threshold voltage ($\Delta V_{th}$) due to an oxygen vacancy.

The heat treatment for crystallizing at least part of the amorphous oxide semiconductor film is performed at a temperature higher than or equal to 250° C. and lower than or equal to 700° C., preferably higher than or equal to 400° C., more preferably higher than or equal to 500° C., even more preferably higher than or equal to 550° C.

Over the insulating film 150, an electrode layer 153 is formed in a region which overlaps with the source or drain electrode 142a.

Next, an insulating film 152 is formed over the transistor 162 and the insulating film 150. The insulating film 152 can be formed by a sputtering method, a CVD method, or the like. The insulating film 152 can be formed using a material including an inorganic insulating material such as silicon oxide, silicon oxynitride, silicon nitride, hafnium oxide, or aluminum oxide.

Next, an opening reaching the source or drain electrode 142b is formed in the gate insulating film 146, the insulating film 150, and the insulating film 152. The opening is formed by selective etching with the use of a mask or the like.

After that, a wiring 156 in contact with the source or drain electrode 142b is formed in the opening. Note that FIGS. 12A to 12C do not illustrate a portion where the wiring 156 and the source or drain electrode 142b are connected to each other.

The wiring 156 is formed in such a manner that a conductive layer is formed by a PVD method such as a sputtering method or a CVD method such as a plasma CVD method and then the conductive layer is etched. Further, as a material of the conductive layer, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used. The details are similar to those of the source or drain electrode 142a or the like.

Through the above steps, the transistor 162 and the capacitor 164 are completed. The transistor 162 includes the highly purified crystalline oxide semiconductor film 144 containing excess oxygen with which an oxygen vacancy is filled. Therefore, the transistor 162 has less change in electrical characteristics and thus is electrically stable. The capacitor 164 includes the source or drain electrode 142a, the crystalline oxide semiconductor film 144, the gate insulating film 146, and the electrode layer 153.

Note that in the capacitor 164 in FIGS. 12A to 12C, with a stack of the crystalline oxide semiconductor film 144 and the gate insulating film 146, insulation between the source or drain electrode 142a and the electrode layer 153 can be adequately ensured. Needless to say, the capacitor 164 without the crystalline oxide semiconductor film 144 may be employed in order to secure sufficient capacitance. Alternatively, the capacitor 164 including an additional insulating film may be employed. Still alternatively, the capacitor 164 may be omitted in the case where a capacitor is not needed.

FIG. 12C is an example of a diagram of a circuit including the semiconductor device as a memory element. In FIG. 12C, one of a source electrode and a drain electrode of the transistor 162, one electrode of the capacitor 164, and a gate electrode of the transistor 140 are electrically connected to one another. A first wiring (1st Line, also referred to as source line) is electrically connected to a source electrode of the transistor 140. A second wiring (2nd Line, also referred to as bit line) is electrically connected to a drain electrode of the transistor 140. A third wiring (3rd Line, also referred to as first signal line) is electrically connected to the other of the source electrode and the drain electrode of the transistor 162. A fourth wiring (4th Line, also referred to as second signal line) is electrically connected to a gate electrode of the transistor 162. A fifth wiring (5th Line, also referred to as word line) is electrically connected to the other electrode of the capacitor 164.

The transistor 162 formed using an oxide semiconductor has extremely small off-state current; therefore, when the transistor 162 is in an off state, a potential of a node (hereinafter node FG) where the one of the source electrode and the drain electrode of the transistor 162, the one electrode of the capacitor 164, and the gate electrode of the transistor 140 are electrically connected to one another can be held for an extremely long time. The capacitor 164 facilitates holding of charge applied to the node FG and reading of stored data.

When data is stored in the semiconductor device (writing), the potential of the fourth wiring is set to a potential at which the transistor 162 is turned on, whereby the transistor 162 is turned on. Thus, the potential of the third wiring is supplied to the node FG, and the predetermined amount of charge is accumulated in the node FG. Here, charge for applying either of two different potential levels (hereinafter referred to as low-level charge and high-level charge) is applied. After that, the potential of the fourth wiring is set to a potential at which the transistor 162 is turned off, whereby the transistor 162 is turned off. Thus, the predetermined charge is held in the node FG. The predetermined amount of charge is thus accumulated and held in the node FG, whereby the memory cell can store data.

Since the off-state current of the transistor 162 is extremely small, the charge applied to the node FG is held for a long time. Thus, refresh operation becomes unnecessary or the frequency of the refresh operation can be extremely lowered, which leads to a sufficient reduction in power consumption. Moreover, stored data can be held for a long period even when power is not supplied.

When stored data is read out (reading), while a predetermined potential (fixed potential) is supplied to the first wiring, an appropriate potential (reading potential) is supplied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where the high-level charge is held in the node FG is lower than an apparent threshold value $V_{th\_L}$ of the transistor 140 in the case where the low-level charge is held in the node FG. Here, an apparent threshold value refers to a potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where the high-level charge is applied in writing, when the potential of the fifth wiring is set to $V_0$ ($>V_{th\_H}$), the transistor 140 is turned on. In the case where the low-level charge is applied in writing, even when the potential of the fifth wiring is set to $V_0$ ($<V_{th\_L}$), the transistor 140 remains in an off state. In such a manner, by controlling the potential of the fifth wiring and determining whether the transistor 140 is in an on state or off state (reading out the potential of the second wiring), stored data can be read out.

Further, in order to rewrite stored data, a new potential is supplied to the node FG that is holding the predetermined amount of charge applied in the above writing, so that the charge for new data is held in the node FG. Specifically, the potential of the fourth wiring is set to a potential at which the transistor 162 is turned on, whereby the transistor 162 is turned on. Thus, the potential of the third wiring (potential for new data) is supplied to the node FG, and the predetermined amount of charge is accumulated in the node FG. After that, the potential of the fourth wiring is set to a potential at which the transistor 162 is turned off, whereby the transistor 162 is turned off. Thus, charge for the new data is held in the node FG. In other words, while the predetermined amount of charge applied in the first writing is held in the node FG, the same operation (second writing) as in the first writing is performed, whereby the stored data can be overwritten.

The off-state current of the transistor 162 described in this embodiment can be sufficiently reduced by using an oxide semiconductor film which is highly purified and contains excess oxygen as the crystalline oxide semiconductor film 144. Further, by using such a transistor, a semiconductor device in which stored data can be held for an extremely long time can be obtained.

As described above, a transistor including such a highly purified crystalline oxide semiconductor film containing excess oxygen with which an oxygen vacancy is filled has less change in electrical characteristics and thus is electrically stable. Thus, by using the transistor, a highly reliable semiconductor device can be provided.

The configuration, method, and the like described in this embodiment can be combined as appropriate with any of the configurations, methods, and the like described in the other embodiments.

Embodiment 14

A semiconductor device according to the invention disclosed in this specification can be applied to a variety of electronic devices (including an amusement machine). Examples of electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment will be described.

Figure 16A:
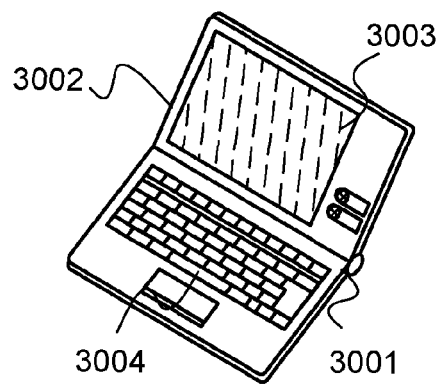
FIGS. 16A to 16F illustrate electronic devices.

FIG. 16A illustrates a notebook personal computer, which includes a main body 3001, a housing 3002, a display portion 3003, a keyboard 3004, and the like. The semiconductor device described in any of Embodiments 1 to 13 is applied to the display portion 3003, whereby a highly reliable notebook personal computer can be provided.

Figure 16B:
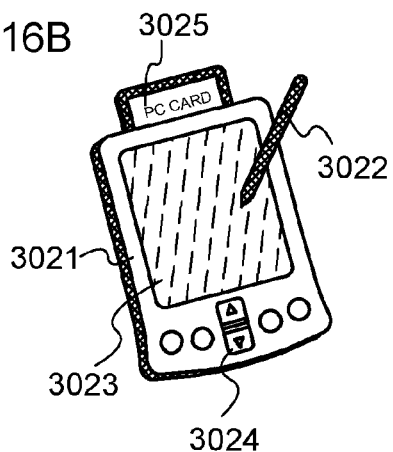

FIG. 16B is a personal digital assistant (PDA), which includes a display portion 3023, an external interface 3025, an operation button 3024, and the like in a main body 3021. A stylus 3022 is provided as an accessory for operation. The semiconductor device described in any of Embodiments 1 to 13 is applied to the display portion 3023, whereby a highly reliable personal digital assistant (PDA) can be provided.

Figure 16C:
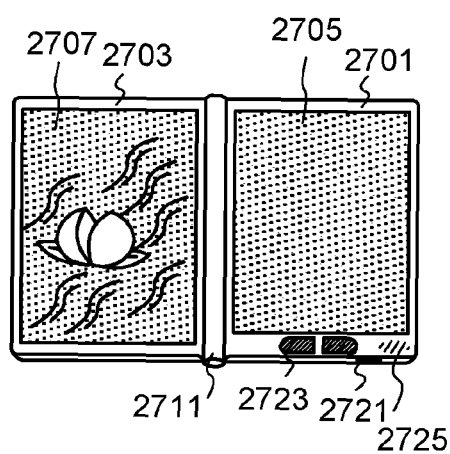

FIG. 16C illustrates an example of an electronic book. For example, an electronic book includes two housings, a housing 2701 and a housing 2703. The housing 2701 and the housing 2703 are combined by a hinge 2711 so that the electronic book can be opened and closed with the hinge 2711 used as an axis. With such a structure, the electronic book can be operated like a paper book.

A display portion 2705 is incorporated in the housing 2701 and a display portion 2707 is incorporated in the housing 2703. The display portion 2705 and the display portion 2707 may display one image or different images. When the display portions display different images, text can be displayed on the right display portion (the display portion 2705 in FIG. 16C) and an image can be displayed on the left display portion (the display portion 2707 in FIG. 16C), for example. The semiconductor device described in any of Embodiments 1 to 13 is applied to the display portion 2705 and the display portion 2707, whereby a highly reliable electronic book can be provided. In the case of using a transflective or reflective liquid crystal display device as the display portion 2705, the electronic book may be used in a comparatively bright environment; therefore, a solar cell may be provided so that power generation by the solar cell and charge by a battery can be performed. When a lithium ion battery is used as the battery, there are advantages of downsizing and the like.

Further, FIG. 16C illustrates an example where the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, or the like may be provided on the same side as the display portion in the housing. Moreover, an external connection terminal (e.g., an earphone terminal, a USB terminal), a recording media insertion portion, or the like may be provided on a rear surface or a side surface of the housing. Furthermore, the electronic book may function as an electronic dictionary.

In addition, the electronic book may be configured to be able to wirelessly transmit and receive information. The electronic book can have a structure where desired book data or the like are wirelessly purchased and downloaded from an electronic book server.

Figure 16D:
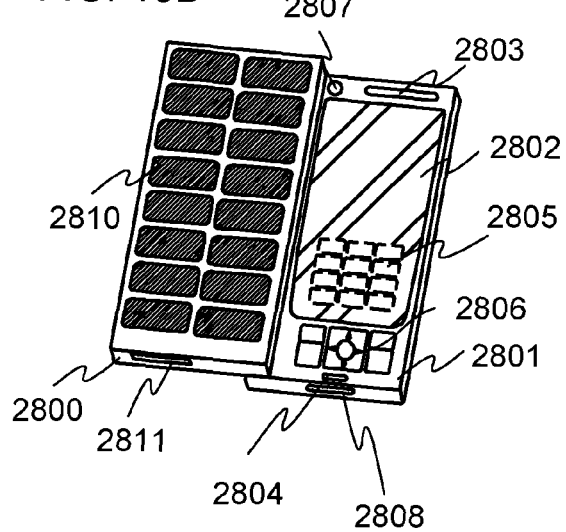

FIG. 16D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charging the mobile phone, an external memory slot 2811, and the like. Further, an antenna is incorporated in the housing 2801. The semiconductor device described in any of Embodiments 1 to 13 is applied to the display panel 2802, whereby a highly reliable mobile phone can be provided.

Further, the display panel 2802 includes a touch panel. A plurality of operation keys 2805 which is displayed as an image is indicated by dashed lines in FIG. 16D. Note that a boosting circuit by which a voltage output from the solar cell 2810 is increased so as to be sufficient for each circuit is also included.

The display panel 2802 changes the orientation of display as appropriate in accordance with the application mode. Further, the camera lens 2807 is provided on the same side as the display panel 2802, so that the mobile phone can be used as a video phone. The speaker 2803 and the microphone 2804 can be used for videophone calls, recording, and playing sound, etc. as well as voice calls. Moreover, the housings 2800 and 2801 in a state where they are developed as illustrated in FIG. 16D can be slid so that one is lapped over the other. Therefore, the size of the mobile phone can be reduced, which makes the mobile phone suitable for being carried around.

The external connection terminal 2808 can be connected to an AC adaptor and a variety of cables such as a USB cable, and charging and data communication with a personal computer or the like are possible. Moreover, the mobile phone can store and transfer a larger amount of data by inserting a recording medium into the external memory slot 2811.

Further, in addition to the above functions, an infrared communication function, a television reception function, or the like may be provided.

Figure 16E:
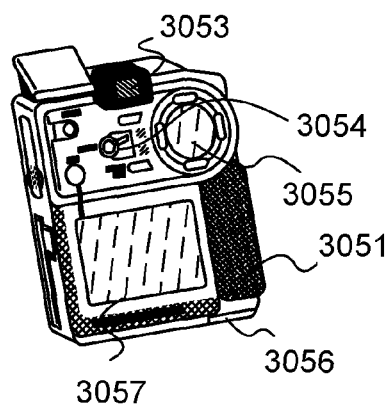

FIG. 16E illustrates a digital video camera, which includes a main body 3051, a display portion (A) 3057, an eyepiece 3053, an operation switch 3054, a display portion (B) 3055, a battery 3056, and the like. The semiconductor device described in any of Embodiments 1 to 13 is applied to the display portion (A) 3057 and the display portion (B) 3055, whereby a highly reliable digital video camera can be provided.

Figure 16F:
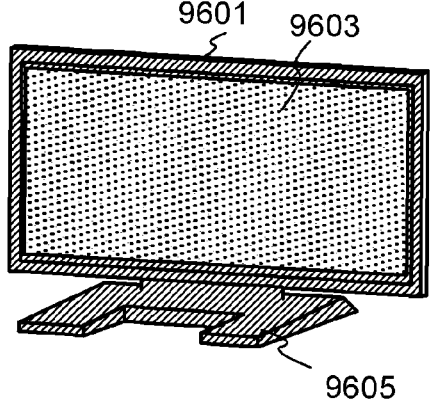

FIG. 16F illustrates an example of a television device. In a television device, a display portion 9603 is incorporated in a housing 9601. The display portion 9603 can display images. Here, the housing 9601 is supported on a stand 9605. The semiconductor device described in any of Embodiments 1 to 13 is applied to the display portion 9603, whereby a highly reliable television device can be provided.

The television device can be operated with an operation switch of the housing 9601 or a separate remote controller. Further, the remote controller may be provided with a display portion for displaying data output from the remote controller.

Note that the television device is provided with a receiver, a modem, and the like. With the use of the receiver, the television device can receive general television broadcasting. Moreover, when the television device is connected to a communication network with or without wires via the modem, one-way (from a sender to a receiver) or two-way (between a sender and a receiver or between receivers) information communication can be performed.

This embodiment can be implemented in appropriate combinations with any of the other embodiments.

EXAMPLE

In this example, properties of an aluminum oxide film used as a barrier film in a semiconductor device according to one embodiment of the invention disclosed herein were evaluated. The results are shown in FIGS. 17A1, 17A2, 17B1, and 17B2, FIGS. 18A1, 18A2, 18B1, and 18B2, FIGS. 19A to 19D, and FIGS. 20A to 20D. As evaluation methods, secondary ion mass spectrometry (SIMS) and thermal desorption spectroscopy (TDS) were used.

First, evaluation by SIMS analysis is described. As a comparative example, a comparative sample A was fabricated in such a manner that a silicon oxide film was formed to a thickness of 100 nm over a glass substrate by a sputtering method. As an example, an example sample A was fabricated in such a manner that a silicon oxide film was formed to a thickness of 100 nm over a glass substrate by a sputtering method, and an aluminum oxide film was formed to a thickness of 100 nm over the silicon oxide film by a sputtering method.

For each of the comparative sample A and the example sample A, the silicon oxide film was formed under the following conditions: a silicon oxide ($SiO_2$) target was used as a target, the distance between the glass substrate and the target was 60 mm, the pressure was 0.4 Pa, the power was 1.5 kW, the atmosphere was an oxygen atmosphere (the oxygen flow rate was 50 sccm), and the substrate temperature was 100° C.

For the example sample A, the aluminum oxide film was formed under the following conditions: an aluminum oxide ($Al_2O_3$) target was used as a target, the distance between the glass substrate and the target was 60 mm, the pressure was 0.4 Pa, the power was 1.5 kW, the atmosphere was a mixed atmosphere containing argon and oxygen (the argon flow rate was 25 sccm and the oxygen flow rate was 25 sccm), and the substrate temperature was 250° C.

The comparative sample A and the example sample A were each subjected to a pressure cooker test (PCT). In the PCT in this example, the comparative sample A and the example sample A were held for 100 hours under the following conditions: the temperature was 130° C., the humidity was 85%, the atmosphere was an atmosphere where $H_2O$ (water): $D_2O$ (heavy water)=3:1, and the atmospheric pressure was 2.3 atm (0.23 MPa).

As SIMS analysis, substrate side depth profile (SSDP) SIMS was used to measure concentrations of H atoms and D (deuterium) atoms in the comparative sample A and the example sample A before and after the PCT. Note that a D (deuterium) atom is one of isotopes of hydrogen and expressed by a chemical symbol $^2H$.

FIG. 17A1 shows H-atom and D-atom concentration profiles of the comparative sample A before the PCT, and FIG. 17A2 shows H-atom and D-atom concentration profiles of the comparative sample A after the PCT, which were obtained using SIMS analysis. In FIGS. 17A1 and 17A2, a D-atom expected concentration profile is a calculated concentration profile of the D-atoms existing in nature, which was obtained using the H-atom concentration profile on the assumption that the abundance ratio of the D atoms thereto is 0.015%. Therefore, the amount of the D atoms mixed into the sample by the PCT equals the difference between the measured D-atom concentration after the PCT and the D-atom expected concentration after the PCT. FIG. 17B1 shows a D-atom concentration profile before the PCT, which was obtained by subtracting the D-atom expected concentration from the measured D-atom concentration, and FIG. 17B2 shows a D-atom concentration profile after the PCT, which was obtained by subtracting the D-atom expected concentration from the measured D-atom concentration.

In a similar manner, FIG. 18A1 shows H-atom and D-atom concentration profiles of the example sample A before the PCT, and FIG. 18A2 shows H-atom and D-atom concentration profiles of the example sample A after the PCT, which were obtained using SIMS. Further, FIG. 18B1 shows a D-atom concentration profile before the PCT, which was obtained by subtracting the D-atom expected concentration from the measured D-atom concentration, and FIG. 18B2 shows a D-atom concentration profile after the PCT, which was obtained by subtracting the D-atom expected concentration from the measured D-atom concentration.

Note that all the results of SIMS analysis in this example were quantified using a standard sample of a silicon oxide film.

As shown in FIGS. 17A1, 17A2, 17B1, and 17B2, while the measured D-atom concentration profile overlaps with the D-atom expected concentration profile before the PCT, the measured D-atom concentration greatly increases after the PCT; accordingly, it is found that the D atoms were mixed into the silicon oxide film. Therefore, it is confirmed that the silicon oxide film of the comparative sample has a low barrier property with respect to moisture ($H_2O$ and $D_2O$) from the outside.

In contrast, as shown in FIGS. 18A1, 18A2, 18B1, and 18B2, as for the example sample A in which the aluminum oxide film was stacked over the silicon oxide film, it is found that only a slight amount of D atoms entered a surface of the aluminum oxide film by the PCT and that the D atoms entered neither the aluminum oxide film at a depth around 30 nm or greater nor the silicon oxide film. Therefore, it is confirmed that the aluminum oxide film has a high bather property with respect to moisture ($H_2O$ and $D_2O$) from the outside.

The following shows evaluation by TDS analysis. As an example sample, an example sample B was fabricated in such a manner that a silicon oxide film was formed to a thickness of 100 nm over a glass substrate by a sputtering method, and an aluminum oxide film was formed to a thickness of 20 nm over the silicon oxide film by a sputtering method. Further, as a comparative example, a comparative sample B was fabricated in such a manner that after the example sample B was measured by TDS analysis, the aluminum oxide film thereof was removed, and only the silicon oxide film was left over the glass substrate.

For each of the comparative sample B and the example sample B, the silicon oxide film was formed under the following conditions: a silicon oxide ($SiO_2$) target was used as a target, the distance between the glass substrate and the target was 60 mm, the pressure was 0.4 Pa, the power was 1.5 kW, the atmosphere was an oxygen atmosphere (the oxygen flow rate was 50 sccm), and the substrate temperature was 100° C.

For the example sample B, the aluminum oxide film was formed under the following conditions: an aluminum oxide ($Al_2O_3$) target was used as a target, the distance between the glass substrate and the target was 60 mm, the pressure was 0.4 Pa, the power was 1.5 kW, the atmosphere was a mixed atmosphere containing argon and oxygen (the argon flow rate was 25 sccm and the oxygen flow rate was 25 sccm), and the substrate temperature was 250° C.

Other three types of the comparative sample B and the example sample B were fabricated by further performing heat treatment at 300° C., 450° C., and 600° C., respectively. The heat treatment was performed for 1 hour in a nitrogen atmosphere for each sample.

Figure 19A:
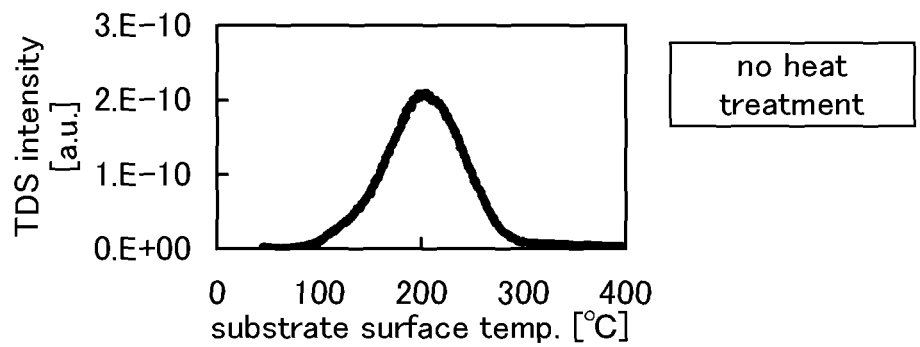
FIGS. 19A to 19D show TDS measurement results of Comparative Example Sample B.
Figure 19B:
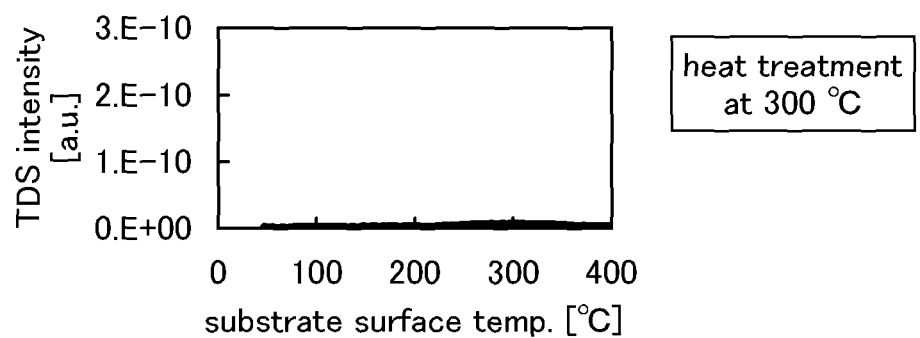
Figure 19C:
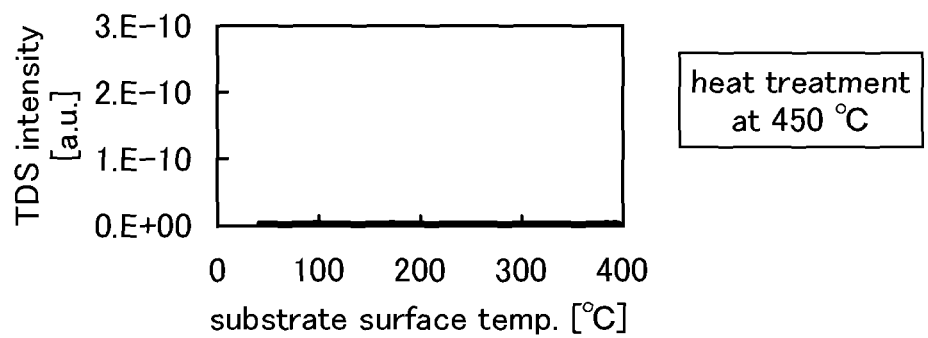
Figure 19D:
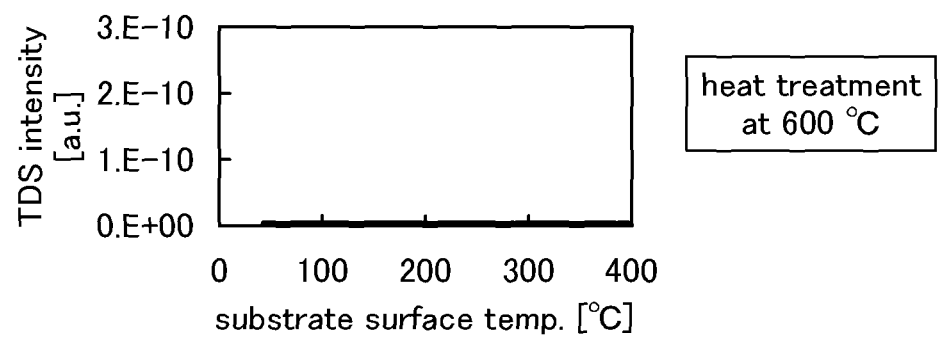
Figure 20A:
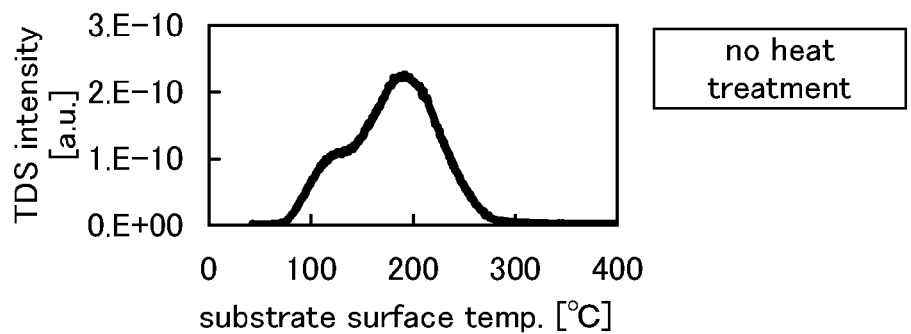
FIGS. 20A to 20D show TDS measurement results of Comparative Example Sample B.
Figure 20B:
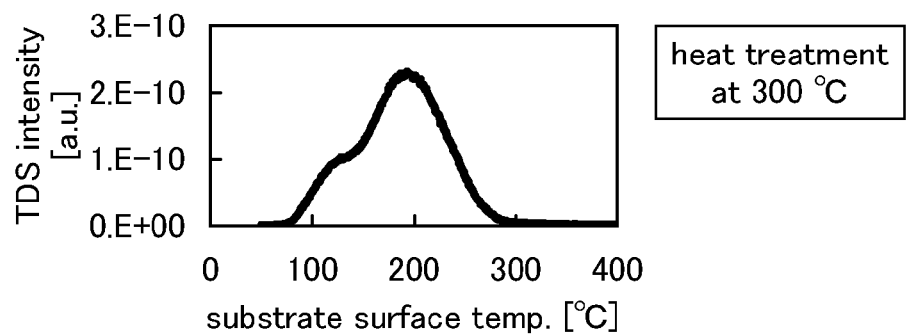
Figure 20C:
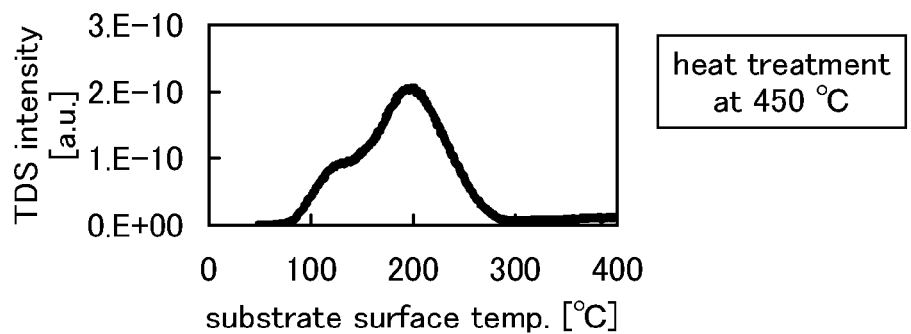
Figure 20D:
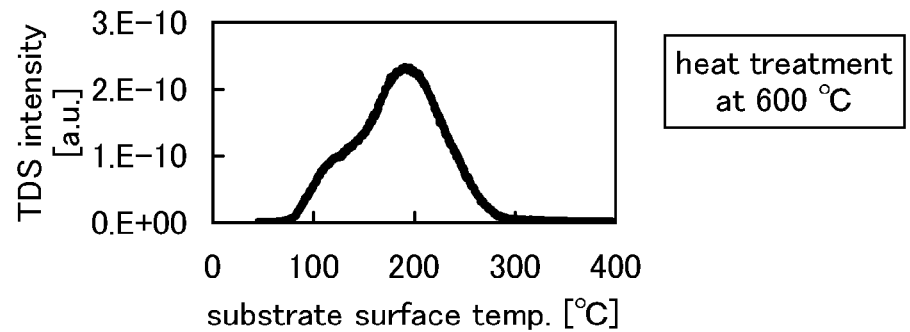

TDS analysis was performed on the four types of the comparative sample B and the four types of the example sample B fabricated under the respective four conditions (without heat treatment, with 300° C. heat treatment, with 450° C. heat treatment, and with 600° C. heat treatment). FIG. 19A shows a result of TDS of the comparative sample B subjected to no heat treatment, FIG. 19B shows that of the comparative sample B subjected to heat treatment at 300° C., FIG. 19C shows that of the comparative sample B subjected to heat treatment at 450° C., and FIG. 19D shows that of the comparative sample B subjected to heat treatment at 600° C., each at M/z=32 ($O_2$). Further, FIG. 20A shows a result of TDS of the example sample B subjected to no heat treatment, FIG. 20B shows that of the example sample B subjected to heat treatment at 300° C., FIG. 20C shows that of the example sample B subjected to heat treatment at 450° C., and FIG. 20D shows that of the example sample B subjected to heat treatment at 600° C., each at M/z=32 ($O_2$).

As shown in FIGS. 19A to 19D, it can be seen in FIG. 19A that oxygen was released from the silicon oxide film of the comparative sample B which was not subjected to heat treatment, but the amount of oxygen released was greatly decreased in the comparative sample B subjected to the heat treatment at 300° C. in FIG. 19B, and became smaller than or equal to a background level of TDS measurement in the comparative sample B subjected to the heat treatment at 450° C. in FIG. 19C and the comparative sample B subjected to the heat treatment at 600° C. in FIG. 19D.

The results in FIGS. 19A to 19D indicate that 90% or more of excess oxygen contained in the silicon oxide film was released outside the silicon oxide film by the heat treatment at 300° C. and that substantially all of the excess oxygen contained in the silicon oxide film was released outside the silicon oxide film by the heat treatment at 450° C. and 600° C. Therefore, it is confirmed that the silicon oxide film has a low barrier property with respect to oxygen.

In contrast, as shown in FIGS. 20A to 20D, substantially the same amount of oxygen was released from every type of the example sample B, in which the aluminum oxide film was formed over the silicon oxide film, regardless of whether the heat treatment was not performed or was performed at 300° C., 450° C., and 600° C.

The results in FIGS. 20A to 20D indicate that when the aluminum oxide film was formed over the silicon oxide film, the excess oxygen contained in the silicon oxide film was not easily released to the outside by heat treatment and the state where the excess oxygen was contained in the silicon oxide film was held to a considerable extent. Therefore, it is confirmed that the aluminum oxide film has a high barrier property with respect to oxygen.

The above results confirm that the aluminum oxide film has both a high barrier property with respect to hydrogen and moisture and a high barrier property with respect to oxygen, and functions suitably as a barrier film with respect to hydrogen, moisture, and oxygen.

Therefore, in and after the manufacturing process for the transistor including an oxide semiconductor film, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

Therefore, the crystalline oxide semiconductor film has high purity because impurities such as hydrogen and moisture do not enter the crystalline oxide semiconductor film, and has the region containing oxygen in excess of the stoichiometric ratio in the oxide semiconductor in a crystalline state because oxygen is prevented from being released therefrom. Accordingly, with the use of the crystalline oxide semiconductor film for a transistor, it is possible to reduce a variation in the threshold voltage $V_{th}$ of the transistor and a shift of the threshold voltage ($\Delta V_{th}$) due to an oxygen vacancy.

This application is based on Japanese Patent Application Serial No. 2011-112837 filed with Japan Patent Office on May 19, 2011, the entire contents of which are hereby incorporated by reference.

What is claimed is:

1. A method for manufacturing a semiconductor device, comprising the steps of:
   forming an insulating film;
   forming an amorphous oxide semiconductor film over the insulating film;
   performing a first heat treatment on the amorphous oxide semiconductor film;
   forming a gate insulating film over the amorphous oxide semiconductor film;
   adding oxygen into the amorphous oxide semiconductor film on which the first heat treatment is performed by an ion implantation method, an ion doping method, or a plasma immersion ion implantation method wherein the oxygen is added to the amorphous oxide semiconductor film through the gate insulating film;
   forming an aluminum oxide film over the amorphous oxide semiconductor film containing added oxygen; and
   performing a second heat treatment on the amorphous oxide semiconductor film containing added oxygen to form an oxide semiconductor film including a crystal,
   wherein the amorphous oxide semiconductor film has a more uniform amorphous state by the step of adding the oxygen.

2. The method for manufacturing a semiconductor device according to claim 1, wherein the crystal included in the oxide semiconductor film has a c-axis substantially perpendicular to a surface.

3. The method for manufacturing a semiconductor device according to claim 1, further comprising the step of
   forming a gate electrode layer over the gate insulating film,
   wherein the oxygen is added to the amorphous oxide semiconductor film through the gate insulating film.

4. The method for manufacturing a semiconductor device according to claim 1, further comprising the step of forming an oxide insulating film between the amorphous oxide semiconductor film and the aluminum oxide film.

5. The method for manufacturing a semiconductor device according to claim 1, wherein a temperature of first heat treatment is lower than a temperature of second heat treatment.

6. A method for manufacturing a semiconductor device, comprising the steps of:
   forming an insulating film;
   forming an amorphous oxide semiconductor film over the insulating film;
   performing a first heat treatment on the amorphous oxide semiconductor film;
   forming an aluminum oxide film over the amorphous oxide semiconductor film;
   adding oxygen into the amorphous oxide semiconductor film on which the first heat treatment is performed through the aluminum oxide film by an ion implantation method, an ion doping method, or a plasma immersion ion implantation method; and
   performing a second heat treatment on the amorphous oxide semiconductor film containing added oxygen to form an oxide semiconductor film including a crystal,
   wherein the amorphous oxide semiconductor film has a more uniform amorphous state by the step of adding the oxygen.

7. The method for manufacturing a semiconductor device according to claim 6, wherein the crystal included in the oxide semiconductor film has a c-axis substantially perpendicular to a surface.

8. The method for manufacturing a semiconductor device according to claim 6, further comprising the step of forming a gate insulating film over the amorphous oxide semiconductor film,
   wherein the oxygen is added to the amorphous oxide semiconductor film through the gate insulating film.

9. The method for manufacturing a semiconductor device according to claim 6, further comprising the steps of:
   forming a gate insulating film over the amorphous oxide semiconductor film; and
   forming a gate electrode layer over the gate insulating film,
   wherein the oxygen is added to the amorphous oxide semiconductor film through the gate insulating film.

10. The method for manufacturing a semiconductor device according to claim 6, further comprising the step of forming an oxide insulating film between the amorphous oxide semiconductor film and the aluminum oxide film.

11. The method for manufacturing a semiconductor device according to claim 6, wherein a temperature of first heat treatment is lower than a temperature of second heat treatment.

* * * * *